(12) United States Patent
Koyama

(10) Patent No.: US 12,355,147 B2
(45) Date of Patent: Jul. 8, 2025

(54) ELEMENT, AND TERAHERTZ CAMERA SYSTEM USING ELEMENT

(71) Applicant: CANON KABUSHIKI KAISHA, Tokyo (JP)

(72) Inventor: Yasushi Koyama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 270 days.

(21) Appl. No.: 18/306,037

(22) Filed: Apr. 24, 2023

(65) Prior Publication Data

US 2023/0282970 A1 Sep. 7, 2023

Related U.S. Application Data

(63) Continuation of application No. PCT/JP2021/038946, filed on Oct. 21, 2021.

(30) Foreign Application Priority Data

Oct. 27, 2020 (JP) .................................. 2020-179542
Oct. 20, 2021 (JP) .................................. 2021-171694

(51) Int. Cl.
| | |
|---|---|
| *H01Q 1/38* | (2006.01) |
| *H01Q 21/06* | (2006.01) |
| *H03B 7/08* | (2006.01) |
| *H03B 7/14* | (2006.01) |

(52) U.S. Cl.
CPC ............. *H01Q 1/38* (2013.01); *H01Q 21/065* (2013.01); *H03B 7/08* (2013.01); *H03B 7/146* (2013.01); *H03B 2200/0084* (2013.01)

(58) Field of Classification Search
CPC .. H03B 2200/0084; H03B 7/146; H03B 7/08; H01Q 1/38
See application file for complete search history.

(56) References Cited

FOREIGN PATENT DOCUMENTS

| | | |
|---|---|---|
| JP | 2014200065 A | 10/2014 |
| JP | 2015091117 A | 5/2015 |
| JP | 2020153974 A | 9/2020 |
| WO | 2021/039223 A1 | 3/2021 |

OTHER PUBLICATIONS

Masahirio Asada, et al., Resonant Tunneling Diodes for Sub-Terahertz and Terahertz Oscillators, Japanese Journal of Applied Physics, vol. 47, No. 6, 2008, pp. 4375-7384.
M. Asada, et al., Theoretical analysis of coupled oscillator array using resonant tunneling diodes in subterahertz and terahertz range, American Institute of Physics, Journal of Applied Physics, vol. 103, 2008, 10 pages.

*Primary Examiner* — Monica C King
(74) *Attorney, Agent, or Firm* — Canon U.S.A., Inc. I.P. Division

(57) ABSTRACT

In an antenna array including first through fifth antennas, the second, first, and third antennas are arranged in this order in a first direction, and the fourth, first, and fifth antennas are arranged in this order in a second direction. A conductor layer of the second antenna is connected to a conductor layer of the first antenna via a first coupling line extending in the first direction, the conductor layer of the first antenna is connected to a conductor layer of the third antenna via a second coupling line extending in the first direction, a conductor layer of the fourth antenna is connected to the conductor layer of the first antenna via a third coupling line extending in the second direction, and the conductor layer of the first antenna is connected to a conductor layer of the fifth antenna via a fourth coupling line extending in the second direction.

36 Claims, 26 Drawing Sheets

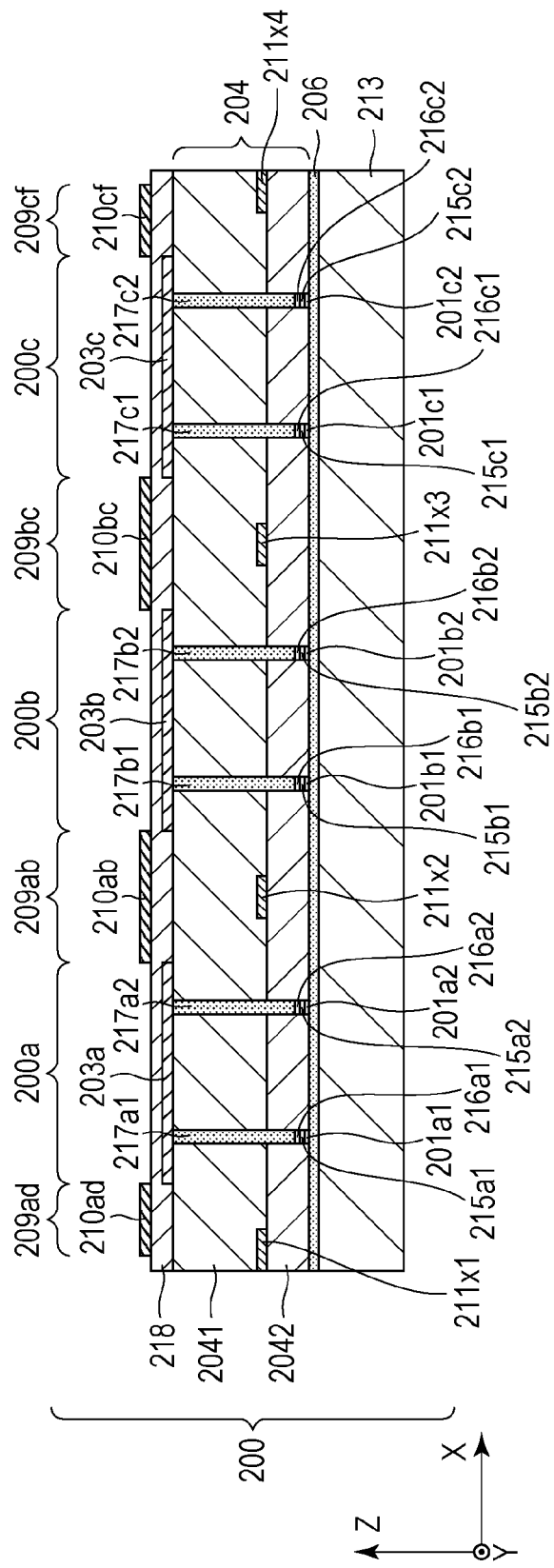

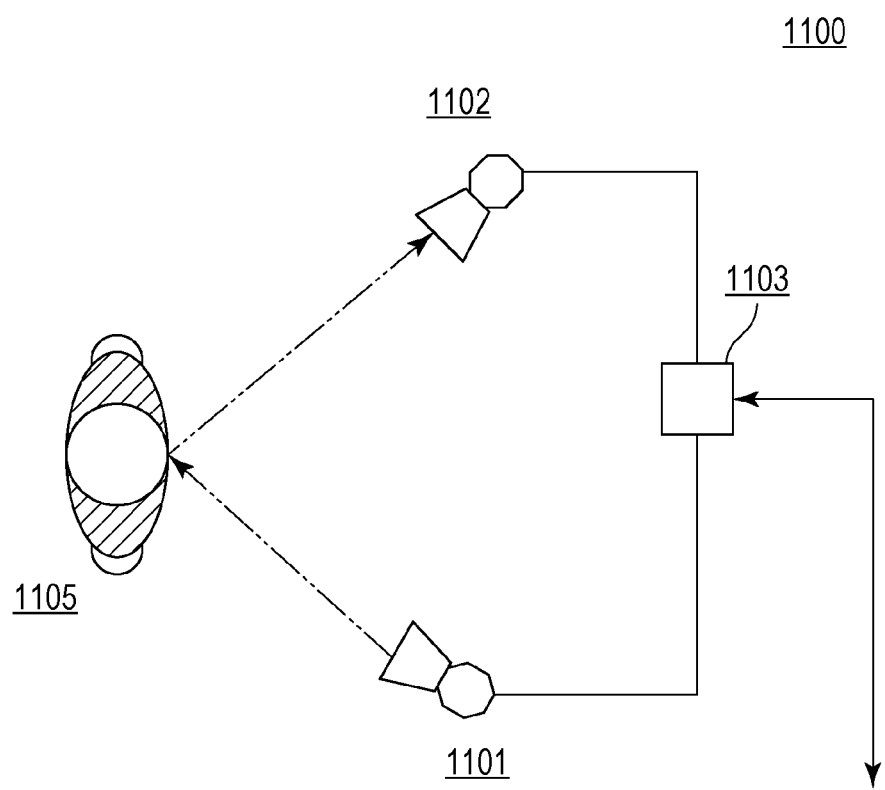

ELEMENT, AND TERAHERTZ CAMERA SYSTEM USING ELEMENT

CROSS-REFERENCE TO RELATED APPLICATIONS

This application is a Continuation of International Patent Application No. PCT/JP2021/038946, filed Oct. 21, 2021, which claims the benefit of Japanese Patent Application No. 2020-179542, filed Oct. 27, 2020 and Japanese Patent Application No. 2021-171694, filed Oct. 20, 2021, all of which are hereby incorporated by reference herein in their entirety.

TECHNICAL FIELD

The present invention relates to an element and a terahertz camera system using the element.

BACKGROUND ART

Oscillators in which a resonator and an element having an electromagnetic wave gain of a terahertz wave are integrated are known as current injection light sources that generate terahertz waves. Of these, oscillators in which a resonant tunneling diode (RTD) and an antenna are integrated are expected as elements that operate at room temperature in a frequency range around 1 THz.

PTL 1 describes a terahertz wave antenna array in which a plurality of oscillators in which an RTD and an antenna are integrated is disposed on the same substrate. In the antenna array of PTL 1, microstrip lines that are coupling lines for causing the plurality of oscillators to synchronize with one another in phase are provided.

CITATION LIST

Patent Literature

PTL 1 Japanese Patent Laid-Open No. 2014-200065

Non Patent Literature

NPL 1 Jpn. J. Appl. Phys., Vol. 47, No. 6 (2008), pp. 4375-4384 NPL 2 J. Appl. Phys., Vol. 103, 124514 (2008)

In PTL 1, a study for satisfying a phase matching condition and the like between a plurality of oscillators has not been sufficiently performed.

It would be beneficial to overcome the above problem.

SUMMARY OF INVENTION

The present disclosure provides a favorable antenna array structure in consideration of the above problem.

Some embodiments provide an element including an antenna array in which a plurality of antennas is disposed. Each of the antennas includes a first conductor layer, a semiconductor layer that is electrically connected to the first conductor layer and that generates or detects a terahertz wave, a second conductor layer that is electrically connected to the semiconductor layer and that is opposite to the first conductor layer via the semiconductor layer, and a dielectric layer located between the first conductor layer and the second conductor layer. The antenna array includes a first antenna, a second antenna, a third antenna, a fourth antenna, and a fifth antenna. The second antenna, the first antenna, and the third antenna are arranged in this order in a first direction. The fourth antenna, the first antenna, and the fifth antenna are arranged in this order in a second direction that intersects with the first direction. The second conductor layer of the second antenna is connected to the second conductor layer of the first antenna via a first coupling line extending in the first direction. The second conductor layer of the first antenna is connected to the second conductor layer of the third antenna via a second coupling line extending in the first direction. The second conductor layer of the fourth antenna is connected to the second conductor layer of the first antenna via a third coupling line extending in the second direction. The second conductor layer of the first antenna is connected to the second conductor layer of the fifth antenna via a fourth coupling line extending in the second direction.

Further features of the present invention will become apparent from the following description of exemplary embodiments with reference to the attached drawings.

BRIEF DESCRIPTION OF DRAWINGS

FIG. 7A is a top schematic diagram that shows the element 20 according to the second embodiment.

FIG. 10 is a diagram that shows a terahertz camera system according to a fifth embodiment.

DESCRIPTION OF EMBODIMENTS

Embodiments will be described with reference to the drawings. In the following description, a case where an element 10 is used as a transmitter will be described; however, the element 10 may be used as a receiver. Here, a terahertz wave means an electromagnetic wave in a frequency range higher than or equal to 10 GHz and lower than or equal to 100 THz, more suitably, higher than or equal to 30 GHz and lower than or equal to 30 THz.

In the description of each of the embodiments, the description of the same components as those of another embodiment can be omitted. Each of the embodiments may be modified as needed or combined as needed with another embodiment.

First Embodiment

Figure 1A:
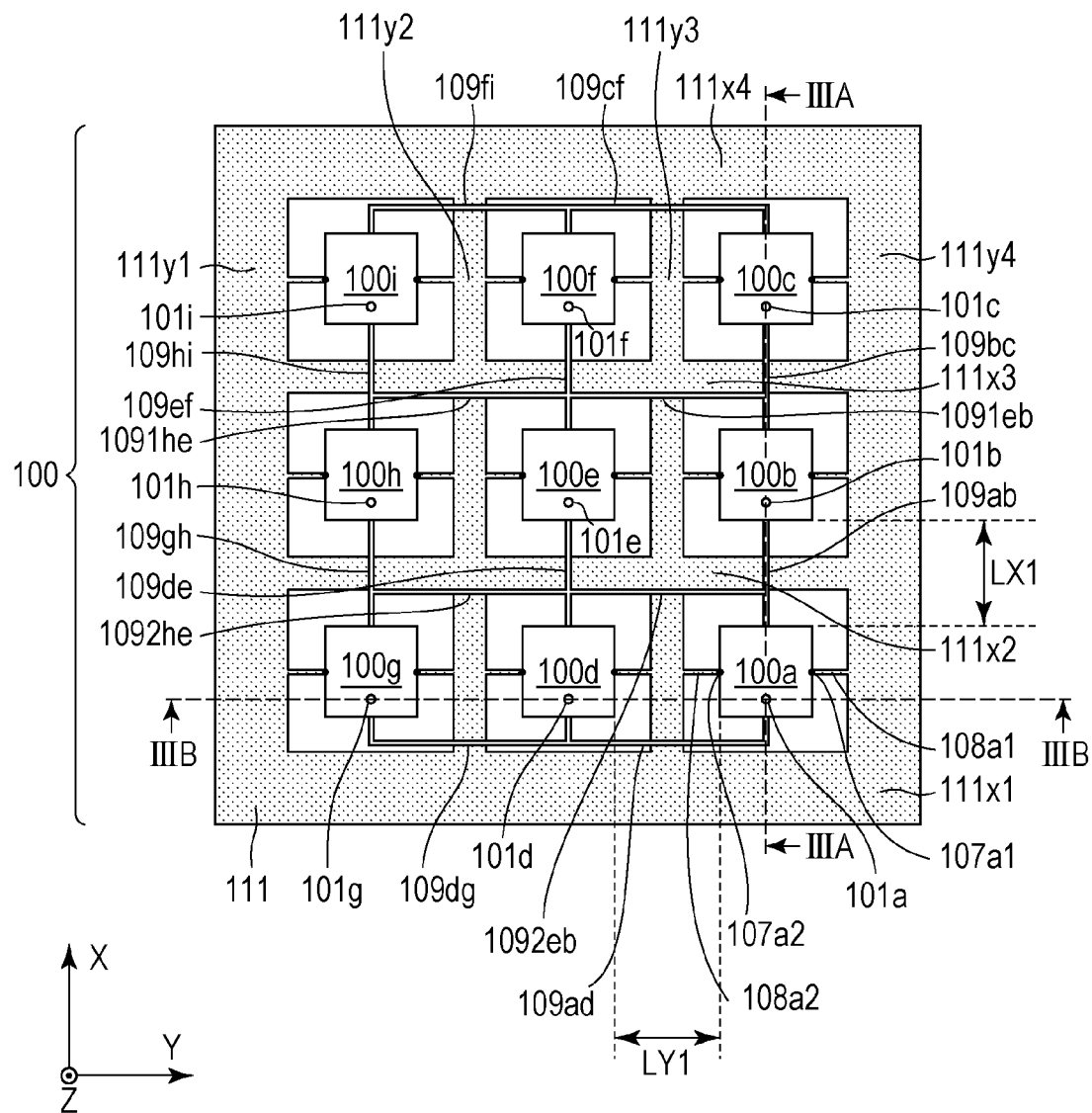
FIG. 1A is a top schematic diagram that shows an element 10 according to a first embodiment.
Figure 2:
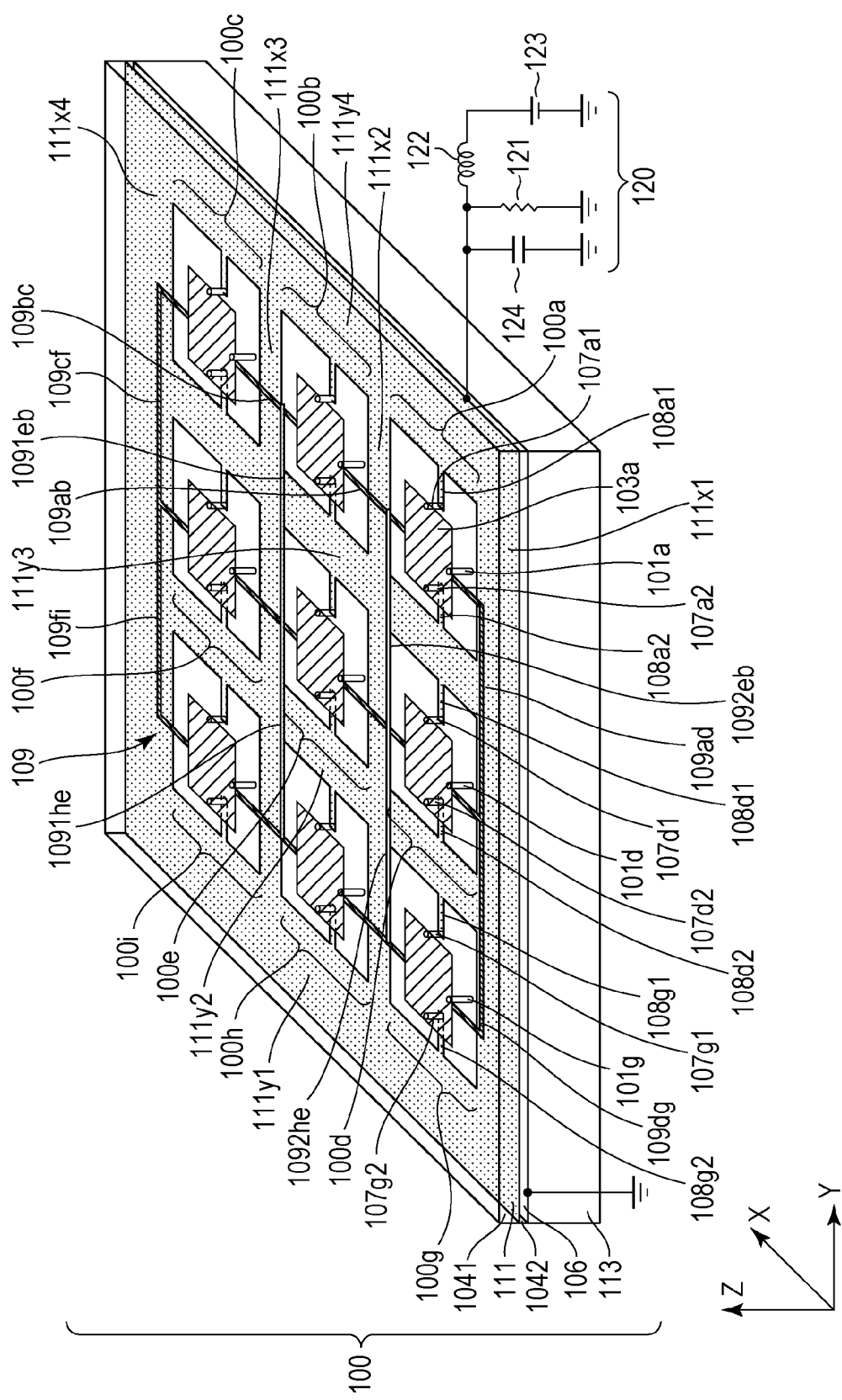
FIG. 2 is a schematic diagram that illustrates the configuration of the element 10 according to the first embodiment.
Figure 3A:
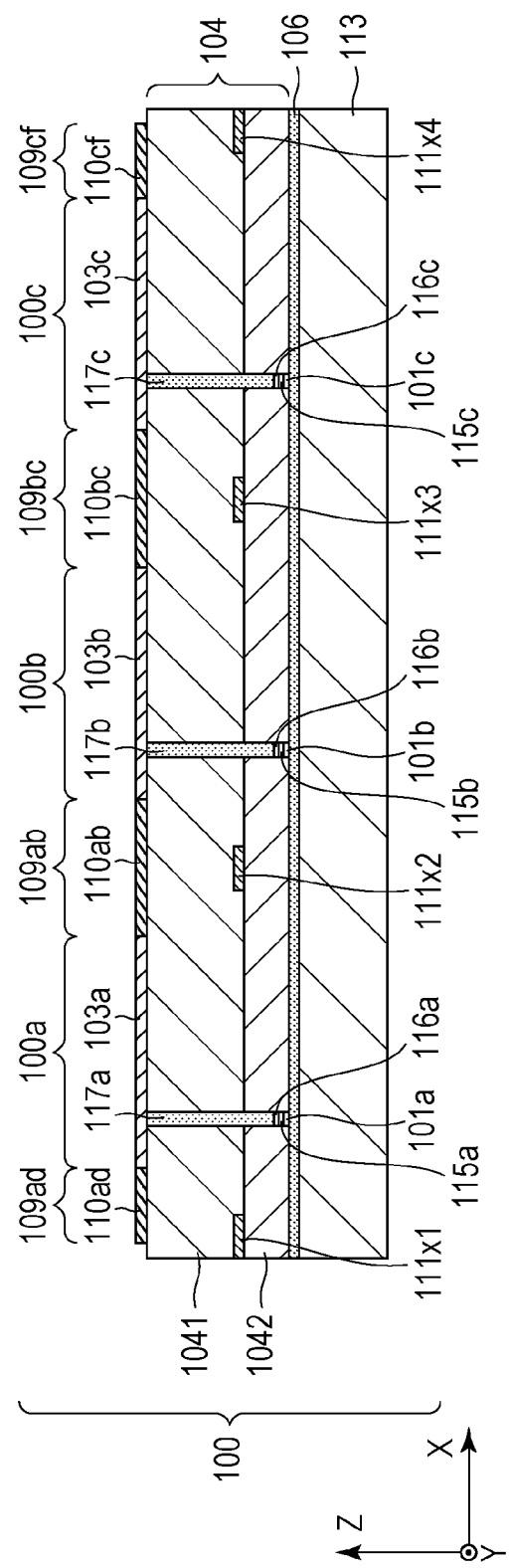
FIG. 3A is a schematic cross-sectional view that illustrates the element 10 according to the first embodiment.
Figure 3B:
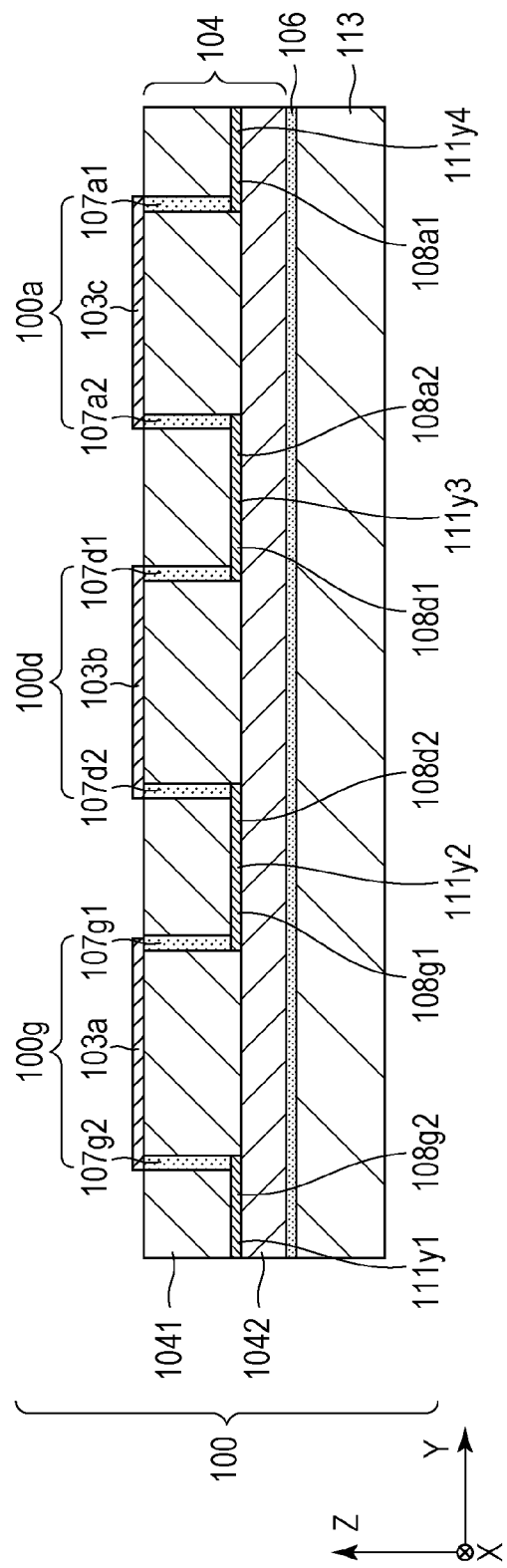
FIG. 3B is a schematic cross-sectional view that illustrates the element 10 according to the first embodiment.
Figure 4:
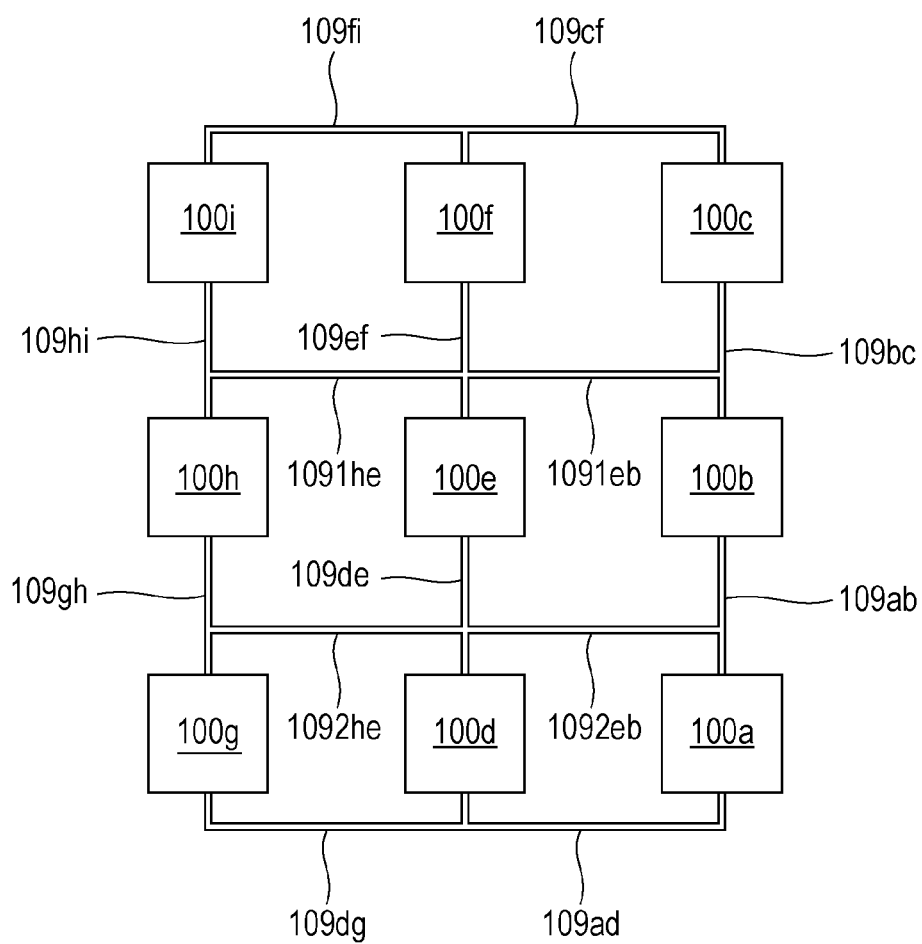
FIG. 4 is a plan view of a second conductor layer of the element 10 according to the first embodiment.

The element 10 according to the present embodiment will be described with reference to FIGS. 1A, and 2 to 5C. The configuration of the element 10 will be described with cross-reference to FIGS. 1A, and 2 to 4. FIG. 1A is a top schematic diagram of the element 10 when viewed from above the element 10. FIG. 1A may be regarded as showing a top view of the element 10. FIG. 1A shows an X direction, a Y direction, and a Z direction. The X direction and the Y direction just need to intersect with each other. In FIG. 1A, the X direction and the Y direction are orthogonal to each other. The X direction and the Y direction are included in one plane. The Z direction is orthogonal to the X direction and the Y direction, and the Z direction is also referred go as an upward direction. FIG. 2 is a perspective view that schematically shows the outer appearance of the element 10. FIG. 3A is a schematic cross-sectional view of the element 10, taken along the line IIIA-IIIA in FIG. 1A. FIG. 3B is a schematic cross-sectional view of the element 10, taken along the line IIIB-IIIB in FIG. 1A. FIG. 4 is a schematic plan view that shows a second conductor layer of the element 10.

As shown in FIGS. 1A, and 2 to 4, the length of components, that is, a substrate 113, a dielectric layer 104, a semiconductor layer 115, and the like, of the element 10 in a lamination direction of the components is referred to as thickness or height. A side on which the dielectric layer 104 and the semiconductor layer 115 are present with respect to the substrate 113 is referred to as an upper side.

The element 10 will be described with reference to FIG. 1A. The element 10 is an element that oscillates or detects a terahertz wave having a frequency of f THz and is made of a semiconductor material. A plurality of antennas is disposed in the element 10. In the present embodiment, the element 10 includes an antenna array in which nine antennas 100a, 100b, 100c, 100d, 100e, 100f, 100g, 100h, and 100i are arranged in a 3 by 3 matrix.

The configuration of the antennas will be described. Each of the antennas 100a to 100i has a similar configuration. In the following description, the configuration of the antenna 100a will be described in detail, and the detailed description of component portions in the other antennas 100b to 100i, similar to those of the antenna 100a, is omitted. In the description, an alphabet corresponding to each antenna is suffixed to the reference numerals of components of each of the antenna 100a to the antenna 100i. For example, the component of the antenna 100a in a second conductor layer 103 will be described in association with a second conductor layer 103a.

The antenna 100a serves as both a resonator that resonates a terahertz wave and a radiator that transmits or receives a terahertz wave. The antennas may be disposed at a pitch less than or equal to the wavelength of the terahertz wave to be detected or generated or an integral multiple of the wavelength.

As shown in FIG. 3A, the substrate 113, a first conductor layer 106, and the second conductor layer 103a are laminated in this order. A dielectric layer 1042 and a dielectric layer 1041 are arranged in this order from the first conductor layer 106 side between the first conductor layer 106 and the second conductor layer 103a. As in the case of the antenna 100a to the antenna 100i, each of the second conductor layers 103a to 103i has a similar configuration. A third conductor layer 110ab is disposed between the second conductor layer 103a and the second conductor layer 103b. Similarly, in the antennas 100a to 100i, a third conductor layer 110bc, a third conductor layer 110cf, and the like, are included. The third conductor layer 110bc is disposed between the second conductor layer 103b and the second conductor layer 103c. In the following description, for example, a conductor layer that connects an antenna 100x and an antenna 100y is referred to as a conductor layer 110xy, a conductor layer 110yx, or the like. Not limited to conductor layers, the same applies to coupling layers, and the like.

The antenna 100a has at least the first conductor layer 106, the second conductor layer 103a, and a semiconductor layer 101a disposed between the first conductor layer 106 and the second conductor layer 103a. The semiconductor layer 101a is a resonant tunneling diode (RTD) as will be described in detail later and is also referred to as the RTD 101a or an active layer 101a. Hereinafter, the semiconductor layer 101a may also be referred to as the RTD 101a. The antenna 100a further includes a semiconductor layer 115a, an electrode 116a for ohmic joint, and a conductor 117a for connecting the second conductor layer 103a with the RTD 101a. A coupling line 109ab includes the third conductor layer 110ab. A bias line 111x2 is disposed between the third conductor layer 110ab and the first conductor layer 106. The bias line 111x2 is located between the dielectric layer 1042 and the dielectric layer 1041.

In FIG. 3B, a bias line 111y2 and the like are disposed in the same layer as the layer in which the bias line 111x2 shown in FIG. 3A is disposed. The bias line 111y2 makes up lines 108g1, 108d2. The second conductor layer 103a connects with the second conductor layer 103b by way of a conductor 107g1, the line 108g1, the line 108d2, and a conductor 107d2. The layer of the bias line 111y2 is electrically connected to a bias circuit 120 as shown in FIG. 2. The bias circuit 120 is also referred to as a power supply circuit. The first conductor layer 106 is grounded as shown in FIG. 2. As shown in FIGS. 3A and 3B, a layer including the first conductor layer 106 may be referred to as a first wiring layer, a layer including the bias line 111 may be referred to as a second wiring layer, and a layer including the second conductor layers 103 and the third conductor layers 110 may be referred to as a third wiring layer. The conductors included in each wiring layer may also be regarded as being located at the same level. The level means a height from the surface of the substrate 113.

FIG. 4 schematically shows a pattern that includes the second conductor layers 103 and the third conductor layers 110 and that is located at the same level. Here, an element having the plurality of the antennas 100 will be described.

For the purpose of increasing the antenna gain of the element 10, it has been considered to dispose the plurality of antennas 100. The RTD 101 is disposed in each of the antennas 100 as described above. The antenna gain increases when mutual injection-locking is performed in each of the antennas 100. To synchronize the plurality of antennas 100 with one another, a coupling line that couples adjacent two of the antennas is needed. Here, the coupling line is also referred to as a coupling line.

The coupling line has not been studied in detail so far. Specifically, when adjacent two of antennas are connected by a coupling line, it is difficult to satisfy a phase matching condition in any one or both of a horizontal direction (a magnetic field direction or an H direction) and a vertical direction (an electric field direction or an E direction). For this reason, with an increase in the number of antennas, injection-locking in any one of the vertical direction and the horizontal direction becomes insufficient, and an increase in gain is reduced. In addition, improvement in directivity is reduced than anticipated. Therefore, it is not possible to generate and detect a terahertz wave with high efficiency by using an antenna array.

Coupling lines that couple the plurality of antennas 100 will be described with reference to FIG. 4. Initially, a case where the plurality of antennas 100 is coupled in the X direction will be described. The antenna 100e is coupled to the antenna 100f by a coupling line 109ef. Coupling of antennas in the X direction will be described. The antenna 100e is coupled to the antenna 100f via the coupling line 109ef and is coupled to the antenna 100d via a coupling line 109de. The antenna 100h is coupled to the antenna 100i via a coupling line 109hi and is coupled to the antenna 100g via a coupling line 109gh. The antenna 100b is coupled to the antenna 100c via a coupling line 109bc and is coupled to the antenna 100a via the coupling line 109ab. In FIG. 4, each of the antennas is directly connected to a corresponding one of the coupling lines and may be connected by capacitive coupling. Here, the X direction is the vertical direction, the direction of an electric field, that is, the E direction.

Next, a case where the plurality of antennas 100 is coupled in the Y direction will be described. Coupling of the antennas 100 in the Y direction is performed by a coupling line 109fi, a coupling line 109cf, a coupling line 1091he, a coupling line 1091eb, a coupling line 1092he, a coupling line 1092eb, a coupling line 109dg, and a coupling line 109ad. The coupling line 1091he couples the coupling line 109hi to the coupling line 109ef, and the coupling line 1091eb couples the coupling line 109ef to the coupling line 109bc. The coupling line 1092he couples the coupling line 109gh to the coupling line 109de, and the coupling line 1092eb couples the coupling line 109de to the coupling line 109ab.

When focusing on the antenna 100e, the configuration will be described as follows. For the antenna 100e, the antenna 100f and the antenna 100d that are respectively adjacent to both sides of the antenna 100e in a first direction (vertical direction) are disposed. The antenna 100e is connected to the antenna 100f by the coupling line 109ef extending in the first direction (vertical direction) and is connected to the antenna 100d by the coupling line 109ed extending in the first direction (vertical direction). Similarly, the antenna 100h and the antenna 100b that are respectively adjacent to both sides of the antenna 100e in a second direction (horizontal direction) that intersects with the first direction are disposed. Here, in the case of patch antennas used in the present embodiment, the first direction is a terahertz-wave resonant direction (a resonant electric field propagation direction, the electric field direction, or the E direction), and the second direction is a direction orthogonal to the first direction (the magnetic field direction or the H direction). The present invention is applied to not only antennas that radiate horizontally polarized wave or a vertically polarized wave but also antennas that radiate a circularly polarized wave.

When focusing on the antenna 100e, the configuration will be described as follows. The antenna 100d, the antenna 100e, and the antenna 100f are arranged in this order in the first direction (vertical direction). The antenna 100h, the antenna 100e, and the antenna 100b are arranged in this order in the second direction (horizontal direction) that intersects with the first direction. The antenna 100e and the antenna 100f are coupled by the coupling line 109ef extending in the first direction, and the antenna 100e and the antenna 100d are coupled by the coupling line 109de extending in the first direction. The antenna 100e and the antenna 100b are coupled by the coupling line 1091eb extending in the second direction, and the antenna 100e and the antenna 100h are coupled by the coupling line 1091he extending in the second direction.

Here, it is assumed that the first antenna is the antenna 100e, the second antenna is the antenna 100f, the third antenna is the antenna 100d, the fourth antenna is the antenna 100h, and the fifth antenna is the antenna 100b. When it is assumed that the first direction is the X direction and the second direction is the Y direction, the configuration will be described as follows. The second antenna, the first antenna, and the third antenna are arranged in this order in the first direction. The fourth antenna, the first antenna, and the fifth antenna are arranged in this order in the second direction. The second conductor layer of the second antenna is connected to the second conductor layer of the first antenna via the first coupling line extending in the first direction, and the second conductor layer of the first antenna is connected to the second conductor layer of the third antenna via the second coupling line extending in the first direction. The second conductor layer of the fourth antenna is connected to the second conductor layer of the first antenna via the third coupling line extending in the second direction, and the second conductor layer of the first antenna is connected to the second conductor layer of the fifth antenna via the fourth coupling line extending in the second direction. Here, the first coupling line is the coupling layer 109ef, and the second coupling line is the coupling line 109de. The third coupling line is the coupling line 1091he or the coupling line 1092he, and the fourth coupling line is the coupling line 1091eb or the coupling line 1092eb.

As shown in FIG. 4, the element 10 further includes the coupling lines 1091he, 1092he, 1091eb, 1092eb extending in the second direction (horizontal direction) that intersects with the first direction (vertical direction). The coupling lines 1091he, 1091eb extending in the second direction are connected to the coupling lines 109hi, 109ef, 109bc extending in the first direction. The coupling lines 1092he, 1092eb extending in the second direction are connected to the coupling lines 109gh, 109de, 109ab extending in the first direction. With such connection, the plurality of antennas 100 is coupled. In addition, with such connection, the gain of the antennas increases. When coupling lines are connected to each other, the coupling lines may be made up of a conductor in which the coupling lines are continuously formed, that is, a single conductor body.

A coupling line is preferably connected as follows. The coupling line preferably has a length such that an electrical length between RTDs of adjacent to of the antennas is an integral multiple of 2π. When, for example, the X direction is taken for the first direction, the coupling line 109de extending in the X direction has such a length that the electrical length between the RTD 100e and the RTD 100d is 2π. When the Y direction is taken for the second direction, the coupling line 1091eb or the coupling line 1092eb extending in the Y direction has such a length that the electrical length between the RTD 100e and the RTD 100b is 4π. Here, an electrical length is a wiring length that takes a propagation speed of a radio-frequency wave that propagates in a coupling line into consideration. It is easy to perform mutual injection-locking in phase from the RTDs 101a to 101i of the antennas. An error of the range of length is ±¼π.

Figure 5A:
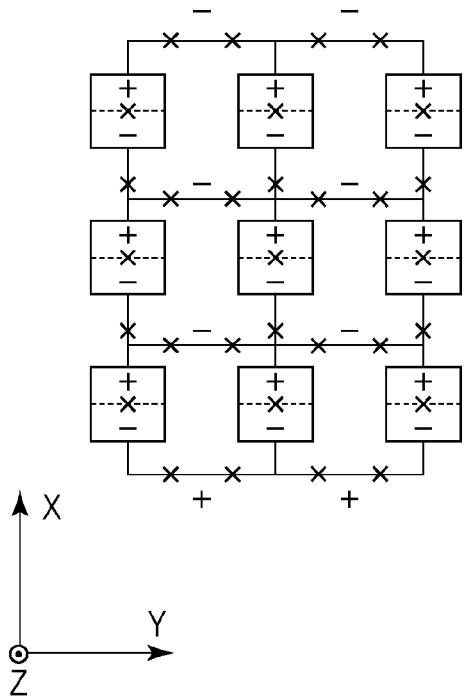
FIG. 5A is a diagram that illustrates the effect of the element 10 according to the first embodiment.
Figure 5B:
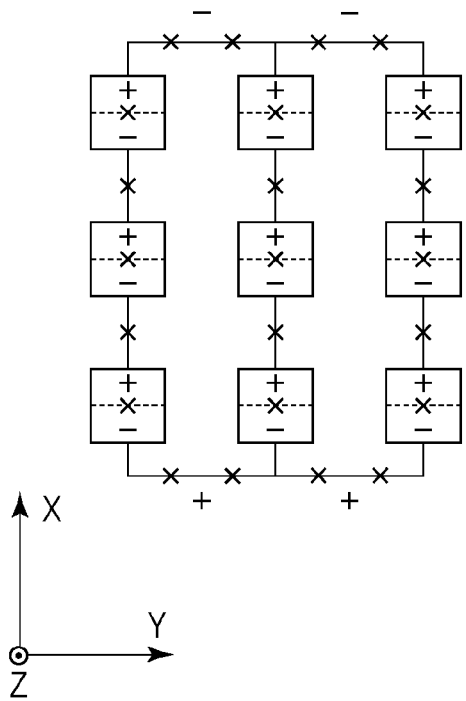
FIG. 5B is a diagram that illustrates the effect of the element 10 according to the first embodiment.
Figure 5C:
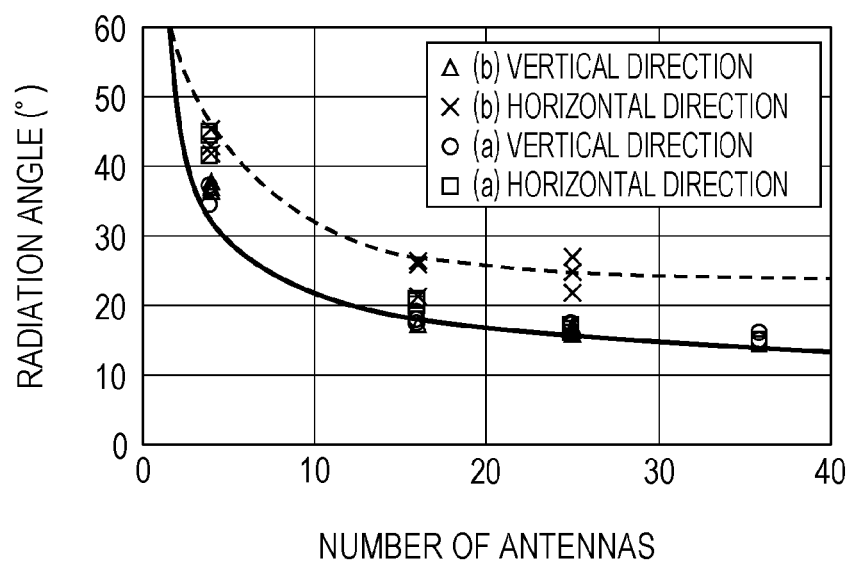
FIG. 5C is a graph that illustrates the effect of the element 10 according to the first embodiment.

Coupling will be described. FIGS. 5A and 5B are schematic diagrams for illustrating the element 10 according to the present embodiment. FIGS. 5A and 5B are diagrams that schematically show the relation between antennas and coupling lines. FIG. 5C is a graph that shows the correlation between the number of antennas and a radiation angle of an electromagnetic wave.

FIG. 5A shows the element 10 in which the antennas are coupled in the X direction and in the Y direction. FIG. 5B shows the configuration of an element 10' in which the antennas are coupled only in the X direction. Here, "+" and "−" in the drawings indicate antinodes of a resonant electric field at a frequency of f THz, which stands in the antenna array and their polarities, and "×" indicates nodes of the resonant electric field. The element 10' has no coupling line that couples the central antenna 100e to the two antennas, that is, the antenna 100h and the antenna 100b that are adjacent in the Y direction, so synchronization between the antennas in the Y direction is insufficient. Since the antenna 100e of the element 10 is connected to the antenna 100h and the antenna 100b adjacent in the Y direction via the coupling lines, the antennas are sufficiently synchronized in the Y direction. Thus, the gain of the antennas increases.

In addition, to satisfy the phase matching condition between the antennas, a coupling line in the X direction and a coupling line in the Y direction are connected at a location shifted in the X direction from a symmetric axis between the antennas adjacent in the X direction. In other words, a coupling line in the X direction and a coupling line in the Y direction are connected at a location shifted in the X direction from the center between the antennas adjacent in the X direction. For example, for the antennas 100e, 100d adjacent in the X direction, the configuration will be described as follows. When the antennas 100e, 100d are line-symmetric with respect to a line segment extending in the Y direction, the line segment takes a symmetric point that is a point to intersect with the X direction. The coupling line 109de in the X direction and the coupling line 1092he in the Y direction are connected at a location shifted in the X direction from the symmetric point. The coupling line 109de in the X direction and the coupling line 1092eb in the Y direction are connected at a location shifted in the X direction from the symmetric point. A shift amount is, for example, 30 um. In FIG. 1A, it is assumed that a distance between two antennas 100 in the X direction is a length of LX1, and a distance between two antennas 100 in the Y direction is a length of LY1. Here, connection of the coupling line 109ab with the coupling line 1092eb is shifted from the center of the length LX1 toward the antenna 100a. Here, shift is also referred to as offset.

More preferably, a coupling line in the X direction and a coupling line in the Y direction are connected at a location other than the nodes of a resonant electric field that stands in the coupling lines at a frequency of a terahertz wave. In other words, a coupling line in the X direction and a coupling line in the Y direction are preferably connected at a location shifted from the center of electrical symmetry at a frequency of f THz of a terahertz wave between antennas adjacent in the X direction. This is because, when both coupling lines are connected at a node of a resonant electric field that stands in the coupling lines at a frequency of a terahertz wave, a phase matching condition between vertically arranged antennas and a phase matching condition between horizontally arranged antennas contradict with each other. Thus, destructive interference between outputs can occur. Variations of directivity can occur.

FIG. 5C is a graph that shows a correlation between the number of antennas and a radiation angle. The solid line and the dashed line represent calculated values (by using HFSS produced by ANSYS) on the graph, and the plotted points represent measured data of a 2 by 2 array, a 4 by 4 array, a 5 by 5 array, and a 6 by 6 array. It appears that, for the element 10' in which the antennas are coupled only in the vertical direction, synchronization in the horizontal direction is insufficient in a 3 by 3 or larger antenna array. Then, it appears that the effect of improving directivity saturates. For the configuration of the element 10 in which the antennas are coupled in two directions, that is, in the vertical direction and in the horizontal direction, it is confirmed on both calculation and measurement sides that directivity is improved and a radiation angle is sharpened in both vertical and horizontal directions with an increase in the number of antennas. It demonstrates that, due to the effect of the coupling lines connected in the horizontal direction, even in a 3 by 3 or larger antenna array in which the number of antennas surrounded by adjacent antennas like the antenna 100e increases, synchronization between the antennas is sufficiently achieved in the vertical and horizontal directions. In other words, a phase matching condition is satisfied between the antennas. Therefore, with the element according to the present embodiment, enhancement of coupling and phase matching at least in the vertical direction and in both the vertical and horizontal directions are achieved even with an antenna surrounded by adjacent antennas in an M by N array (M and N are natural numbers). Thus, the element 10 shown in FIG. 5A is expected to enhance the intensity of the outputs of the antennas as compared to the case of the element 10' in which only the antennas in the vertical direction are synchronized as shown in FIG. 5B. Improvement in directivity is expected.

The configuration in which a coupling line is disposed between the antennas in the vertical direction and in the horizontal direction is a suitable configuration that minimizes the number of the coupling lines to reduce losses in a terahertz wave due to coupling; however, the configuration is not limited thereto.

Hereinafter, the detailed configuration of the antenna will be described. As shown in FIGS. 3A and 3B, the antenna 100a has the first conductor layer 106, the second conductor layer 103a, and the dielectric layer 104. The dielectric layer 104 is located between two conductor layers (wiring layers), that is, the first conductor layer 106 and the second conductor layer 103a. The above configuration of the antenna 100a is called a microstrip antenna using a microstrip line or the like with a finite length. In the present embodiment, an example in which a patch antenna that is a microstrip resonator is used will be described.

As shown in FIGS. 3A and 3B, the second conductor layer 103a is a patch conductor of the antenna 100a, disposed so as to be opposite to the first conductor layer 106 via the dielectric layer 104 (semiconductor layer 115a). The second conductor layer 103a is electrically connected to the semiconductor layer 115a. The antenna 100a is set so as to operate as a resonator of which the width of the second conductor layer 103a in the X direction (resonant direction) is $\lambda THz/2$. The first conductor layer 106 is an electrically grounded grounding conductor. $\lambda THz$ is an effective wavelength of a terahertz wave in the dielectric layer 104, which resonates in the antenna 100a. Where the wavelength of a terahertz wave in vacuum is $\lambda 0$ and an effective dielectric constant of the dielectric layer 104 is $\varepsilon r$, $\lambda THz = \lambda 0 \times \varepsilon r^{-1/2}$.

As shown in FIGS. 3A and 3B, the antenna 100a has a semiconductor structure. The semiconductor structure is, for example, a mesa structure. The semiconductor structure includes the semiconductor layer 115a and the semiconductor layer 101a. In addition, the semiconductor structure has a third electrode 116a that is an ohmic electrode. The semiconductor layer 115a is located in the antenna 100a and is a configuration to oscillate or detect an electromagnetic wave of a terahertz wave. As shown in FIG. 1A, the antenna 100a shows only the semiconductor layer 101a; however, the semiconductor layer 115a is also disposed between the semiconductor layer 101a and the second conductor layer 103a.

Hereinafter, the semiconductor layer 101a will be described. The semiconductor layer 101a is made up of a semiconductor layer having an electromagnetic wave gain or nonlinearity for a terahertz wave. A typical semiconductor layer having an electromagnetic wave gain in a frequency band of a terahertz wave is a resonant tunneling diode (RTD) and is also referred to as an active layer. In the present embodiment, an example in which an RTD is used as the semiconductor layer 101a will be described. Hereinafter, the semiconductor layer 101a can also be referred to as an RTD 101a.

The RTD 101a has a multi-quantum well structure in which a resonant tunneling structural layer including a plurality of tunnel barrier layers is provided, a quantum well layer is provided between the plurality of tunnel barrier layers, and a terahertz wave is generated by transition of a carrier between sub-bands. The RTD 101a has an electromagnetic wave gain in a frequency range of a terahertz wave based on a photon assist tunneling phenomenon in a differential negative resistance range of current-voltage characteristics and self-oscillates in the differential negative resistance range.

The antenna 100a is an active antenna in which the RTD 101a, the semiconductor layer 115a, and the patch antenna are integrated. The frequency f THz of a terahertz wave oscillated from the antenna 100a alone is determined by a resonant frequency of all parallel resonant circuits obtained by combining the patch antenna with the reactance of the semiconductor layer 115a. Specifically, from an equivalent circuit of the oscillator described in NPL 1, a frequency that satisfies an amplitude condition of an expression (1) and a phase condition of an expression (2) is determined as an oscillatory frequency f THz for a resonant circuit combining an RTD with an admittance (YRTD and Yaa) of an antenna.

$$Re[YRTD]+Re[Yaa] \leq 0 \quad (1)$$

$$Im[YRTD]+Im[Yaa]=0 \quad (2)$$

Here, YRTD is the admittance of the semiconductor layer 115a, Re represents a real part, and Im represents an imaginary part. Since the semiconductor layer 115a includes the RTD 101a that is a negative resistive element, Re[YRTD] has a negative value. Yaa represents the admittance of the entire structure of the patch antenna 100a when viewed from the semiconductor layer 115a.

A quantum cascade laser (QCL) having a semiconductor layer multilayer structure of several hundreds to several thousands of layers may be used as the semiconductor layer 101a. In this case, the semiconductor layer 115a is a semiconductor layer including a QCL structure. Alternatively, a negative resistive element, such as a Gunn diode and an IMPATT diode, often used in a millimeter-wave band may be used as the semiconductor layer 101a. A radio-frequency element, such as a transistor of which one terminal is terminated may be used as the semiconductor layer 101a. A heterojunction bipolar transistor (HBT), a compound semiconductor layer FET, a high-electron-mobility transistor (HEMT), or the like may be suitable as a transistor. A differential negative resistance, such as a Josephson device using a superconductor layer, may be used as the semiconductor layer 101a.

The dielectric layer 104 is made up of two layers, that is, the first dielectric layer 1041 and the second dielectric layer 1042. A microstrip resonator, such as a patch antenna, has the thick dielectric layer 104, so conductor losses are reduced, with the result that radiation efficiency is improved. The dielectric layer 104 is desired to allow formation of a thick film (typically, 3 μm or greater), to provide low loss and low dielectric constant in a terahertz band, and to have good micromachinability (planarization and etching). Here, as the thickness of the dielectric layer 104 increases, radiation efficiency increases; however, if the dielectric layer 104 is too thick, multimode resonance can occur. Therefore, the thickness of the dielectric layer 104 is preferably designed within a range less than or equal to 1/10 of an oscillation wavelength as an upper limit. On the other hand, miniaturization and high current density of a diode are needed for a high frequency and high power oscillator, so the dielectric layer 104 is desired to suppress leakage current and take measures against migration as an insulating structure of the diode. In the present embodiment, to satisfy the above two purposes, two types of dielectric layers made of different materials are respectively used for the first dielectric layer 1041 and the second dielectric layer 1042.

An organic dielectric material, such as benzocyclobutene (BCB, made by The Dow Chemical Company, $\varepsilon r1=2$), polytetrafluoroethylene, and polyimide, is suitably use as a specific example of the material of the first dielectric layer 1041. Here, $\varepsilon r1$ is a dielectric constant of the first dielectric layer 1041. An inorganic dielectric material, such as a TEOS oxide film and a spin-on glass, that can form a relatively thick film and that has a low dielectric constant may be used for the first dielectric layer 1041.

Insulation properties (properties to behave as an electrical insulator and a high resistor that do not pass electricity for a direct current voltage), barrier properties (properties to prevent diffusion of metal material used for electrodes), and processibility (properties to allow processing with a submicron precision) are desired for the second dielectric layer 1042. An inorganic electrically insulating material, such as silicon oxide ($\varepsilon r2=4$), silicon nitride ($\varepsilon r2=7$), aluminum oxide, and aluminum nitride, is suitably used as a specific example of the material that satisfies these properties. $\varepsilon r2$ is a dielectric constant of the second dielectric layer 1042.

Here, when the dielectric layer 104 has a two-layer configuration as in the case of the present embodiment, the dielectric constant $\varepsilon r$ of the dielectric layer 104 is an effective dielectric constant that is determined by the thickness and dielectric constant $\varepsilon r1$ of the first dielectric layer 1041 and the thickness and dielectric constant $\varepsilon r2$ of the second dielectric layer 1042. From the viewpoint of impedance matching between an antenna and a space, a difference in dielectric constant between the antenna and air is preferably smaller, so a material that is different from the material of the second dielectric layer 1042 and that has a lower dielectric constant ($\varepsilon r1<\varepsilon r2$) should be used as the first dielectric layer 1041. In the element 10, the dielectric layer 104 does not need to have a two-layer configuration and may have a structure made up of only one layer selected from among the above-described materials.

The semiconductor layer 115a is dispose on the first conductor layer 106 formed on the substrate 113. The semiconductor layer 115a and the first conductor layer 106 are electrically connected to each other. To reduce ohmic losses, the semiconductor layer 115a and the first conductor layer 106 are preferably connected with a low resistance. The electrode 116a is disposed on an opposite side of the semiconductor layer 115a to a side on which the first conductor layer 106 is disposed. The electrode 116a and the semiconductor layer 115a are electrically connected to each other. The semiconductor layer 115a and the electrode 116a are embedded in the second dielectric layer 1042 and are coated with the second dielectric layer 1042.

As long as the electrode 116a is a conductor ohmically connected to the semiconductor layer 115a, the electrode 116a is suitable to reduce ohmic losses and RC delay due to a series resistance. When the electrode 116a is used as an ohmic electrode, for example, Ti/Pd/Au, Ti/Pt/Au, AuGe/Ni/Au, TiW, Mo, ErAs, or the like is suitably used as the material. When a region that contacts with the electrode 116a of the semiconductor layer 115a is a semiconductor heavily doped with impurities, contact resistance further decreases, which is suitable for high power and high frequency. The absolute value of a negative resistance that represents the magnitude of the gain of the RTD 101a used in a terahertz wave band is on the order of about 1Ω to 100Ω, so the loss of electromagnetic wave is suitably suppressed to lower than or equal to 1% thereof. Therefore, contact resistance in the ohmic electrode should be suppressed to less than or equal to 1Ω as a target. To operate in a terahertz wave band, the width of the semiconductor layer 115a (nearly equal to the electrode 116a) is about 0.1 µm to about 5 µm as a typical value. For this reason, contact resistance is suitably suppressed to the range of 0.001Ω to several Ω by setting the resistivity to lower than or equal to 10 Ω·µm2.

A configuration using a metal that is not ohmically but Schottky connected to the electrode 116a is conceivable. In this case, a contact interface between the electrode 116a and the semiconductor layer 115a has rectifying properties, and the antenna 100a has a suitable configuration as a terahertz wave detector. Hereinafter, in the present embodiment, a configuration using an ohmic electrode as the electrode 116a will be described.

In the antenna 100a disposed on the upper and lower sides of the RTD 101a, as shown in FIG. 3A, the substrate 113, the first conductor layer 106, the semiconductor layer 115a, the electrode 116a, the conductor 117a, and the second conductor layer 103a are laminated in this order.

The conductor 117a is formed in the dielectric layer 104, and the second conductor layer 103a and the electrode 116a are electrically connected to each other via the conductor 117a. Here, if the width of the conductor 117a is too large, degradation of the resonant characteristics of the patch antenna 100a and a decrease in radiation efficiency due to an increase in parasitic capacitance occur. For this reason, the width of the conductor 117a is preferably set to such an extent that the conductor 117a does not interfere with a resonant electric field and is typically suitably less than or equal to 1/10 of the effective wavelength λ of a terahertz wave that has an oscillatory frequency of f THz and that stands in the antenna 100a. The width of the conductor 117a may be small to such an extent that a series resistance is not increased and may be reduced to about twice a skin depth as a target. When it is considered to reduce the width of the conductor 117a to such an extent that the series resistance does not exceed 1Ω, the width of the conductor 117a is typically in the range greater than or equal to 0.1 µm and less than or equal to 20 µm as a target.

In FIG. 1A, the second conductor layer 103a is electrically connected to a line 108a1 by way of a conductor 107a1 and electrically connected to a line 108a2 by way of a conductor 107a2. The lines 108a1, 108a2 are extended lines electrically connected to the bias circuit 120 by way of the bias line 111 that is a common wiring line formed in a chip. The line 108 is extended from each of the antennas. The bias circuit 120 is a power supply for supplying a bias signal to the RTD 101a of the antenna 100a. Therefore, when the bias line 111 is connected to the lines 108 extended respectively from the adjacent antennas, a bias signal is supplied to the semiconductor layers 115 of the antennas. Since a sufficient wiring line width is ensured because of the common bias line 111, operation voltage variations among the antennas due to variations in wiring line resistance are reduced, so synchronization is stable even when the number of antennas increases. In addition, the structure of an area around each antenna can be made symmetric, so a radiation pattern is not distorted.

The conductor 107a1 is a connecting portion for electrically and mechanically connecting the line 108a1 to the second conductor layer 103a, and the conductor 107a2 is a connecting portion for electrically and mechanically connecting the line 108a2 to the second conductor layer 103a. A structure that electrically interconnects upper and lower layers, like the conductor 117a and the conductors 107a1, 107a2, is referred to as a via. Each of the first conductor layer 106 and the second conductor layer 103a serves as not only a member that is a component of a patch antenna but also an electrode for injecting current into the RTD 101a when connected to these vias. A material having a resistivity of lower than or equal to $1 \times 10^{-6}$ Ω·m is preferable as the conductor 117a and the conductors 107a1, 107a2 that are vias. Specifically, a metal or metal compound, such as Ag, Au, Cu, W, Ni, Cr, Ti, Al, AuIn alloy, and TiN, are suitably used as the material.

The width of each of the conductors 107a1, 107a2 is less than the width of the second conductor layer 103a. Here, the width is a width in an electromagnetic wave resonant direction (=X direction) in the antenna 100a. The width of a portion (connecting portion) of the line 108a1 (line 108a2) connected to the conductor 107a1 (conductor 107a2) is less (narrower) than the width of the second conductor layer 103a (antenna 100a). These widths are suitably less than or equal to 1/10 of the effective wavelength λ (less than λ/10) of a terahertz wave that has an oscillatory frequency of f THz and that stands in the antenna 100a. This is because it is preferable to improve radiation efficiency that the conductors 107a1, 107a2 and the lines 108a1, 108a2 are disposed at locations with dimensions to such an extent that the conductors 107a1, 107a2 and the lines 108a1, 108a2 do not interfere with a resonant electric field in the antenna 100a.

The locations of the conductors 107a1, 107a2 are preferably disposed at the nodes of an electric field of a terahertz wave that has an oscillatory frequency of f THz and that stands in the antenna 100a. At this time, the conductors 107a1, 107a2 and the lines 108a1, 108a2 are components having sufficiently higher impedance than the absolute value of the differential negative resistance of the RTD 101a in a frequency band around an oscillatory frequency of f THz. In other words, each of the lines 108a1, 108a2 is connected to an antenna other than the antenna 100a so as to have a high impedance when viewed from the RTD at an oscillatory frequency of f THz. In this case, another antenna and the antenna 100a are isolated (separated) in a route by way of the bias line 111 at a frequency of f THz. Thus, current having an oscillatory frequency of f THz, induced in each antenna, does not influence adjacent antennas by way of the bias line 111 and the bias circuit 120. In addition, interference between an electric field that has an oscillatory frequency of f THz and that stands in the antenna 100a and these power supply members is suppressed. The other antennas 100b to 100i in the element 10 are also similar to the antenna 100a.

The bias line 111 is a bias wiring line (wiring layer) common to the antennas 100a to 100i. The antennas 100a to 100i are connected to the bias line 111 by way of the lines 108a1, 108a2 to the lines 108i1, 108i2 respectively connected to the antennas 100a to 100i. In the bias line 111, wiring lines in the X direction (resonant direction) are shown in FIG. 3A as lines 111x1 to 111x4, and wiring lines in a Y direction are shown in FIG. 3B as lines 111y1 to 111y4. In the description, the entire bias common wiring line of the element 10 is referred to as the bias line 111.

In FIG. 2, the bias circuit 120 is a power supply disposed outside a chip in order to supply a bias signal to the RTDs 101a to 101i. The bias circuit 120 includes a shunt resistor 121 connected in parallel with each of the RTDs 101a to 101i, a wiring line 122, a power supply 123, and a capacitor 124 connected in parallel with the shunt resistor 121.

The wiring line 122 definitely has a parasitic inductance component, so the wiring line 122 is shown as an inductance in FIG. 2. The power supply 123 supplies current needed to drive each of the RTDs 101a to 101i and adjusts a bias voltage applied to each of the RTDs 101a to 101i. The bias voltage is typically selected from among voltages in the differential negative resistance range of RTD, used for the RTDs 101a to 101i. The bias circuit 120 is connected to the bias line 111 that is a chip-in-wire. In the case of the antenna 100a, a bias voltage from the bias circuit 120 is supplied to the RTD 101a in the antenna 100a by way of the line 108a1 and the line 108a2. The other antennas 100b to 100i are also similar to the antenna 100a.

The shunt resistor 121 and the capacitor 124 serve to suppress parasitic oscillation at a resonant frequency of a relatively low frequency (typically, a frequency band from direct current (DC) to 10 GHz) due to the bias circuit 120. A value equal to or slightly less than the absolute value of the differential negative resistance that is a combined resistance of the parallel-connected RTDs 101a to 101i is selected as the value of the shunt resistor 121. The capacitor 124, as well as the shunt resistor 121, is also set such that the impedance of the element is equal to or less than the absolute value of a combined differential negative resistance of the parallel-connected RTDs 101a to 101i. In other words, the bias circuit 120 is set to a lower impedance than the absolute value of a combined negative resistance corresponding to a gain in a frequency band of DC to 10 GHz with these shunt structures. Generally, the capacitor 124 is preferably greater the better within the above range, and, in the example of the present embodiment, the capacitor 124 is a capacitance of about several tens of picofarads. The capacitor 124 is a decoupling capacitor, and, for example, a metal-insulator-metal (MIM) structure in which the antenna 100a and a substrate are integrated may be used.

The element 10 is an antenna array having the nine antennas 100a, 100b, 100c, 100d, 100e, 100f, 100g, 100h, 100i disposed in a 3 by 3 matrix. Each of the antennas 100a to 100i oscillates a terahertz wave having a frequency of f THz alone. Adjacent two of the antennas are coupled to each other by the coupling line 109 and are subjected to mutual injection-locking (synchronized with each other) at an oscillatory frequency of f THz of a terahertz wave.

Here, mutual injection-locking means that a plurality of self-excited oscillators in pull-in synchronization due to interaction. For example, the antenna 100a and the antenna 100b are coupled to each other by the coupling line 109ab, and the antenna 100a and the antenna 100d are coupled to each other by the coupling line 109ad. The same applies to the other adjacent antennas. The phrase "coupled to each other" means a phenomenon that a current induced in one antenna acts on another adjacent antenna to change mutual transmission and reception characteristics. By synchronizing mutually coupled antennas in phase or in opposite phase, reinforcement or destruction of an electromagnetic field between the antennas is induced by the mutual injection-locking phenomenon. Thus, an increase or a decrease in antenna gain can be adjusted. In the description, when the entire coupling line that couples the antennas of the element 10 is indicated, the coupling line is referred to as the coupling line 109. An alphabet corresponding to each antenna is used to indicate the coupling line that couples adjacent two of the antennas and that is a component of the coupling line 109. For example, the coupling line that couples the antenna 100a to the antenna 100b is referred to as the coupling line 109ab.

Oscillation conditions of the element 10 are determined by conditions of mutual injection-locking in the configuration in which two or more individual RTD oscillators described in J. Appl. Phys., Vol. 103,124514 (2008) (NPL 2) are coupled. Specifically, oscillation conditions of an antenna array in which the antenna 100a and the antenna 100b are coupled by the coupling line 109ab are considered. At this time, two oscillation modes, that is, in-phase mutual injection-locking and opposite-phase mutual injection-locking, occur. The oscillation conditions of the oscillation mode for in-phase mutual injection-locking (even mode) are expressed by the mathematical expression (4) and the mathematical expression (5), and the oscillation conditions of the oscillation mode in which opposite-phase mutual injection-locking (odd mode) are expressed by the mathematical expression (6) and the mathematical expression (7).

In Phase (even Mode): Frequency f=feven $Y_{even} = Y_{aa} + Y_{ab} + Y_{RTD}$ $Re(Y_{even}) \leq 0$ (4)

$Im(Y_{even}) = 0$ (5)

Opposite Phase (odd Mode): Frequency f=fodd $Y_{odd} = Y_{aa} + Y_{ab} + Y_{RTD}$ $Re(Y_{odd}) \leq 0$ (6)

$Im(Y_{odd}) = 0$ (7)

Here, Yab is a mutual admittance between the antenna 100a and the antenna 100b. Yab is proportional to a coupling constant that indicates the strength of coupling between the antennas and, ideally, it is preferable that the real part of −Yab be large and the imaginary part be zero. In the element 10 according to the present embodiment, the antennas are coupled under conditions that the antennas are subjected to in-phase mutual injection-locking, and Oscillatory frequency f THz≈feven. Similarly, for the other antennas, any adjacent two of the antennas are coupled so as to satisfy the above-described in-phase mutual injection-locking conditions in the coupling line 109.

The coupling line 109 is a microstrip line in which the dielectric layer 104 is sandwiched by the third conductor layer 110 and the first conductor layer 106. For example, as shown in FIG. 3A, the coupling line 109ab has such a structure that the dielectric layer 104 is sandwiched by the third conductor layer 110ab and the first conductor layer 106. Similarly, the coupling line 109bc is formed such that the dielectric layer 104 is sandwiched by the third conductor layer 110bc and the first conductor layer 106, the coupling line 109ad is formed such that the dielectric layer 104 is sandwiched by the third conductor layer 110ad and the first conductor layer 106, and the coupling line 109cf is formed such that the dielectric layer 104 is sandwiched by the third conductor layer 110cf and the first conductor layer 106.

In FIG. 4, any adjacent two of the antennas of the element 10 are coupled by DC coupling. The third conductor layer 110ab that is an upper conductor layer of the coupling line 109ab coupling the antenna 100a to the antenna 100b is directly connected to the second conductor layers 103a, 103b. As shown in FIGS. 3A, 3B, and 4, in the element 10, the third conductor layer 110ab and the second conductor layers 103a, 103b are formed in the same layer. Similarly, the third conductor layer 110ae that is an upper conductor layer of the coupling line 109ae coupling the antenna 100a to the antenna 100e is directly connected to the second conductor layers 103a, 103e. The third conductor layer 110ae and the second conductor layers 103a, 103e are formed in the same layer.

With this structure, each of the antenna 100b and the antenna 100e is coupled to the antenna 100a and operates in synchronism with each other at a frequency of f THz of an oscillating terahertz wave. The antenna array synchronized with such DC coupling is capable of synchronizing adjacent antennas with strong coupling, so the antenna array is easy to perform pull-in synchronization operation and is tough to variations in the frequency and phase of each antenna.

In the element 10, the coupling line 109 and the bias line 111 are disposed in different layers. For example, as shown in FIG. 3A, the third conductor layer 110ab that is a component of the coupling line 109ab coupling the antenna 100a to the antenna 100b and the fourth conductor layer 111x2 that is a component of the bias line 111 are disposed in different layers. The third conductor layer 110ad that is a component of the coupling line 109ad coupling the antenna 100a to the antenna 100d and the fourth conductor layer 111x1 that makes up the bias line 111 are disposed in different layers. In other words, a wiring layer having a portion in which the coupling line 109 extends in an in-plane direction (a direction perpendicular to a lamination direction) of the substrate 113 and a wiring layer having a portion in which the bias line 111 extends in the in-plane direction of the substrate 113 are disposed in different layers. Here, a wiring layer having a portion in which the coupling line 109 extends in the in-plane direction is the third conductor layer 110 and the first conductor layer 106. On the other hand, a wiring layer having a portion in which the bias line 111 extends in the in-plane direction is the fourth conductor layer 111. In the present embodiment, all the third conductor layers 110 and the first conductor layer 106 in all the antennas are disposed in a layer different from any of the fourth conductor layers 111.

In this way, the coupling line 109 that transmits a high frequency (f THz) and the bias line 111 that transmits a low frequency (DC to several tens of gigahertz) are disposed in different layers. This allows the width, length, and layout, such as installation, of a transmission line in each layer to be freely set.

In the element 10, the substrate 113, the first conductor layer 106, and the second conductor layer 103a are laminated in this order from the substrate 113 side. At least any one of the coupling line 109 and the bias line 111 is disposed in a layer between the first conductor layer 106 and the second conductor layer 103a. For example, as shown in FIG. 3A, the fourth conductor layers 111x2, 111x1 are disposed in a layer between the first conductor layer 106 and the second conductor layer 103.

In addition, as shown in FIG. 1A, when viewed from above (in plan view), the coupling line 109 and the bias line 111 intersect with each other. For example, in plan view, the third conductor layer 110ab and the fourth conductor layer 111x2 intersect with each other, and the third conductor layer 110ad and the fourth conductor layer 111y3 intersect with each other. As shown in FIGS. 3A and 3B, intersecting conductor layers are located at different levels.

In this way, by laying lines such that the coupling line 109 and the bias line 111 intersect with each other, a configuration having a layout with a further saving space is achieved. Therefore, with such a configuration, in an antenna array in which antennas are disposed in an m by n matrix (m≥2, n≥2), the number of antennas disposed is increased. According to the present embodiment, even when the number of antennas is increased, physical interference between a coupling line (the coupling line 109) for synchronization between the antennas and a power supply line (bias line 111) for supplying a bias to each of the RTDs 101 is suppressed. Therefore, in the element 10, limitations on the upper limit of the number of antennas arranged are relaxed, with the result that the effect of significantly improving directivity and front intensity resulting from an increase in the number of antennas is expected.

The configuration of a layout with a space saving is achieved by disposing at least any one of the coupling line 109 and the bias line 111 in a layer between two conductor layers that are components of the antennas. Specifically, the coupling line 109 or/and the bias line 111 are embedded in a redundant region other than the antennas in the dielectric layer 104 that is a component of the antennas 100a to 100i. With this configuration, a plurality of transmission lines can be disposed in a relatively small space between adjacent antennas disposed at a pitch of about a wavelength, so it is sufficiently compatible with an increase in the number of lines resulting from an increase in the number of antennas.

Since resistance due to a skin effect increases in a terahertz band, conductor losses resulting from high-frequency transmission between the antennas cannot be ignored. With an increase in current density between conductor layers, a conductor loss per unit length (dB/mm) increases. In the case of a microstrip line, a conductor loss per unit length (dB/mm) is inversely proportional to the square of a dielectric thickness. Therefore, to increase the radiation efficiency of the antenna array, it is suitable to reduce conductor losses by increasing not only the thickness of the antennas but also the thickness of the dielectric that is a component of the coupling line 109. In contrast, in the element 10 according to the present embodiment, the bias line 111 is disposed on the first conductor layer 106 side in the first dielectric layer 1041, and the third conductor layer 110 through which radio frequency having a frequency of f THz is transmitted is disposed in an upper layer above the dielectric layer 104. With this configuration, a decrease in the radiation efficiency of the antenna array resulting from conductor losses in a terahertz band is suppressed. In this case, in the antenna 100a, the substrate 113, the first conductor layer 106, the fourth conductor layers 111x1, 111x2, the second conductor layer 103a, and the third conductor layers 110ad, 110ab are laminated in this order from the substrate 113 side. The same applies to the relationship between the coupling line 109 and the bias line 111 that couple other antennas.

From the viewpoint of conductor losses, the thickness of the dielectric that is a component of the coupling line 109 is preferably greater than or equal to 1 µm, and, more preferably, when the dielectric thickness is set to greater than or equal to 2 µm, a loss due to conductor losses in a terahertz band is suppressed to about 20%. Similarly, from the viewpoint of conductor losses, a distance in the thickness direction between the third conductor layer 110 and the first conductor layer 106 that are component of the coupling line 109 is preferably wider the better. A distance in the thickness direction between the third conductor layer 110 that is a component of the coupling line 109 and the fourth conductor layer 111 that is a component of the bias line 111 is preferably wider the better. For the bias line 111, when the dielectric is set to less than or equal to 2 µm, preferably, less than or equal to 1 µm, the bias line 111 can be caused to function as a low impedance line up to a gigahertz band. Even when the dielectric is set so as to be thick, that is, greater than or equal to 2 µm, the bias line 111 can be caused to function as a low impedance line by connecting shunt components to the bias line as in the case of an element 30.

In the element 10 according to the present embodiment, adjacent antennas are supplied with electric power through the common bias line 111 disposed between the antennas. For example, as shown in FIG. 3B, the antenna 100a is connected to the bias line 111y3 by way of the conductor 107a2 and the line 108a2, and the antenna 100d is connected to the bias line 111y3 by way of a conductor 107dl and a line 108dl. Similarly, since the antenna 100a and the antenna 100b are adjacent to each other, both antennas are connected to the common bias line 111x2 disposed between the antennas and supplied with a bias signal. The same applies to the bias line 111 of the other antennas 100b to 100i. In this way, when the common bias line 111 that is a chip-in-wire is used between adjacent two of the antennas, the antennas is allowed to be driven by the same channel, with the result that a drive mode is simplified. Since the number of wiring lines reduces and, therefore, the thickness of one wiring line can be increased, an increase in wiring resistance resulting from an increase in the number of antennas and a difference in operating point between adjacent two of the antennas is suppressed accordingly. Thus, a frequency difference and a phase difference between antennas resulting from an increase in the number of antennas are suppressed, so the effect of synchronization caused by the array are more easily obtained.

The common bias line 111 is not an indispensable component. For example, a plurality of the bias lines 111 may be prepared for each antenna with multilayering and miniaturization to provide individual power supply. In this case, isolation by way of the bias line 111 between the antennas is enhanced, so the risk of low-frequency parasitic oscillation is reduced. In the element 10, the lines 108a1, 108a2 to the lines 108i1, 108i2 and the bias line 111 preferably have a low impedance as compared to the negative resistances of the RTDs 101a to 101i in a low-frequency band lower than the oscillatory frequency f THz. More preferably, the impedance should be a value equal to or less than the absolute value of a combined differential negative resistance of the parallel-connected RTDs 101a to 101i. Thus, multimode oscillation at a low frequency is suppressed.

As described above, according to the present embodiment, oscillation or detection is performed with higher accuracy than an existing art by synchronizing the antenna array.

A specific configuration of the element 10 that oscillates a terahertz wave according to the first embodiment will be described with reference to FIGS. 1A and 2. The element 10 is a semiconductor device capable of performing single-mode oscillation in a frequency band of 0.45 THz to 0.50 THz. The substrate 113 is an InP substrate. The RTDs 101a to 101i are made of a multi-quantum well structure by InGaAs/AlAs lattice matched on the substrate 113, and, in the present embodiment, RTDs with a double barrier structure are used. This is also called a semiconductor layer hetero structure of an RTD.

The current voltage characteristics of each of the RTDs 101a to 101i are such that, in measured value, a peak current density is 9 mA/µm2 and a differential negative conductance per unit area is 10 mS/µm2. In the antenna 100a, a mesa structure made up of the semiconductor layer 115a including the RTD 101a and the third electrode 116a that is an ohmic electrode is formed. The mesa structure has a circular shape with a diameter of 2 μm in the present embodiment. At this time, the magnitude of the differential negative resistance of the RTD 101a is about −30Ω per diode. In this case, the differential negative conductance (GRTD) of the semiconductor layer 115a including the RTD 101a is estimated as about 30 mS, and the diode capacitance (CRTD) of the RTD 101a is estimated as about 10 fF.

The antenna 100a is a patch antenna with a structure such that the dielectric layer 104 is sandwiched by the second conductor layer 103a that is a patch conductor and the first conductor layer 106 that is a grounding conductor. The semiconductor layer 115a including the RTD 101a is integrated in the antenna 100a. The antenna 100a is a square patch antenna in which one side of the second conductor layer 103a is 150 μm, and the resonator length (L) of the antenna is 150 μm.

A metal layer that has mainly an Au thin film having a low resistivity is used for the second conductor layer 103a that is a patch conductor and the first conductor layer 106 that is a grounding conductor. The second conductor layer 103a is made of a metal containing Ti/Au (=5/300 nm). The dielectric layer 104 is disposed in a layer between the second conductor layer 103a and the first conductor layer 106. The dielectric layer 104 is made up of two layers, that is, the first dielectric layer 1041 made of 5 μm thick benzocyclobutene (BCB, made by The Dow Chemical Company, εr1=2) and the second dielectric layer 1042 made of 2 μm thick SiO2 (plasma CVD, εr2=4).

The first conductor layer 106 is made up of a Ti/Pd/Au layer (20/20/200 nm) and a semiconductor layer made up of n+-InGaAs layer (100 nm) with an electron concentration of $1 \times 10^{18}$ cm$^{-3}$ or greater, and the metal and the semiconductor layer are connected to each other in low-resistance ohmic contact.

The electrode 116a is an ohmic electrode made up of a Ti/Pd/Au layer (20/20/200 nm). The electrode 116a is connected in low-resistance ohmic contact with a semiconductor layer made up of an n+-InGaAs layer (100 nm) with an electron concentration of $1 \times 10^{18}$ cm$^{-3}$ or higher and formed in the semiconductor layer 115a.

Around the RTD 101a, the substrate 113, the first conductor layer 106, the semiconductor layer 115a, the electrode 116a, the conductor 117a made up of a conductor containing Cu, and the second conductor layer 103a are laminated in this order from the substrate 113 side and are electrically connected. The RTD 101a is disposed at a location shifted by 40% (60 μm) of one side of the second conductor layer 103a in a resonant direction (X direction) from the center of gravity of the second conductor layer 103a. Here, an input impedance at the time when radio frequency is supplied from the RTD to the patch antenna is determined from the location of the RTD 101a in the antenna 100a. The second conductor layer 103a is connected to the line 108a1 disposed in a lower layer, by way of the conductor 107a1 that is a via made of Cu and is connected to the line 108a2 disposed in a lower layer, by way of the conductor 107a2 that is a via made of Cu.

The lines 108a1, 108a2 are made up of a metal layer containing Ti/Au (=5/300 nm) laminated on the second dielectric layer 1042. The lines 108a1, 108a2 are connected to the bias circuit 120 by way of the bias line 111 that is a common wiring line formed in a chip. The bias line 111 is made up of a metal layer containing Ti/Au (=5/300 nm) laminated on the second dielectric layer 1042. The antenna 100a is designed to obtain oscillation with a power of 0.2 mW at a frequency of f THz=0.5 THz when a bias is set to the negative resistance region of the RTD 101a.

Each of the conductors 107a1, 107a2 has a circular columnar structure with a diameter of 10 μm. Each of the lines 108a1, 108a2 is made up of a pattern formed by a metal layer containing Ti/Au (=5/300 nm) with a width of 10 μm and a length of 75 μm in the resonant direction (=X direction). Each of the conductors 107a1, 107a2 is connected to the second conductor layer 103a at the center in the resonant direction (=X direction) at an end in the Y direction. The connecting location corresponds to a node of an electric field that has a terahertz wave of f THz and that stands in the antenna 100a.

The element 10 is an antenna array in which the nine antennas 100a to 100i are disposed in a 3 by 3 matrix. Each of the antennas is designed to oscillate a terahertz wave having a frequency of f THz alone, and the antennas are disposed at a pitch of 340 μm (interval) both in the X direction and in the Y direction. Adjacent two of the antennas are coupled to each other by the coupling line 109 including the third conductor layer 110 made of Ti/Au (=5/300 nm). For example, the antenna 100a and the antenna 100b are coupled to each other by the coupling line 109ab. The central antenna 100e is connected to the antenna 100f by the coupling line 109ef extending in the first direction (vertical direction) and is connected to the antenna 100d by the coupling line 109ed extending in the first direction (vertical direction). Similarly, the antenna 100e is connected to each of the adjacent antenna 100h and antenna 100b by the coupling lines 1091he, 1092he, 1091eb, 1092eb extending in the second direction (horizontal direction). Here, in the case of the antennas 100e, 100d, the coupling line 109de in the vertical direction and the coupling lines 1092he, 1092eb in the horizontal direction are connected at a location shifted by 30 um in the X direction from the center of the symmetry of the antennas 100e, 100d in the vertical direction. In other words, the coupling line 109de in the vertical direction and the coupling lines 1092he, 1092eb in the horizontal direction are connected at a location other than the center of a line segment that connects the antenna 100e with the antenna 100d. The second conductor layer 103a and the second conductor layer 103b are directly connected by the third conductor layer 110ab formed in the same layer and having a width of 5 μm and a length of 190 μm. The antenna 100a and the antenna 100d are coupled to each other by the coupling line 109ad. The second conductor layer 103a and the second conductor layer 103d are directly connected by the third conductor layer 110ad formed in the same layer with these layers and having a width of 5 μm and a length of 440 μm. The same applies to the other antennas. The antennas 100a to 100i are subjected to mutual injection-locking and oscillate in a state where the phases are matched with each other (in phase) at an oscillatory frequency of f THz=0.5 THz.

The bias line 111 that is a common wiring line formed in a chip is a bias wiring line common to the antennas and is connected to the lines 108a1, 108a2 to the lines 108i1, 108i2 respectively connected to the antennas 100a to 100i.

In the element 10, as in the case of the relationship between the third conductor layer 110ab of the coupling line 109ab and the fourth conductor layer 111x1 of the bias line 111, the coupling line 109 and the bias line 111 are disposed in different layers. In the element 10, the substrate 113, the first conductor layer 106, and the second conductor layer 103a are laminated in this order from the substrate 113 side. As in the case of the third conductor layer 110ab and the fourth conductor layer 111x1, the bias line 111 is disposed in a layer between the first conductor layer 106 and the second conductor layer 103a. The coupling line 109 and the bias line 111 intersect with each other. The same applies to the relationship between the coupling line 109 and the bias line 111 that couple the other antennas 100b to 100i. With such a configuration, physical interference between a coupling line (coupling line 109) for synchronization between the antennas and a power supply line (bias line 111) for supplying a bias to each of the RTDs 101 is reduced. Therefore, the upper limit of the number of antennas arranged increases, so the effect of significantly improving directivity and front intensity resulting from an increase in the number of antennas is expected.

Manufacturing Method for Element

Next, a manufacturing method (preparation method) for the element 10 according to the present embodiment will be described.

(1) Initially, InGaAs/AlAs semiconductor layer multilayer film structure that is a component of the semiconductor layers 115a to 115i respectively including the RTDs 101a to 101i is epitaxially grown on the substrate 113 made of InP. This is formed by a molecular beam epitaxy (MBE) method, a metal-organic vapor-phase epitaxy (MOVPE) method, or the like.

(2) A Ti/Pd/Au layer (20/20/200 nm) that is a component of the electrodes 116a to 116i that are ohmic electrodes is deposited on the semiconductor layers 115a to 115i by a sputtering method.

(3) The electrodes 116a to 116i and the semiconductor layers 115a to 115i each are formed into a circular mesa shape with a diameter of 2 μm to form a mesa structure. Here, dry etching using photolithography and inductively coupled plasma (ICP) is used to form the mesa shape.

(4) On the etched surface, after the first conductor layer 106 is formed on the substrate 113 by a lift-off method, silicon oxide with a thickness of 2 μm, which will be the second dielectric layer 1042, is deposited by a plasma CVD method.

(5) A Ti/Au layer (=5/300 nm) is formed on the second dielectric layer 1042 as the fourth conductor layer 111 that is a component of the lines 108a1 to 108i2 and the bias line 111. (6) BCB with a thickness of 5 μm, which will be the first dielectric layer 1041, is embedded and planarized by using a spin coating method and a dry etching method.

(7) BCB and silicon oxide located at portions where the conductors 117a to 117i and the conductors 107a1 to 107i2, which will be vias, are formed are removed by photolithography and dry etching to form via holes (contact holes). At this time, when photolithography including gray scale exposure is used, taper angles of via holes for forming the first dielectric layer 1041, the second dielectric layer 1042, and the coupling line 109 are selectively controlled.

(8) The conductors 117a to 117i and the conductors 107a1 to 107i2 that are vias are formed in the via holes from a conductor containing Cu. The via holes are buried with Cu and planarized by using a sputtering method, an electroplating method, and a chemical-mechanical polishing method to form the conductors 117a to 117i and the conductors 107a1 to 107i2.

(9) An electrode Ti/Au layer (=5/300 nm), which will be the second conductor layers 103a to 103i and the third conductor layer 110 that is a component of the coupling line 109 in the antennas, is deposited by a sputtering method.

(10) With dry etching using photolithography and inductively coupled plasma (ICP), patterning of the second conductor layers 103a to 103i and the third conductor layer 110 that is a component of the coupling line 109 is performed.

(11) Lastly, the shunt resistor 121 and the capacitor 124 are formed and are connected to the wiring line 122 and the power supply 123 by wire bonding or the like, with the result that the element 10 is completed. The capacitor 124 is, for example, a metal insulator metal (MIM) capacitor.

Electric power is supplied from the bias circuit 120 to the element 10. When a bias voltage that normally causes the differential negative resistance range is applied to supply a bias current, the element 10 operates as an oscillator.

The element 10 according to the present embodiment has a suitable antenna array. Thus, it is possible to provide an antenna array that achieves at least one of improvement in antenna gain and improvement in directivity.

Figure 1B:
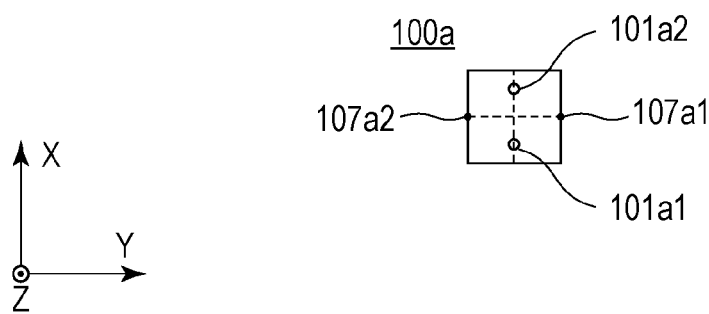
FIG. 1B is a top schematic diagram that shows a modification of the element 10 according to the first embodiment.

Each of the antennas 100 of the element 10 may be modified as shown in FIG. 1B. FIG. 1B is a top schematic diagram that shows a modification of the antenna 100a of the element 10 shown in FIG. 1A. In FIG. 1B, the antenna 100a has at least two semiconductor layers, that is, a semiconductor layer 101a1 and a semiconductor layer 101a2. The semiconductor layer 101a1 and the semiconductor layer 101a2 each have a configuration equivalent to the configuration of the semiconductor layer 101. With such a configuration, the gain of the antennas is further improved.

The antenna 100a is a square patch antenna. In FIG. 1B, line segments each connecting the centers of two opposite sides of the patch antenna are represented by the dashed lines. The intersection point of the dashed lines is the center of the patch antenna. Each of the conductor 107a1 and the conductor 107a2, respectively, are located at the centers of two sides of the patch antenna, extending in the X direction, The semiconductor layer 101a1 and the semiconductor layer 101a2, respectively, are located in the dashed line connecting the centers of two sides of the patch antenna, extending in the Y direction. The semiconductor layer 101a1 and the semiconductor layer 101a2 are located at an equal distance from the center of the patch antenna. With such a configuration, the operation of the antenna becomes stable.

Second Embodiment

Figure 6A:
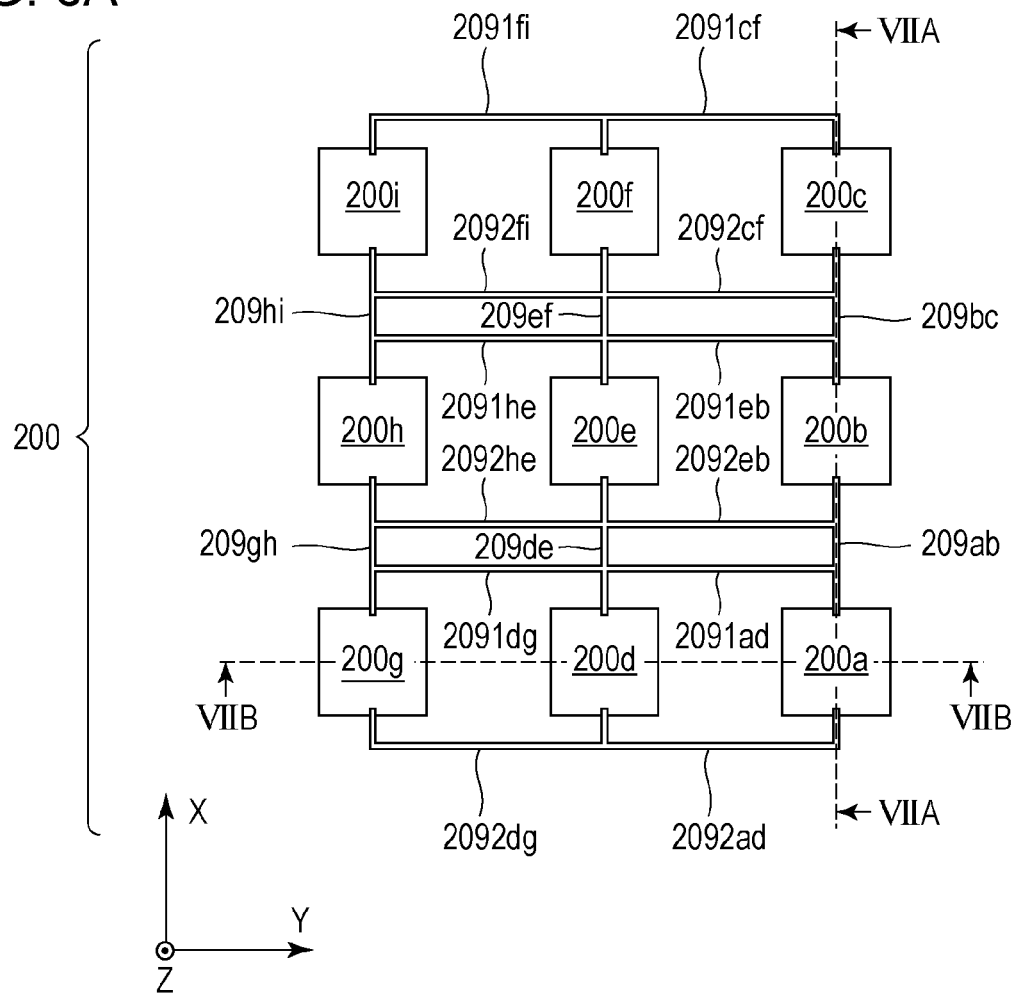
FIG. 6A is a diagram that shows an element 20 according to a second embodiment.
Figure 6B:
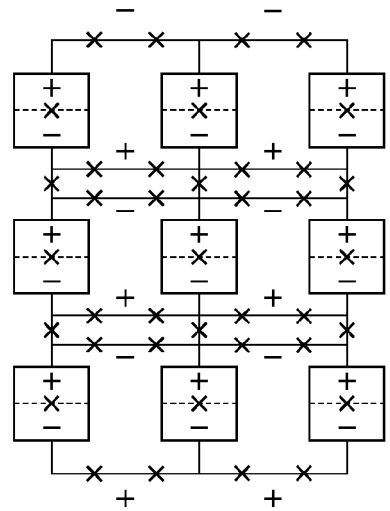
FIG. 6B is a diagram that shows the element 20 according to the second embodiment.
Figure 7B:
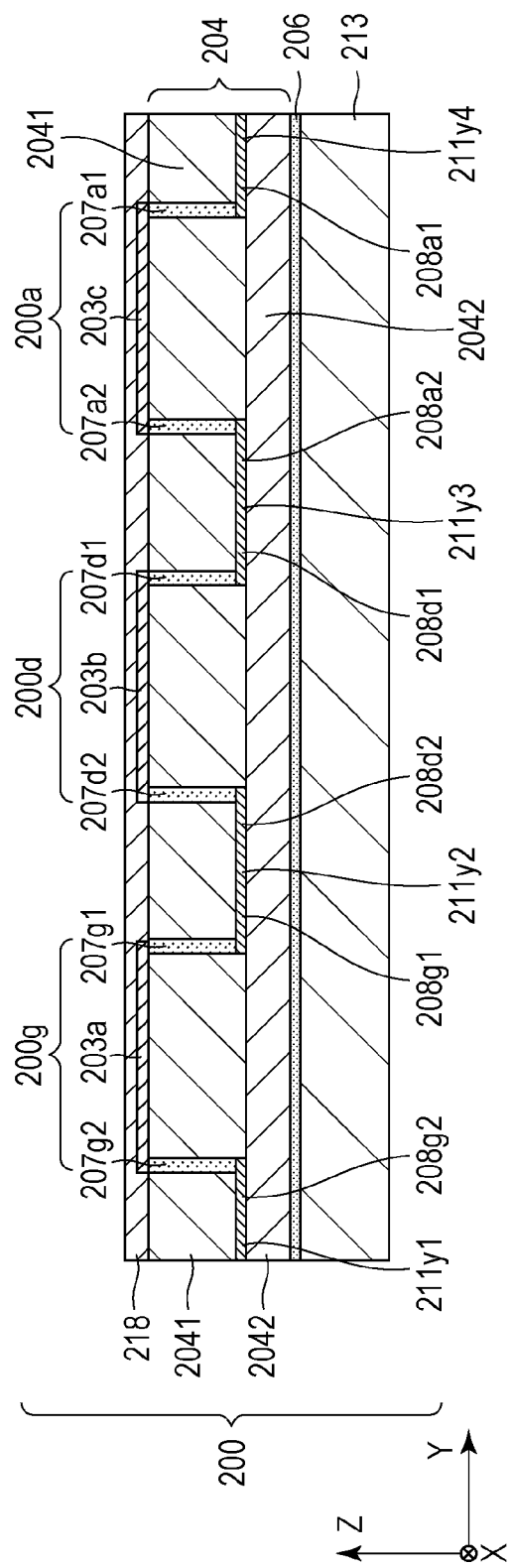
FIG. 7B is a schematic cross-sectional view that shows the element 20 according to the second embodiment.

FIGS. 6A, 6B, 7A, and 7B are schematic configuration diagrams and schematic cross-sectional views of an element 20 according to a second embodiment. Components and structures other than those described below in the element 20 are similar to the components with the same names of the element 10 according to the first embodiment, so the detailed description is omitted. FIG. 6A is a diagram corresponding to FIG. 4 of the first embodiment, FIG. 6B is a diagram corresponding to FIG. 5A of the first embodiment, and redundant description will not be repeated. FIG. 6B is a schematic diagram for illustrating the locations of the nodes and antinodes of a resonant electric field in the configuration of FIG. 6A. FIGS. 7A and 7B are respectively cross-sectional views taken along the line VIIA-VIIA and the line VIIB-VIIB in FIG. 6A and are views respectively corresponding to FIGS. 3A and 3B of the first embodiment, and redundant description will not be repeated.

The element 20 is an antenna array in which nine antennas 200a to 200i are disposed in a 3 by 3 matrix. The antenna 200a, different from the first embodiment, includes two semiconductor layers that have an electromagnetic wave gain or nonlinearity for a terahertz wave in one antenna. Specifically, as shown in FIG. 7A, the antenna 200a includes a semiconductor layer 215a1 including an RTD 201a1 and a semiconductor layer 215a2 including an RTD 201a2.

In FIG. 7A, an electrode 216a1 is disposed on an opposite side of the semiconductor layer 215a1 to a side on which the first conductor layer 206 is disposed, and an electrode 216a2 is disposed on an opposite side of the semiconductor layer 215a2 to a side on which the first conductor layer 206 is disposed. The semiconductor layer 215a1 is disposed between the first conductor layer 206 and the electrode 216a1, and the semiconductor layer 215a2 is disposed between the first conductor layer 206 and the electrode 216a2. The electrode 216a1 and the semiconductor layer 215a1 are electrically connected to each other, and the electrode 216a2 and the semiconductor layer 215a2 are electrically connected to each other. A bias signal is supplied from the bias circuit 120 to the two RTDs 201a1, 201a2 by way of a conductor 217a1 that is a via connected between the electrode 216a1 and a second conductor layer 203a and a conductor 217a2 that is a via connected between the electrode 216a2 and the second conductor layer 203a.

As shown in FIG. 6A, the RTD 201a1 is disposed at a location shifted by 40% of the length of one side of the second conductor layer 203a in the resonant direction (that is, X direction) from the center of gravity of the second conductor layer 203a. On the other hand, the RTD 201a2 is disposed at a location shifted by −40% of the length of one side of the second conductor layer 203a in the resonant direction (that is, X direction) from the center of gravity of the second conductor layer 203a. In other words, the RTD 201a1 and the RTD 201a2 are disposed at locations that are line-symmetric with respect to an axis that is a straight line (center line) passing through the center of gravity of the second conductor layer 203a and perpendicular to the resonant direction and the lamination direction. In this case, the RTD 201a1 and the RTD 201a2 are subjected to mutual injection-locking and oscillate in a state where the phases are inverted from each other (opposite phase). In this way, the configuration in which the RTDs are disposed so as to be symmetric in the right and left direction and in the up and down direction in the antenna is a configuration that further easily provides the effect of improving directivity and front intensity resulting from an increase in the number of antennas.

A coupling line 209 is made up of a microstrip line in which a dielectric layer 204 and a dielectric layer 218 are sandwiched by the first conductor layer 206 and a fifth conductor layer 210 laminated on the dielectric layer 218 laminated on the dielectric layer 204. For example, as shown in FIG. 7A, a coupling line 209ab has such a structure that the dielectric layer 204 and the dielectric layer 218 are sandwiched by a fifth conductor layer 210ab and the first conductor layer 206.

Similarly, a coupling line 209bc has such a structure that the dielectric layer 204 and the dielectric layer 218 are sandwiched by the first conductor layer 206 and a fifth conductor layer 210bc provided as an upper conductor layer, and a coupling line 209ad has such a structure that the dielectric layer 204 and the dielectric layer 218 are sandwiched by the first conductor layer 206 and a fifth conductor layer 210ad provided as an upper conductor layer.

The element 20 is an antenna array having a configuration in which the antennas are coupled by AC coupling (capacitive coupling). For example, the fifth conductor layer 210ab that is the upper conductor layer of the coupling line 209ab coupling the antenna 200a with the antenna 200b overlaps the second conductor layers 203a, 203b by 5 μm around a radiation end in plan view. The same applies to coupling between any adjacent two of the other antennas 200b to 200i.

At the portion where the conductor layers overlap each other, the second conductor layers 203a, 203b, the dielectric layer 218, and the fifth conductor layer 210ab are laminated in this order, and a metal-insulator-metal (MIM) capacitor structure is formed. At this time, the second conductor layer 203a and the second conductor layer 203b are open at DC, isolation between elements is ensured because the coupling strength is small in a low-frequency range lower than f THz. On the other hand, in a band of the oscillatory frequency f THz, the coupling strength between the antennas can be adjusted with a capacitor. Such a structure significantly reduces coupling between the antennas, so transmission losses between the antennas are suppressed, with the result that improvement in the radiation efficiency of the antenna array is expected.

The element 20 according to the present embodiment is an example in which two coupling lines extending in the second direction (horizontal direction) are disposed between the antenna 200e disposed at the center and the antenna adjacent to the antenna 200e in the second direction (horizontal direction). Specifically, coupling lines 2091he, 2092fi, 2092cf, 2091eb extending in the second direction (horizontal direction) are disposed between the antennas 200e, 200f and are connected to a coupling line 209ef extending in the first direction. Coupling lines 2092he, 2091dg, 2091ad, 2092eb extending in the second direction (horizontal direction) are disposed between the antennas 200e, 200d and are connected to a coupling line 209de extending in the first direction.

The coupling lines in the element 20 are provided in a ladder shape between a row in which the antenna 200i, the antenna 200f, and the antenna 200c are disposed and a row in which the antenna 200h, the antenna 200e, and the antenna 200b are disposed. Between these rows, the coupling line 209bc, a coupling line 209hi, and the coupling line 209ef are disposed in the X direction. In addition, between these rows, the coupling line 2092fi, the coupling line 2092cf, the coupling line 2091he, and the coupling line 2091eb are disposed in the Y direction. The coupling line 2092fi and the coupling line 2092cf connect the coupling line 209bc with the coupling line 209hi. The coupling line 2092fi and the coupling line 2092cf are connected at the coupling line 209ef. The coupling line 2091he and the coupling line 2091eb connect the coupling line 209bc with the coupling line 209hi. The coupling line 2091he and the coupling line 2091eb are connected at the coupling line 209ef. The coupling lines may be made from a single electric conductor body. The antennas 200 and the coupling lines are connected by AC coupling.

The coupling lines are further provided in a ladder shape between a row in which the antenna 200h, the antenna 200e, and the antenna 200b are disposed and a row in which the antenna 200g, the antenna 200d, and the antenna 200a are disposed. Between these rows, a coupling line 209gh, the coupling line 209de, and the coupling line 209ab are disposed in the X direction. In addition, between these rows, the coupling line 2092he, the coupling line 2092eb, the coupling line 2091dg, and the coupling line 2091ad are disposed in the Y direction. The coupling line 2092he and the coupling line 2092eb connect with the coupling line 209gh and the coupling line 209ab. The coupling line 2092he and the coupling line 2092eb are connected at the coupling line 209de. The coupling line 2091dg and the coupling line 2091ad connect with the coupling line 209gh and the coupling line 209ad. The coupling line 2091dg and the coupling line 2091ad are connected at the coupling line 209de. The coupling lines may be made from a single electric conductor body. The antennas 200 and the coupling lines are connected by AC coupling.

Here, to satisfy the phase matching condition between the antennas, the coupling line extending in the second direction (horizontal direction) is connected to the coupling line in the first direction at a location shifted by a predetermined distance in the first direction from the center of symmetry between the adjacent antennas in the first direction. In the case of the example of the present embodiment, the coupling lines in the first direction and in the second direction are connected at a location shifted by 30 um in an upward direction and in a downward direction from a node of the resonant electric field that stands in the coupling lines at the frequency of a terahertz wave. With the configuration in which two coupling lines in the second direction are disposed in this way, coupling between the antennas in the horizontal direction is enhanced, so a further high effect of mutual injection-locking is obtained. Thus, the gain of the antennas improves. The symmetry of arrangement of connection of the coupling lines and the antennas gets better as compared to the case of a single coupling line, so the effect of well-formed radiation pattern is expected.

Third Embodiment

Figure 8A:
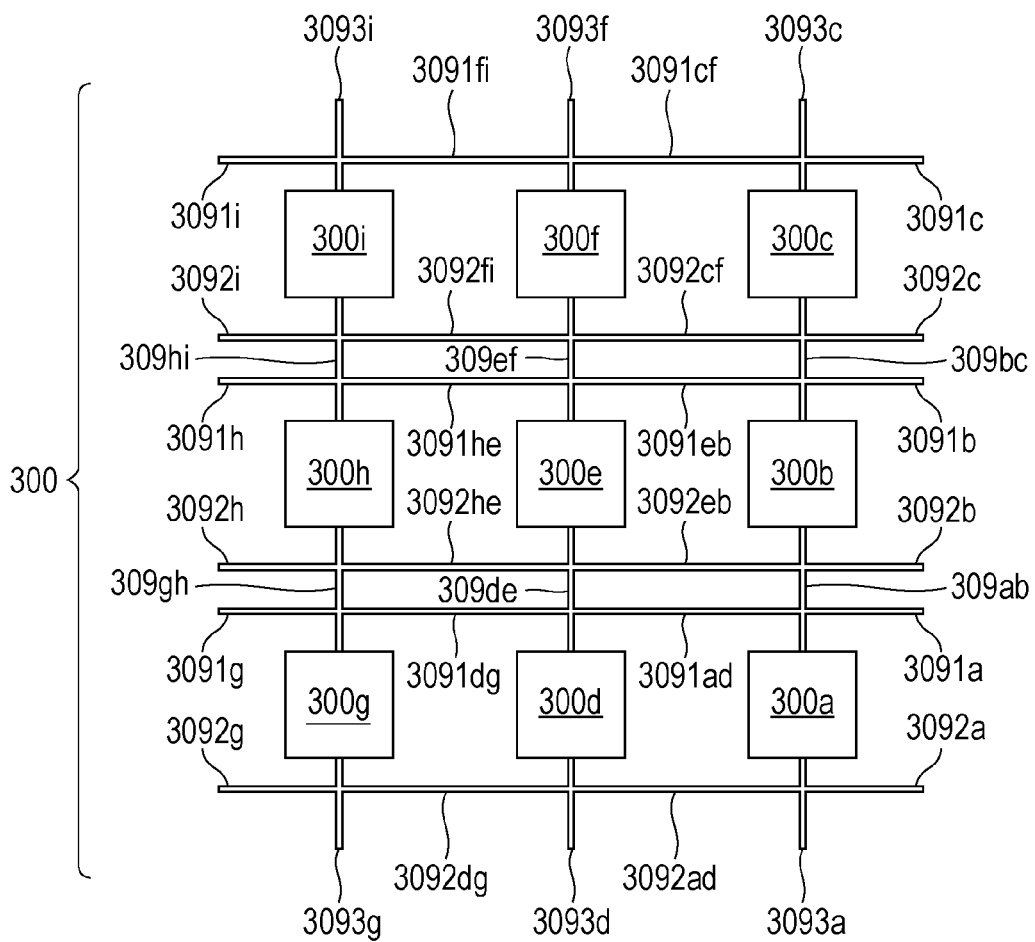
FIG. 8A is a diagram that shows an element 30 according to a third embodiment.
Figure 8B:
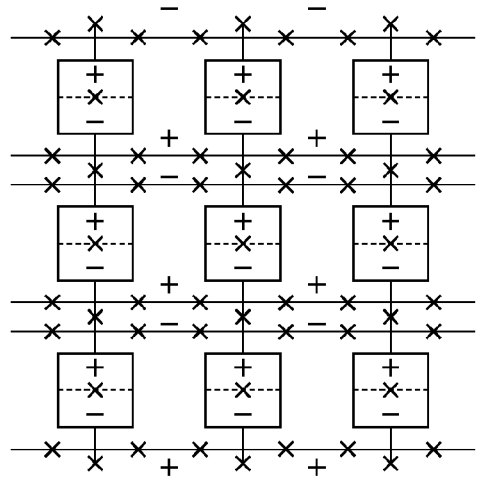
FIG. 8B is a diagram that shows the element 30 according to the third embodiment.

FIGS. 8A and 8B are diagrams that illustrate the configuration of the element 30 according to the present embodiment. The element 30 is an antenna array in which nine antennas 300a to 300i are disposed in a 3 by 3 matrix. Each of the antennas 300a to 300i, as in the case of the element 10 according to the first embodiment, includes one semiconductor layer that has an electromagnetic wave gain or nonlinearity for a terahertz wave in one antenna. FIG. 8A is a diagram corresponding to FIG. 4 of the first embodiment, FIG. 8B is a diagram corresponding to FIG. 5A of the first embodiment, and redundant description will not be repeated.

The element 30 has such a configuration that coupling lines of the antennas disposed at an array end are extended outward. For example, lines 3091a, 3092a, 3091c, 3092c, 3091g, 3092g, 3091i, 3092i are connected in the horizontal direction to the antennas 300a, 300c, 300g, 300i at four corners, and the coupling lines are extended. Similarly, lines 3093a, 3093c, 3093g, 3093i are connected in the vertical direction to the antennas 300a, 300c, 300g, 300i at four corners, and the coupling lines are extended. In addition, lines 3093d, 3093f are connected in the vertical direction and lines 3091b, 3092b, 3091h, 3092h are connected in the horizontal direction to the antennas 300b, 300d, 300f, 300h at the end of the array and other than the four corners, and the coupling lines are extended. With such a configuration, even at the portion at the end of the array as well, the same relationship is achieved between the antenna and at least any one of the coupling lines disposed in the vertical direction and the coupling lines disposed in the horizontal direction. In other words, the relationship between the antenna 300e and the coupling lines is uniform in layout with the relationship between each of the other antennas 300 and the coupling lines. Thus, unnecessary reflection and phase mismatching due to the influence of the end are reduced, so enhanced phase-locking and the effect of well-formed radiation pattern are expected. In addition, since the antenna and the coupling lines are in a symmetric shape in the vertical direction and in the horizontal direction in each unit antenna, it is beneficial that the design of the antenna array is simplified and becomes easy. In the present embodiment, the symmetry of the coupling lines and the antenna in the X direction and the symmetry of the coupling lines and the antenna in the Y direction are ensured. Alternatively, only any one of the symmetries may be improved.

The configuration of the element 30 is capable of further reducing unnecessary reflection and phase mismatching due to the influence of the end by electrically terminating the coupling lines at the single antennas and the array end, so the configuration is further good to enhance phase-locking and adjust the radiation pattern.

Fourth Embodiment

Figure 9A:
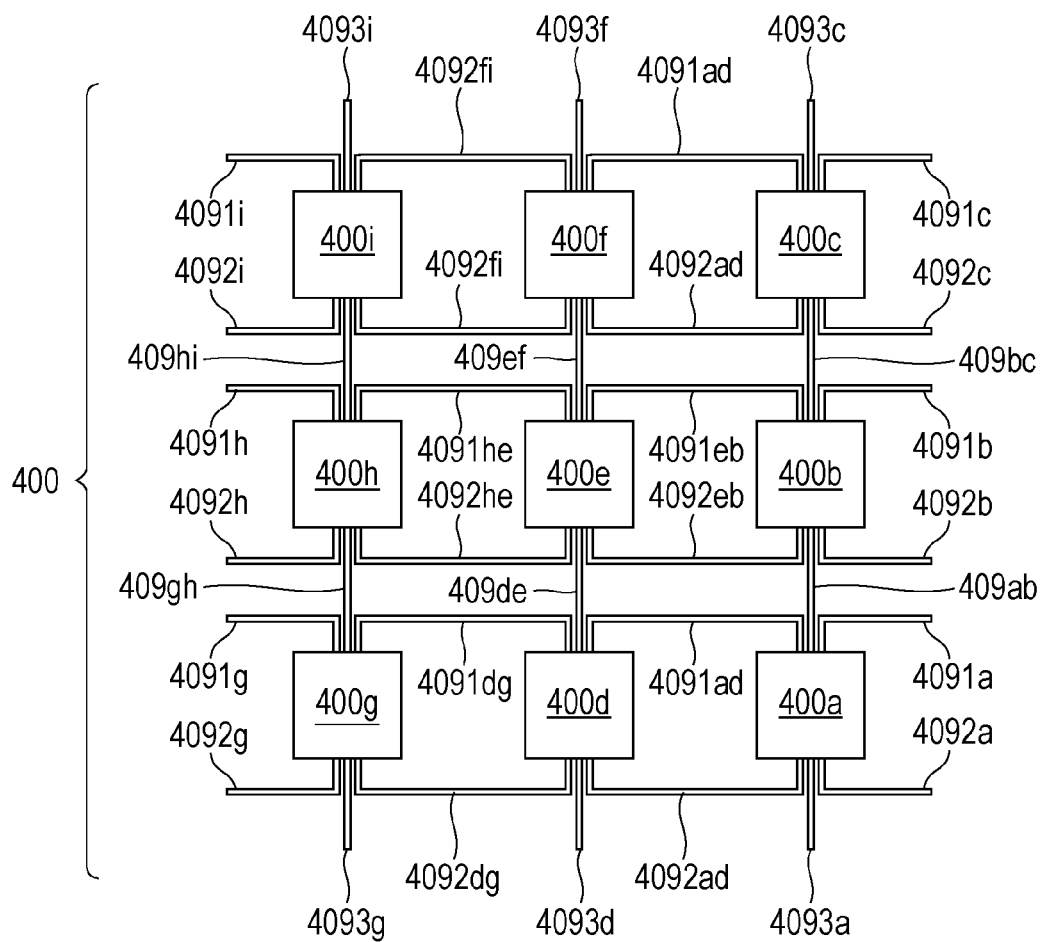
FIG. 9A is a diagram that shows an element 40 according to a fourth embodiment.
Figure 9B:
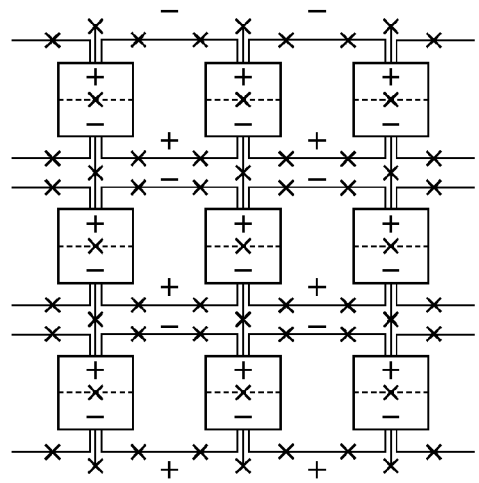
FIG. 9B is a diagram that shows the element 40 according to the fourth embodiment.

FIGS. 9A and 9B are diagrams that illustrate the configuration of an element 40 according to the present embodiment. FIG. 9A is a diagram corresponding to FIG. 4 of the first embodiment, FIG. 9B is a diagram corresponding to FIG. 5A of the first embodiment, and redundant description will not be repeated.

The element 40 has such a configuration that independent coupling lines are extended from a unit antenna in the vertical direction and in the horizontal direction. For example, coupling lines 409ef, 409de are extended from an antenna 400e in the vertical direction and, respectively, are connected to antennas 400f, 400d. Coupling lines 4091he, 4092he are extended in the horizontal direction and are connected to an antenna 400h. Coupling lines 4091eb, 4092eb are extended in the horizontal direction and are connected to an antenna 400b. The coupling lines are adjusted to such a length that the electrical length between the oscillators of adjacent antennas becomes an integer multiple of $2\pi$ to perform in-phase mutual injection-locking of the RTDs 401a to 401i that are the oscillators of the antennas. In other words, when the electrical length between the semiconductor layers of two antennas is assumed as L1, the length L1 of the coupling line should be set so as to satisfy L1=$2\pi \times$k (k is an integer). The coupling line 409de in the first direction (vertical direction) is adjusted to such a length that the electrical length between the RTD 401e and the RTD 401d becomes $2\pi$. The coupling lines 4091eb, 4092eb extending in the second direction are adjusted to such a length that the electrical length between the RTDs 401e, 401b becomes $4\pi$. At this time, in the case of coupling lines branched in the three upward, rightward, and leftward directions like the element 40, the electrical length between the antennas can be adjusted by separately adjusting the length of each of the coupling lines. Such a configuration allows vertical and horizontal coupling lines to be separately designed, so the flexibility of design improves. The configuration of the element 40 is capable of further reducing unnecessary reflection and phase mismatching due to the influence of the end by electrically terminating the coupling lines at the single antennas and the array end, so the configuration is further good to enhance phase-locking and adjust the radiation pattern.

Fifth Embodiment

In the present embodiment, a case where the element according to any one of the first to fourth embodiments is applied to a terahertz camera system will be described. Hereinafter, the description will be made with reference to FIG. 10. A terahertz camera system 1100 includes a transmitting portion 1101 that radiates a terahertz wave and a receiving portion 1102 that detects a terahertz wave. The terahertz camera system 1100 further includes a controller 1103 for controlling the operations of the transmitting portion 1101 and the receiving portion 1102 in accordance with a signal from outside and processing an image based on the detected terahertz wave or outputting the image to outside.

The element according to any one of the embodiments may be the transmitting portion 1101 or may be the receiving portion 1102.

A terahertz wave from the transmitting portion 1101 reflects on a subject 1105 and is detected by the receiving portion 1102. A camera system including the transmitting portion 1101 and the receiving portion 1102 is also referred to as an active camera system. In a passive camera system with no transmitting portion 1101, the element according to any one of the embodiments may be used as a receiving portion.

Thus, the camera system using the element according to any one of the embodiments with a high antenna gain is capable of obtaining a high detection sensitivity and a high-quality image.

Sixth Embodiment

Figure 11A:
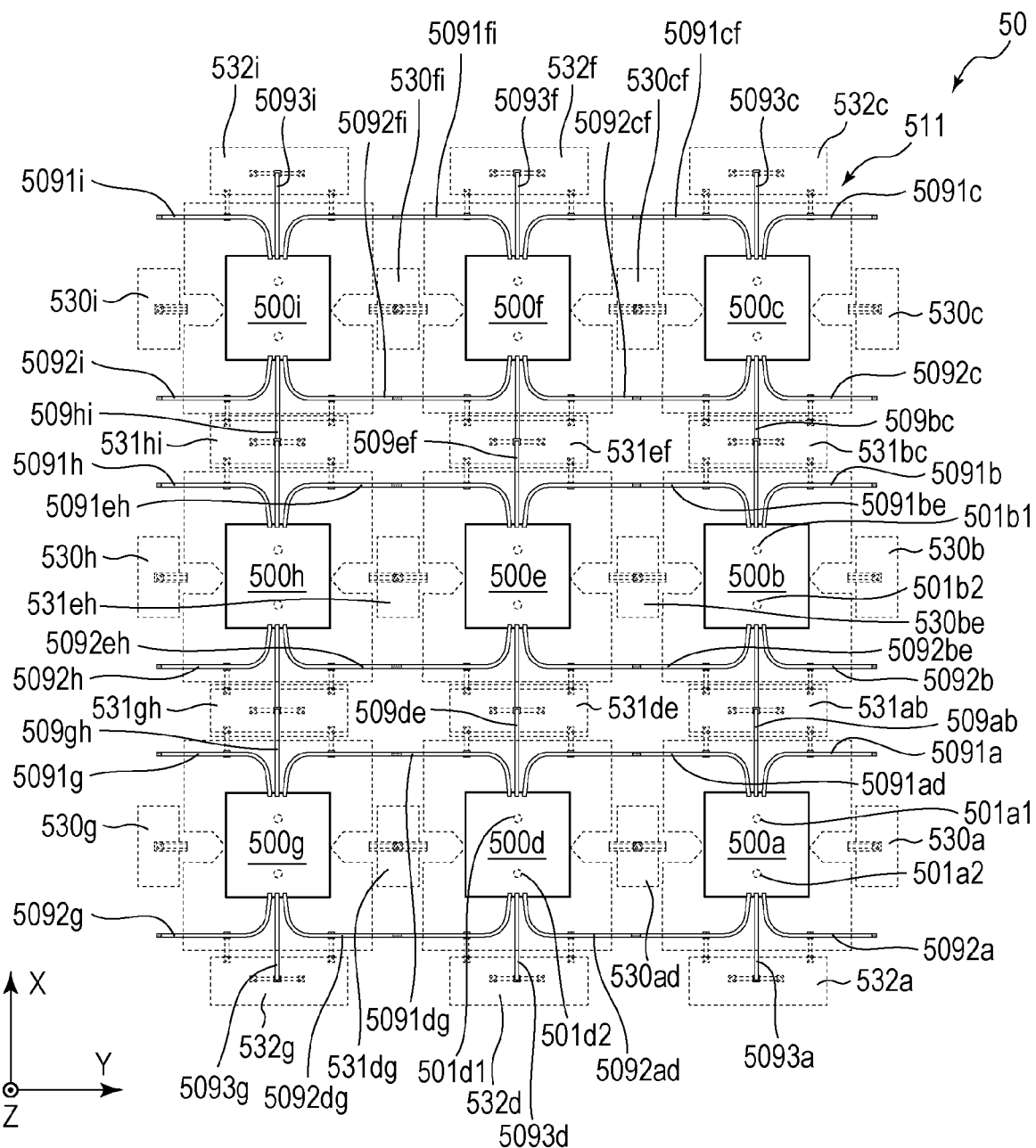
FIG. 11A is a top schematic diagram that shows an element 50 according to a sixth embodiment.
Figure 11B:
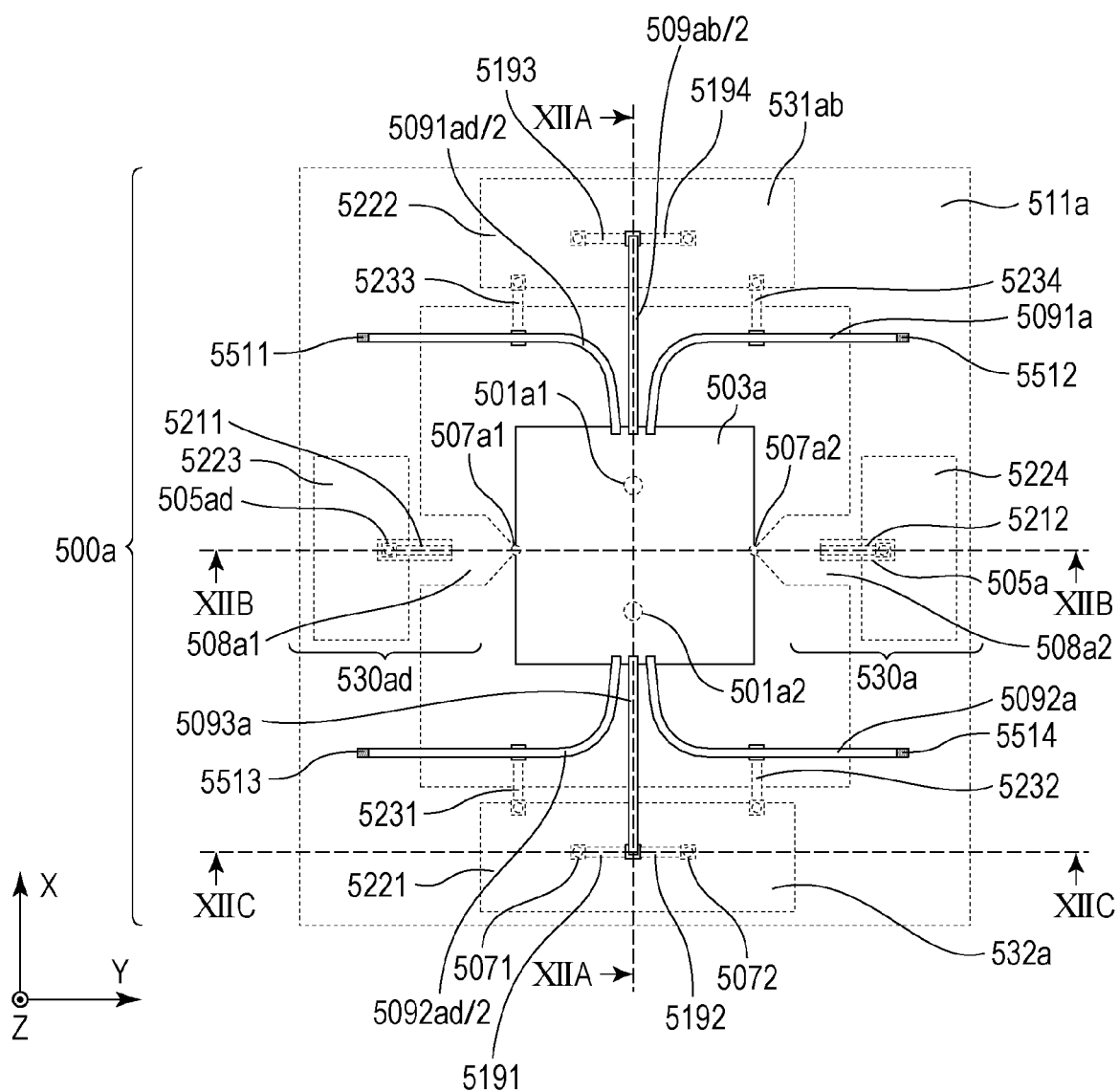
FIG. 11B is a top schematic diagram that shows the element 50 according to the sixth embodiment.
Figure 11C:
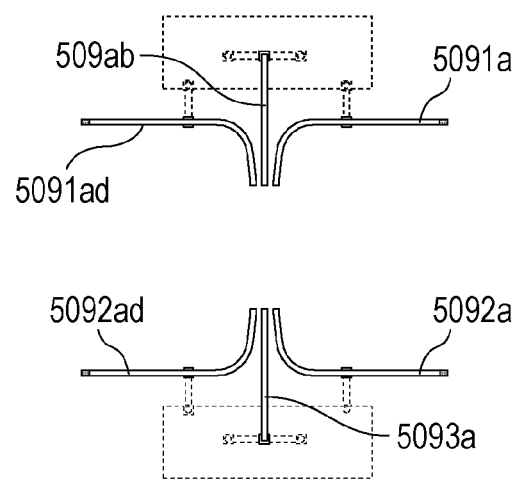
FIG. 11C is an enlarged top schematic diagram that shows the element 50 according to the sixth embodiment.
Figure 11D:
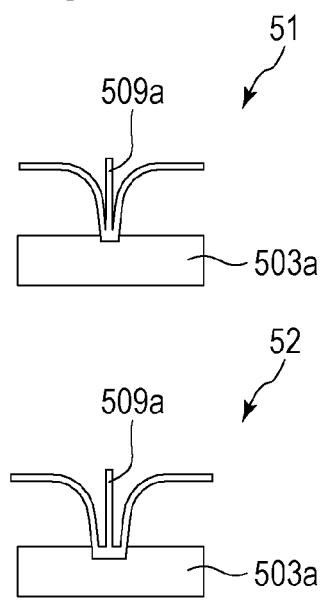
FIG. 11D is a top schematic diagram that shows a modification of the element 50 according to the sixth embodiment.
Figure 12A:
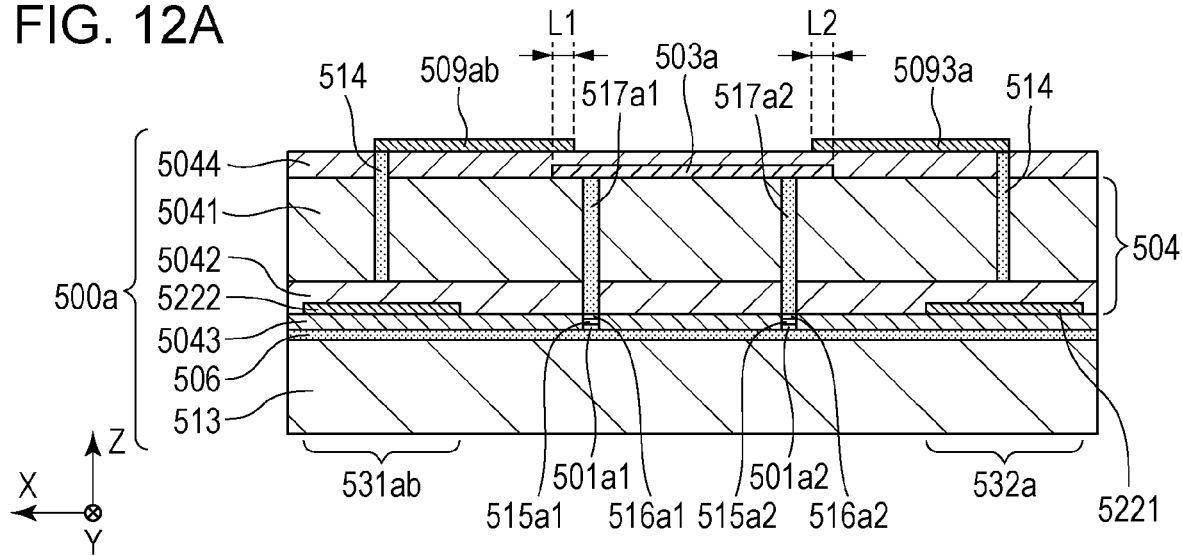
FIG. 12A is a schematic cross-sectional view that shows the element 50 according to the sixth embodiment.
Figure 12B:
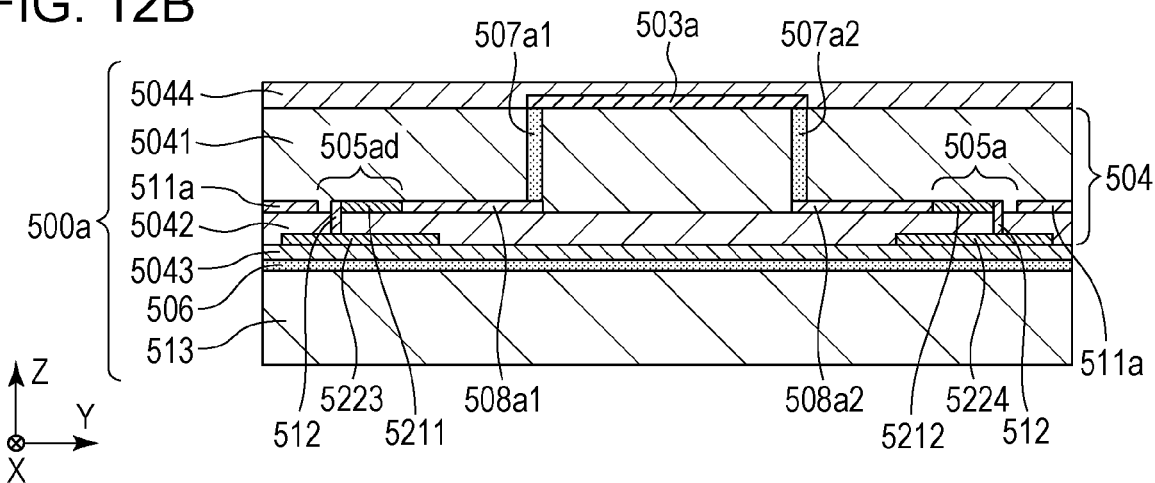
FIG. 12B is a schematic cross-sectional view that shows the element 50 according to the sixth embodiment.
Figure 12C:
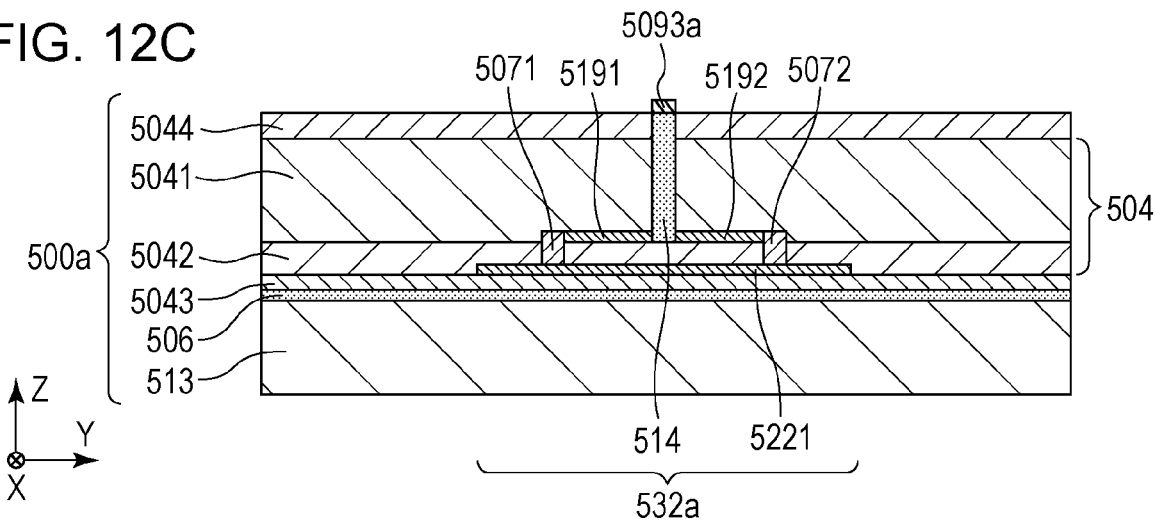
FIG. 12C is a schematic cross-sectional view that shows the element 50 according to the sixth embodiment.

The configuration of an element 50 according to the present embodiment will be described with reference to FIGS. 11A to 12C. FIGS. 11A and 11B are top schematic diagrams of the element 50. FIG. 11C is an enlarged top schematic diagram of a relevant part of one antenna of the element 50. FIG. 11D is a modification of a relevant part of one antenna of the element 50. FIGS. 12A, 12B, and 12C are schematic cross-sectional views of the element 50, corresponding to FIG. 11A. Components and structures other than those described below in the element 50 are similar to the components of the antenna 100 according to the first embodiment, so the detailed description is omitted.

As shown in FIG. 11A, the element 50 is an antenna array in which nine antennas 500a to 500i are disposed in a 3 by 3 matrix. The element 50 is an antenna array in which, where the antenna 500a is assumed as a unit antenna, the unit antennas are arranged at a pitch of 0.6 wavelength.

The element 50 has capacitors 530 disposed in the Y direction. In the element 50, the 12 capacitors 530 are shown. In the Y direction, the capacitor 530 disposed between two antennas is referred to as a capacitor 530ad or the like using the reference signs of two antennas, and six capacitors 530 are shown in FIG. 11A. In the Y direction, the capacitors 530 disposed at the outer periphery of the antenna array are referred to as a capacitor 530a and the like by using the reference signs of adjacent antennas, and the six capacitors 530 are shown in FIG. 11A.

The element 50 has capacitors 531 and capacitors 532 disposed in the X direction. The capacitor 531 is disposed between any adjacent two of the antenna 500a to the antenna 500i, and the capacitor 532 is disposed around each of the antenna 500a to the antenna 500i. The capacitor 531 is located between two antennas and is referred to as a capacitor 531ab or the like by using the reference signs of the two antennas. In the element 50, the six capacitors 531 are shown. The capacitor 532 is located at the outer periphery of the antenna array and is referred to as a capacitor 532a or the like by using the reference signs of an adjacent antenna. In the element 50, the six capacitors 521 are shown.

The antenna 500a includes a plurality of coupling lines that are transmission lines for performing power transmission between adjacent antennas in the X direction and in the Y direction at an oscillatory frequency of f THz. The coupling lines are also referred to as coupling lines. At least one antenna includes a plurality of coupling lines. At least one antenna is connected to at least three or more coupling lines. At least one antenna is connected to at least four or more different antennas via coupling lines. Here, a case where a coupling line is coupled to an antenna includes a case where an antenna and a coupling line are electrically connected via a capacitor, a case where an antenna and a coupling line are directly connected, and a case where an antenna and a coupling line are made up of a single electric conductor. A coupling line has a microstrip line structure. The microstrip line structure has one conductor layer, a dielectric, and another conductor layer. In the following description, for the sake of easy understanding, the description will be made by using the same reference sign for the reference sign of one conductor layer and the reference sign of a coupling line.

The antenna 500i, the antenna 500f, and the antenna 500c are disposed in this order in the Y direction in the first row of the antenna array. The antenna 500h, the antenna 500e, and the antenna 500b are disposed in this order in the Y direction in the second row of the antenna array. The antenna 500g, the antenna 500d, and the antenna 500a are disposed in this order in the Y direction in the third row of the antenna array. When the X direction is assumed as the upward direction, the antennas in the second row are disposed above the third row, and the antennas in the first row are disposed above the second row.

The coupling lines will be described. Initially, a plurality of conductor layers 5091, a plurality of conductor layers 509, and a plurality of conductor layers 5092, shown in FIG. 11A, each can function as a coupling line For the sake of easy description, when focusing on the second row, the conductor layers 5091 and the conductor layers 509 are disposed between the first-row antennas and the second-row antenna 500h, antenna 500e, and antenna 500b. The conductor layers 5092 and the conductor layers 509 are disposed between the third-row antennas and the second-row antenna 500h, antenna 500e, and antenna 500b. Here, the reference signs of two antennas are assigned to conductor layers coupling the two antennas. For example, the antenna 500e is focused. The antenna 500h and the antenna 500e are coupled by the conductor layer 5091he and the conductor layer 5092he. The antenna 500e and the antenna 500b are coupled by the conductor layer 5091eb and the conductor layer 5092eb. The antenna 500e and the antenna 500f are coupled by the conductor layer 509ef. The antenna 500e and the antenna 500d are coupled by the conductor layer 509de.

In other words, the antenna 500h is coupled to the conductor layer 5091he and coupled to the conductor layer 5092he. The antenna 500e is coupled to the conductor layer 5091he and coupled to the conductor layer 5092he. The antenna 500e is coupled to the antenna 500h via the conductor layer 5091he and the conductor layer 5092he. The antenna 500e is coupled to the conductor layer 5091eb and coupled to the conductor layer 5092eb. The antenna 500b is coupled to the conductor layer 5091eb and coupled to the conductor layer 5092eb. The antenna 500e is coupled to the antenna 500b via the conductor layer 5091eb and the conductor layer 5092eb. The antenna 500e is coupled to the conductor layer 509ef. The antenna 500f is coupled to the conductor layer 509ef. The antenna 500e is coupled to the antenna 500f via the conductor layer 509ef. The antenna 500e is coupled to the conductor layer 509de. The antenna 500d is coupled to the conductor layer 509de. The antenna 500e is coupled to the antenna 500d via the conductor layer 509de.

When the reference sign of the antenna shown in FIG. 11A is assumed as xy, x≠y≠z and x, y, and z each are any one of a to i. The conductor layer 5091xy is located above the antenna and provides coupling in the Y direction. The conductor layer 5092xy is located below the antenna and provides coupling in the Y direction. The conductor layer 509xz is disposed between the conductor layer 5091xy and the conductor layer 5092xy. Here, above and below mean a location in the X direction and mean the upper and lower sides of the sheet of FIG. 11A.

An end of the antenna array will be described. In the antenna array shown in FIG. 11A, no target is shown for the antennas at the end, so those antennas are assigned with, for example, 5091h or 5091i. However, conductor layers may also be similarly disposed for the other antennas. For example, when focusing on the antenna 500d, a conductor layer 5093d coupled to the antenna 500d is not coupled to another antenna. The conductor layer 5093d may be coupled to a capacitor 532d. The conductor layer 5093d may also be regarded as being terminated.

Such the relationship in arrangement of conductor layers is similar to that of the antenna 500e. In other words, with such a configuration, the relationship between the antenna located at the end of the antenna array and the conductor layers is equivalent to the relationship in arrangement between the antenna located inside the antenna array and the conductor layers. In other words, it may be regarded that the antenna 500a serving as a unit cell is repeatedly disposed over the antenna 500b to the antenna 500i. With such a configuration, the symmetry of the antenna array is increased.

The relationship between the antenna and capacitors will be described. The capacitor 530, the capacitor 531, and the capacitor 532 each can function as a shunt element. The plurality of capacitors 531 and the plurality of capacitors 532 disposed in the X direction each are coupled to the conductor layer at the upper part of the antenna via the conductor layer that is the coupling line. The plurality of capacitors 530 disposed in the Y direction each is coupled to the conductor layer at the upper part of the antenna. With such a configuration, parasitic oscillation in the coupling lines is reduced. In the specification, coupling can include capacitive coupling and direct connection.

The capacitor 531 can be coupled to the plurality of conductor layers. In other words, one capacitor 531 can be shared among the plurality of conductor layers. For example, the description will be made by using the capacitor 531ab. The conductor layer 509ab, the conductor layer 5091a, the conductor layer 5091ad, the conductor layer 5092b, and the conductor layer 5092eb are coupled to the capacitor 531ab. The same applies to the capacitors 532. One capacitor 532 can be shared among the plurality of conductor layers. For example, the conductor layer 5092a, the conductor layer 5092ad, and the coupling line 5093a are coupled to the capacitor 532a. With such a configuration, a reduction in element area resulting from sharing of elements is possible. The capacitor 530 can be coupled to the plurality of antennas. In other words, one capacitor 530 is shared among the plurality of antennas. For example, the description will be made by using the capacitor 530ad. The conductor layer of the antenna 500a and the conductor layer of the antenna 500d are coupled to the capacitor 530ad. It is possible to share the capacitor connected to the antennas, so a reduction in element area is possible. These capacitors 530 to the capacitors 532 and the configuration of connection between the conductor layer and the capacitor will be described later with reference to FIGS. 12A to 12C.

The antenna 500a has an RTD 501a1 and an RTD 501a2 that make up an oscillation element. The antenna 500b has an RTD 501b1 and an RTD 501b2. The antenna 500d has an RTD 501d1 and an RTD 501d2. The same applies to the other antennas.

FIG. 11B is a top view of the antenna 500a that is a unit antenna of the antenna array of FIG. 11A. The antenna 500a is a patch antenna. The antenna 500a has at least a conductor layer 503a. The conductor layer 503a is supplied with a bias and may be regarded as an upper conductor layer since the conductor layer 503a is located at the upper part in the cross section taken along the Z direction. The antenna 500a includes inside at least one or more active layers having an electromagnetic wave gain or nonlinearity for a terahertz wave. Specifically, the antenna 500a has two active layers and has a semiconductor layer 515a1 including the RTD 501a1 and a semiconductor layer 515a2 including the RTD 501a2. The antenna 500a is designed to oscillate at an oscillatory frequency of f THz even alone. In FIG. 11B, the RTD 501a1, the RTD 501a2, the conductor layer 503a, a bias line 511a, and the conductor layer 509a desirably have a configuration symmetric in the right and left direction and in the up and down direction with respect to the center of the antenna 500a. Here, the right and left direction and the up and down direction mean the X direction and the Y direction in FIGS. 11A and 11B.

The capacitor 530a has a resistor 5212, a conductor layer 5224 that is a component of an MIM capacitor, a line 508a2, and a conductor layer 507a2. The capacitor 530ad has a resistor 5211, a conductor layer 5223 that is a component of an MIM capacitor, a line 508a1, and a via 507a1. An opening 505a and an opening 505ad are openings disposed in the conductor layer. The conductor layer includes the bias line 511a, the line 508a1, and the line 508a2. Hereinafter, the lines and the via may be regarded as the conductor layer.

The capacitor 532a has a conductor layer 5221, a conductor layer 5071, a resistor 5191, a resistor 5192, and a conductor layer 5072. The capacitor 531ab has at least a conductor layer 5222, a resistor 5193, and a resistor 5194. Here, the conductor layer 5071 and a conductor layer 5082 may also be regarded as vias.

In FIG. 11B, the conductor layer 5091ad is partially shown. The conductor layer 5091ad has a resistor 5511 and a resistor 5233. The conductor layer 5091ad further has another portion. The other portion is configured such that the portion shown in the drawing is disposed on the antenna 500d side line-symmetrically with respect to the resistor 5511. The conductor layer 5091a has a resistor 5512 and a resistor 5234. The conductor layer 5091ad is coupled to the capacitor 531ab via the resistor 5233, and the conductor layer 5091a is coupled to the capacitor 531ab via the resistor 5234.

Similarly, in FIG. 11B, the conductor layer 5092ad is partially shown. The conductor layer 5092ad has a resistor 5513 and a resistor 5231. The conductor layer 5092ad further has another portion. The other portion is configured such that the portion shown in the drawing is disposed on the antenna 500d side line-symmetrically with respect to the resistor 5513. The conductor layer 5092a has a resistor 5514 and a resistor 5232. The conductor layer 5092ad is coupled to the capacitor 532a via the resistor 5231, and the conductor layer 5092a is coupled to the capacitor 532a via the resistor 5232.

As shown in FIG. 11B, the arrangement of elements of the antenna 500a is highly symmetric. The arrangement of elements coupled to the antenna 500a is also highly symmetric. With such a configuration, a decrease in radiation power is suppressed.

FIG. 11C is a partially enlarged view of coupling lines and capacitors of the antenna 500a shown in FIG. 11B. Part of the conductor layer 509ab, the conductor layer 5091a, and part of the conductor layer 5091ad are shown. The conductor layer 5093a, the conductor layer 5092a, and part of the conductor layer 5092ad are shown. The length of part of the conductor layer 509ab is made equal to the length of the conductor layer 5093a, the length of the conductor layer 5091a is made equal to the length of part of the conductor layer 5091ad, and the length of the conductor layer 5092a is made equal to the length of part of the conductor layer 5092ad. The length of the conductor layer 5091a is made equal to the length of the conductor layer 5092a, and the length of part of the conductor layer 5091ad is made equal to the length of part of the conductor layer 5092ad. With such a configuration, the symmetry of the antenna 500a is improved.

A cross-sectional structure corresponding to FIG. 11B will be described with reference to FIGS. 12A to 12C. FIG. 12A is a schematic cross-sectional view taken along the line XIIA-XIIA in FIG. 11B. FIG. 12B is a schematic cross-sectional view taken along the line XIIB-XIIB in FIG. 11B. FIG. 12C is a schematic cross-sectional view taken along the line XIIC-XIIC in FIG. 11B.

As shown in FIG. 12A, the element 50 includes a substrate 513, a conductor layer 506, the conductor layer 5222, the conductor layer 5221, the conductor layer 503a, the conductor layer 509ab, and the conductor layer 5093a. The element 50 has the semiconductor layer 515a1 including the RTD 501a1, the semiconductor layer 515a2 including the RTD 501a2, a conductor layer 516a1, a conductor layer 516a2, a conductor layer 517a1, a conductor layer 517a2, and a conductor layer 514. The element 50 has a dielectric 5043, a dielectric 5042, a dielectric 501, and a dielectric 5044. The conductor layer 517a1, the conductor layer 517a2, and the conductor layer 514 may also be regarded as vias or plugs. The conductor layer 506, for example, supplies a ground or grounding voltage.

The conductor layer 509ab makes up a coupling line together with the conductor layer 506 and a dielectric between the conductor layer 509ab and the conductor layer 506. The conductor layer 5093a makes up a coupling line together with the conductor layer 506 and a dielectric between the conductor layer 5093a and the conductor layer 506. The conductor layer 503a together with the conductor layer 506, a dielectric between the conductor layer 503a and the conductor layer 506, the RTD 501a1, and the RTD 501a2 functions as a resonator. The conductor layer 5222 makes up the capacitor 531ab together with the conductor layer 506 and a dielectric between the conductor layer 5222 and the conductor layer 506. The conductor layer 5221 makes up the capacitor 532a together with the conductor layer 506 and a dielectric between the conductor layer 5221 and the conductor layer 506. The conductor layer 509ab and the conductor layer 503a are disposed so as to overlap in the Z direction, and the length of the overlapping part is L1. The conductor layer 5093a and the conductor layer 503a are disposed so as to overlap in the Z direction, and the length of the overlapping part is L2. In other words, two coupling lines and one antenna are coupled to each other. The conductor layer 509ab and the capacitor 531ab are connected, and the conductor layer 5093a and the capacitor 532a are connected.

Connection will be described with reference to FIG. 12C. Like reference signs denote components similar to those of FIG. 12A in FIG. 12C, and the description is omitted. As shown in FIG. 12C, the element 50 has the resistor 5191, the resistor 5192, the conductor layer 5071, the conductor layer 5072, the conductor layer 514, and the conductor layer 5093a. The conductor layer 5093a is connected to the capacitor 532a via the conductor 514. The conductor layer 5093a is connected in series with the conductor layer 514, the resistor 5191, the conductor layer 5071, and the conductor layer 5221. The conductor layer 5093a is connected in series with the conductor layer 514, the resistor 5192, the conductor layer 5072, and the conductor layer 5221. The conductor layer 5071, the conductor layer 5072, and the conductor layer 514 are also referred to as vias, plugs, or the like.

Like reference signs denote components similar to those of FIGS. 12A and 12C in FIG. 12B, and the description is omitted. The element 50 has the conductor layer 507a1, the conductor layer 507a2, the conductor layer 508a1, the conductor layer 508a2, the conductor layer 511a, a conductor layer 512, the conductor layer 5223, and the conductor layer 5224. The element 50 has a resistor 5211 and a resistor 5212. The conductor layer 507a1, the conductor layer 507a2, and the conductor layer 512 are also referred to as vias or plugs. The conductor layer 503a is connected to the conductor layer 5223 via the conductor layer 507a1, the conductor layer 508a1, the resistor 5211, and the conductor layer 512. In other words, the conductor layer 503a is connected to the capacitor 530ad. The conductor layer 503a is connected to the conductor layer 5224 via the conductor layer 507a2, the conductor layer 508a2, the resistor 5212, and the conductor layer 512. In other words, the conductor layer 503a is connected to the capacitor 530a. Here, in two areas, the conductor layer 511 is disposed apart from the conductor layer 512. The conductor layer 511a is connected to at least one of the conductor layer 508a1 and the conductor layer 508a2 at least on the near side of the sheet and the far side of the sheet. The near side of the sheet and the far side of the sheet are locations in the X direction. In other words, in a cross section including the Y direction and the Z direction, the conductor layer 511a has an opening 505ad and an opening 505a.

The above-described conductor layers have different distances from the top surface of the substrate 513. For example, the configuration of a relevant part of FIGS. 12A to 12C is as follows. A first layer includes the conductor layer 506. A second layer includes the conductor layer 5221, the conductor layer 5222, the conductor layer 5223, and the conductor layer 5224. A third layer includes the conductor layer 512, the conductor layer 5071, and the conductor layer 5072. A fourth layer includes the conductor layer 508a1, the conductor layer 508a2, the conductor layer 5191, the conductor layer 5192, and the conductor layer 511a. A fifth layer includes the conductor layer 508a1, the conductor layer 508a2, the conductor layer 5191, the conductor layer 5192, and the conductor layer 511a. A sixth layer includes the conductor layer 507a1 and the conductor layer 507a2. A seventh layer includes the conductor layer 503a. An eighth layer includes the conductor layer 514. A ninth layer includes the conductor layer 509ab and the conductor layer 5093a. The locations of the components can be changed by selecting an optional manufacturing method.

In FIGS. 12A to 12C, the conductor layer 506 is provided in common to the components including the capacitors, the coupling lines, and the like. The conductor layer 506 is a single conductor layer capacitor disposed over the entire surface of the element 50. With the thus configured conductor layer 506, fluctuations in voltage to be supplied are reduced.

The configuration of the element 50 will be further described with reference to FIGS. 11A to 12C. As described above, the plurality of coupling lines has a microstrip structure. Each of the coupling lines is made up of one conductor layer, a dielectric, and another conductor layer.

Each of the coupling lines is, for example, a microstrip line having such a structure that a dielectric 504 and the dielectric 5044 are sandwiched by the conductor layer 509a, the conductor layer 509ab, the conductor layer 5093a, the conductor layer 5091ad, the conductor layer 5091a, the conductor layer 5092ad, and the conductor layer 5092a and the conductor layer 506 and the conductor layer 511a. The conductor layer 511a may also be regarded as a bias line that operates as a grounding conductor at f THz. The antenna 500a is made up of a patch antenna and a microstrip line connected to the patch antenna and is designed to oscillate at an oscillatory frequency of f THz even alone. The conductor layer 506 may be regarded as a first conductor layer.

The patch antenna of the antenna 500a is coupled to the conductor layer 509a by AC coupling (capacitive coupling). For example, as shown in FIGS. 11B and 12A, the conductor layer 503a of the antenna 500a and the conductor layer of the conductor layer 509ab overlap each other with an insulator interposed therebetween around a radiation end of the antenna 500a in plan view. The overlapping length is L1. The length L1 is assumed as, for example, 5 μm. A portion where the conductor layers overlap each other is a capacitor structure of metal-insulator-metal (MIM), laminated in order of the conductor layer 503a, the dielectric layer 5044, and the conductor layer 509ab. A capacitance value is, for example, 20 fF. The conductor layer 503a and the conductor layer 509ab are open at DC and in a low-frequency range lower than f THz (lower than or equal to 10 GHz), and isolation between the antennas is ensured. On the other hand, in a band of the oscillatory frequency f THz, the coupling strength between the antennas is adjusted by adjusting impedance with a capacitor. The same also applies to the other conductor layer 5091ad, conductor layer 5091a, conductor layer 5092ad, conductor layer 5092a, and conductor layer 5093a.

As shown in FIG. 11B, in the antenna 500a, the coupling line is branched into three upward, rightward, and leftward directions at each radiation end, and the branched coupling lines, respectively, are connected to six conductor layers independently. The six conductor layers are the conductor layer 5091ad, the conductor layer 5091a, the conductor layer 5092ad, the conductor layer 5092a, the conductor layer 509ab, and the conductor layer 5093a. Therefore, two antennas and one coupling line are connected in a one-to-one-to-one relationship. Such a configuration allows to adjust the length and the width of a set made up of two antennas and one coupling line separately and independently, so it is suitable at the time of separately adjusting the electrical length and impedance between any adjacent two of the antennas in the antenna array. Therefore, vertical and horizontal coupling lines are allowed to be separately adjusted, so the flexibility of design improves. As shown in FIG. 11C, a connecting portion of the conductor layer 509a at the radiation end of the antenna is presumably configured such that a plurality of coupling lines merges and connects at one point or configured such that the amount of coupling is increased by increasing the area of the connecting portion in the antenna. A configuration may be selected as needed according to usage.

The width of the conductor layer 509a is a parameter to adjust the impedance of a microstrip line and is designed from the viewpoint of matching with the antenna 500a and a reduction of transmission losses. The length of the conductor layer 509a is preferably designed such that the electrical length between the RTDs respectively located at the same locations in adjacent antennas becomes an integer multiple of $2\pi$. In the case of the antenna 500a, the conductor layer 509ab extending in the X direction has such a length that the electrical length between the RTD 501a1 and the RTD 501b1 becomes $2\pi$. Therefore, part of the conductor layer 509ab shown in FIG. 11C is set to a length that is half the conductor layer 509ab (electrical length $\pi$). Part of the conductor layer 509ab and the conductor layer 5093a are set to the same length. Similarly, part of the conductor layer 5091ad extending in the Y direction and the conductor layer 5092ad is set to a length that is half the length that is the electrical length $4\pi$ between the RTD 501a1 and the RTD 501d1 and between the RTD 501a2 and the RTD 501d2, that is, a length with which the electrical length becomes $2\pi$. The conductor layer 5091a can be set to a length of at least any one of ½ of the conductor layer 5091ad and ½ of the conductor layer 5092ad. The conductor layer 5092a can be set to a length of at least any one of ½ of the conductor layer 5091ad and ½ of the conductor layer 5092ad.

The conductor layer 509a includes a shunt component connected to the node of the resonant electric field having an oscillatory frequency of f THz in order to stabilize the mode. As shown in FIG. 11C, the conductor layer 509a and the shunt component are connected to each other via the via 514. The shunt component has a resistor and a capacitor. The shunt component is, for example, a snubber circuit. The resistor 5191, the resistor 5192, the resistor 5231, the resistor 5232, and the capacitor 532a are connected in series. The resistor 5193, the resistor 5194, the resistor 5233, the resistor 5234, and the capacitor 531ab are connected in series. The resistor has, for example, 20Ω and is made of a thin film, such as TiW. The capacitor has, for example, 20 pF and is an MIM capacitor. The capacitor 532a has such a capacitive structure that the dielectric 5043 is sandwiched by the conductor layer 5221 and the conductor layer 506. The capacitor 531ab has such a capacitive structure that the dielectric 5043 is sandwiched by the conductor layer 5222 and the conductor layer 506. Thus, it is possible to suppress multi-mode oscillation in the antenna array by performing AC short circuit of radio frequency other than the oscillatory frequency f THz to provide low impedance. In the conductor layer 509a, the resistor 5511, the resistor 5512, the resistor 5513, and the resistor 5514, respectively, are connected at the locations of the nodes of the resonant electric field having an oscillatory frequency of f THz. These resistors each have, for example, a resistance value of 20Ω and each are made of a TiW thin film. Thus, the mode is stabilized by losing frequencies other than the oscillatory frequency f THz and components of phase difference.

These components disposed at the nodes and antinodes of the resonant electric field having an oscillatory frequency of f THz also serve as electrical terminals at the end of the conductor layer 509a of the antenna 500a that is a unit antenna. For example, a case where no antenna is connected in the up and down direction (X direction) to the antenna 500a will be described. An end of the conductor layer 509ab on a side not connected to the conductor layer 503a is an open end. In addition, an end of the conductor layer 5093a on a side not connected to the conductor layer 503a is an open end. When there is an open end, resonant characteristics can be influenced. As in the case of the antenna 500a, by AC short-circuiting the end with the shunt component connected at the node of the resonant electric field having f THz for termination, unnecessary reflection and phase mismatching are reduced, with the result that resonance at the frequency f THz becomes stable. This also applies to a case where no antenna is connected in the right and left direction (Y direction). Resistors respectively connected to the ends of the conductor layer 5091*ad*, the conductor layer 5091*a*, the conductor layer 5092*ad*, and the conductor layer 5092*a* serve as terminals to adjust impedance. The resistors are located at the nodes of the resonant electric field having an oscillatory frequency of f THz. The present embodiment can be a configuration suitable for at least one of stabilization of oscillation, enhancement of phase-locking, and adjustment of radiation pattern by electrically terminating the coupling lines at the single antennas and the array end to reduce the influence at the end.

Next, a bias line for supplying electric power to the RTD 501*a*1 and the RTD 501*a*2 will be described. The bias line is the conductor layer 511. In the antenna 500*a*, the bias line is also configured to be symmetric in the up and down direction and in the right and left direction of the sheet with respect to the center (center of gravity) of the antenna 500*a*. The up and down direction and the right and left direction of the sheet are the X direction and the Y direction. The conductor layer 507*a*1 and the conductor layer 507*a*2 connected at the nodes of the resonant electric field having f THz of the conductor layer 503*a* are connected to the conductor layer 511*a* that is a common wiring line by way of the line 508*a*1 and the line 508*a*2. Each of the line 508*a*1 and the line 508*a*2 has a pencil-like tapered shape such that a wiring line width at the connecting portion with a corresponding one of the conductor layer 507*a*1 and the conductor layer 507*a*2 is narrow and the wiring line width of each of the lines 508*a*1, 508*a*2 widens as it approaches the conductor layer 511*a* that is a common wiring line. The narrow part of the wiring line width has a length of less than or equal to λTHz/10. When the connection width of each of the conductor layer 507*a*1 and the conductor layer 507*a*2 is narrow, interference between the bias line and the resonant electric field having f THz in the antenna and losses are reduced. Since the wiring line width gradually widens, wiring resistance from DC to the low-frequency band (<100 MHz) is reduced, so variations in the operation voltage of each antenna are suppressed. Such a wiring structure achieves both suppressing operation voltage variations resulting from a reduction in wiring resistance in a low-frequency band and suppressing interference and losses in the antenna array at f THz, so the wiring structure is a suitable configuration for stable operation of mutual injection-locking of the antenna array. The line 508*a*1 and the line 508*a*2 are connected to the snubber circuit. The snubber circuit has such a configuration that the resistor 5211 and the conductor layer 5223 of the capacitor 530*a* are connected in series. The snubber circuit has such a configuration that the resistor 5212 and the conductor layer 5224 of the capacitor 530*ad* are connected in series. The resistor 5211 and the resistor 5212 each have, for example, 15Ω and each are made of a TiW thin film. The capacitor 530*ad* is made up of the conductor layer 5223, the conductor layer 506, and the dielectric 5043 therebetween. The capacitor 530*a* is made up of the conductor layer 5224, the conductor layer 506, and the dielectric 5043 therebetween. The capacitance values of the capacitor 530*a* and capacitor 530*ad* each are, for example, 10 pF. With the snubber circuit, the conductor layer 511*a* close to the RTD, the line 508*a*1, and the line 508*a*2 are AC short-circuited in a frequency band lower than or equal to 100 GHz and have low impedance. Therefore, parasitic oscillation lower than or equal to 100 GHz due to the inductance of the bias line can be reduced.

FIG. 11B is an antenna array in which the antenna 500*a* that is a unit antenna is arranged in 3 by 3 at a constant pitch of 0.6 wavelength and the adjacent antennas are connected by a coupling line. By connecting the coupling line, the RTD 501*a*1 and the RTD 501*a*2 of each antenna are subjected to mutual injection-locking in phase. All the adjacent conductor layers 511*a* are also connected to form the common conductor layer 511, that is, the common bias line. With the common bias line, a bias signal can be supplied from the common power supply to the RTDs of the antennas. At this time, preferably, the snubber circuit for adjacent antennas is connected to maintain the symmetry. For example, for the antenna 500*a* and the antenna 500*d*, the snubber circuit 530*ad* is connected to improve symmetry. The snubber circuit 530*ad* is made up of a resistor and an MIM capacitor. The snubber circuit 530*ad* is connected for each antenna and connected to the common conductor layer 511. The snubber circuit 530*ad* is disposed between the adjacent antennas. As in the case of the snubber circuit 530*ad*, to increase the degree of integration caused by reducing component layout, a capacitor may be shared between adjacent antennas. The common conductor layer 511 of the antenna array is AC short-circuited in a frequency band lower than or equal to 100 GHz with the snubber circuit disposed for each antenna including the snubber circuit 530*ad* to provide low impedance, with the result that low-frequency oscillation between the antennas is suppressed. In other words, at least one snubber circuit is connected to the plurality of antennas.

The antenna 500*e* is joined with each of the four different antenna 500*f*, antenna 500*d*, antenna 500*h*, and antenna 500*b* in the up and down direction and in the right and left direction via the coupling lines. The antenna 500*e* and each of the antenna 500*f* and the antenna 500*d* arranged in the up and down direction are connected in a one-to-one correspondence by an independent coupling line. The antenna 500*e* and each of the antenna 500*h* and the antenna 500*b* arranged in the right and left direction are connected in a one-to-one correspondence by two independent coupling lines. In other words, the antenna 500*e* is connected to the six coupling lines in total. The coupling line 5091*eb* extending from the antenna 500*e* is connected to the adjacent antenna 500*b* without branching. In this way, with the antenna array in which unit antennas each having antenna components and coupling lines disposed symmetrically are arranged regularly, a large-scale M by N array (M and N are the number of antennas and are natural numbers) can be efficiently designed with high accuracy through approximation by using the impedance of the unit antenna as a base. Since the coupling lines are routed in both the vertical direction (X direction) and the horizontal direction (Y direction), mutual injection-locking between adjacent antennas is enhanced, so directivity control through synchronization of the antenna array is easy.

FIG. 11D is a schematic plan view that shows a modification of the present embodiment. An element 51 and an element 52 each represent the upper part of the antenna 500*a* of FIG. 11B in the X direction. In other words, the element 51 and the element 52 each represent a coupling portion among the conductor layer 503*a*, the coupling line 5091*ad*, the coupling line 509*ab*, and the coupling line 5091*a*. The ends of the three coupling lines are disposed apart from one another in FIG. 11B; whereas, in the element 51, the ends of the three coupling lines are integrated. In other words, one coupling line coupled to the antenna 500*a* may be regarded as branching off into two or more, for example, three. In the element 52, portions branched into three are spaced apart from one another as compared to the element 51. In other words, the ends of the three coupling lines in FIG. 11B may be regarded as being connected by another conductor layer extending in the Y direction.

In each of the element 51 and the element 52, one coupling line may be regarded as being provided inside an outer edge of an antenna to be coupled and may be regarded as being branched into three coupling lines outside the outer edge in plan view. The configuration of each of the element 51 and the element 52 may be regarded that, for example, the antenna and the three coupling lines are connected at one connecting point. In FIG. 11B, in plan view, the three coupling lines are provided inside the outer edge of the antenna to be coupled, and the coupling lines are disposed apart from one another. In other words, in FIG. 11B, the antenna and the three coupling lines may be regarded as being connected at three connecting points. Here, a connecting point may be a coupling point, and connection may be coupling. With such a configuration, the three coupling lines can be synchronized.

Regarding the layout of the antenna array of FIG. 11A, M by N is not limited to 3 by 3 and may be extended to an antenna array of 4 by 4, 5 by 5, or the like.

Seventh Embodiment

Figure 13A:
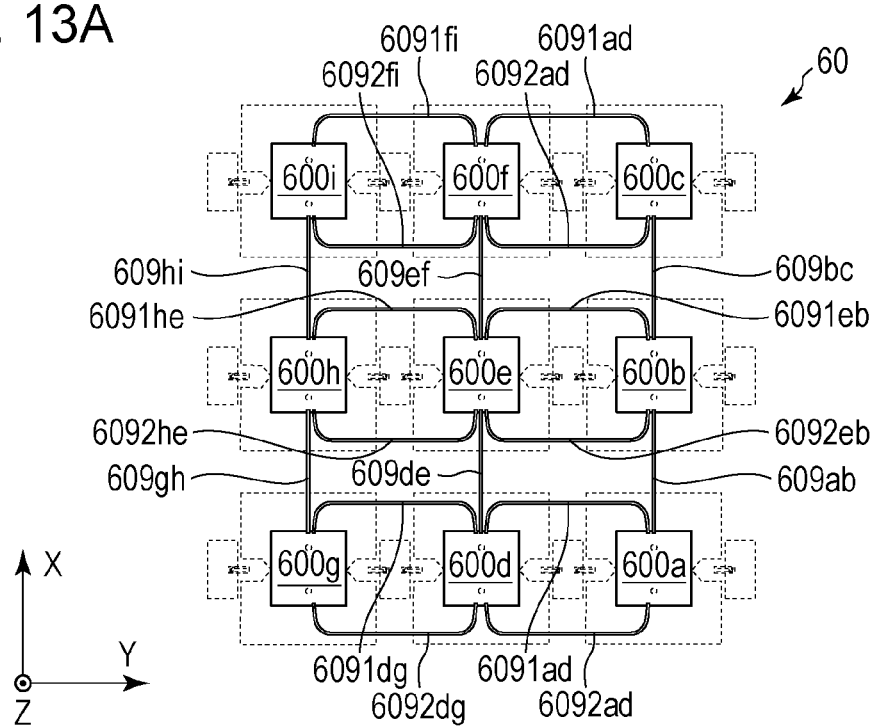
FIG. 13A is a top schematic diagram that shows an element 60 according to a seventh embodiment.

FIG. 13A is a top view of an element 60 according to a modification of the sixth embodiment. Components other than components assigned with reference signs are equivalent to the components shown in FIG. 11A.

In FIG. 13A, there are two or more connectable adjacent antennas in the up and down direction (X direction) and two or more connectable adjacent antennas in the right and left direction (Y direction) for an antenna 600e at the center of the antenna array, so the antenna 600e is connected to each of the adjacent antennas by a corresponding one of coupling lines 609ef, 609df, 6091he, 6092he, 6091eb, 6092eb extending in the right and left direction and in the up and down direction. The configuration of the antenna 600e is similar to the antenna 500e shown in FIG. 11A. On the other hand, antennas 600a to 600d, 600f to 600i at an array end have no coupling line in a direction in which no adjacent antenna is disposed. The length and impedance of each of the coupling lines of the element 60 can be adjusted such that the oscillatory frequency f THz is stably synchronized even when there are no coupling lines disposed at the nodes or the antinodes. Therefore, even when the number of coupling lines in each antenna is reduced, fluctuations in the resonant characteristics of the frequency f THz are reduced. In the element 60, for example, at an upper end and lower end of the antenna, adjacent two antennas and a coupling line are connected in a one-to-one-to-one relationship and are separately and independently connected. The upper end and the lower end of the antenna are ends of the antenna in the X direction. Thus, unnecessary coupling lines can be omitted without changing the resonant characteristics at f THz. In the element 60, for example, at the right end and left end of the antenna, adjacent two antennas and the coupling lines are connected in a one-to-two-to-one relationship. The right end and the left end of the antenna are antenna ends in the Y direction.

In the antennas disposed at the outer periphery of the antenna array, the end of each coupling line is coupled to any one of the nine antennas since no coupling line is disposed on the outer peripheral side of the antenna array. With the THz band microstrip line structure, conductor losses due to a skin effect and dielectric losses due to an increase in tan δ occur, with the result that losses resulting from electric power transmission can increase. Thus, losses increase as the electric power transmission for coupling increases, so a trade-off relationship can occur between synchronization and losses. With the configuration according to the present embodiment, coupling lines that do not contribute to coupling are allowed to be reduced, so losses are reduced. It is possible to achieve both directivity control through injection-locking and an increase in front gain resulting from a reduction in transmission loss. By eliminating the open end of each coupling line, integration of the above-described termination components becomes unnecessary. Thus, it is possible to reduce variations in characteristics due to a manufacturing error and reduce manufacturing cost.

Figure 13B:
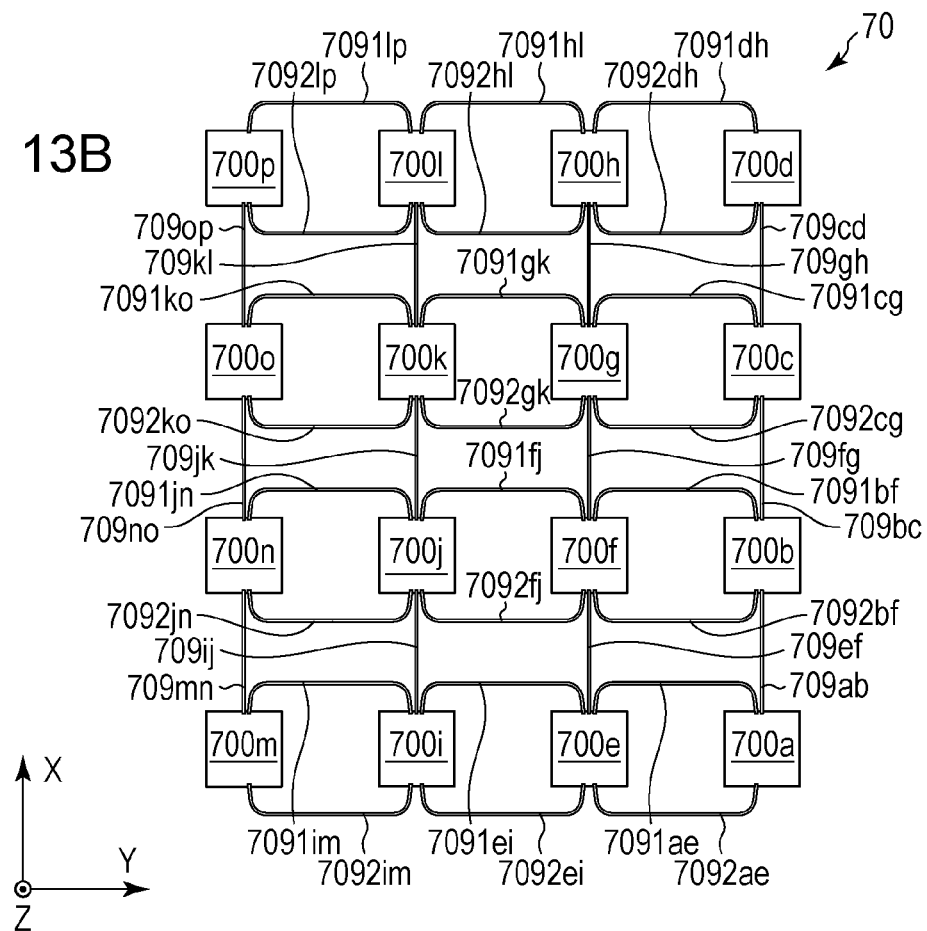
FIG. 13B is a top schematic diagram that shows an element 70 according to the seventh embodiment.

FIG. 13B is an enlarged top schematic diagram of an element 70 of which the layout of the antenna array of the element 60 is extended to a 4 by 4 array. FIG. 13B shows only conductor layers that make up the antennas of FIG. 13A and conductor layers that make up coupling lines. By using a unit antenna made up of a highly symmetric antenna and coupling lines as shown in FIG. 13A, an antenna array can be extended to an M by N array (M and N are natural numbers) regardless of an odd number or an even number with the same design rule as that of a low-order antenna array. Here, it is assumed that the center of gravity of the antenna array is indicated by point O.

In FIG. 13B, the element 70 has an antenna 700a to an antenna 700p. In the element 70, the plurality of antennas are coupled by coupling lines 709, coupling lines 7091, and coupling lines 7092 as shown in FIG. 13A. With such a configuration as well, losses are reduced while the antennas are synchronized.

Eighth Embodiment

In the present embodiment, modifications of the element 70, which are modifications of the seventh embodiment, will be described. FIGS. 14A to 20B show modifications of the coupling lines of the element 70 shown in FIG. 13B. FIGS. 14A to 20B each show only conductor layers that make up antennas and conductor layers that make up coupling lines as in the case of FIG. 13B.

FIGS. 14A to 15B are configurations in which the number of coupling lines provided in the Y direction is changed as compared to the element 70. With such a configuration, it is possible to perform injection-locking due to coupling among the antennas and reduce transmission losses. A reduction of transmission losses increases radiation power.

Figure 14A:
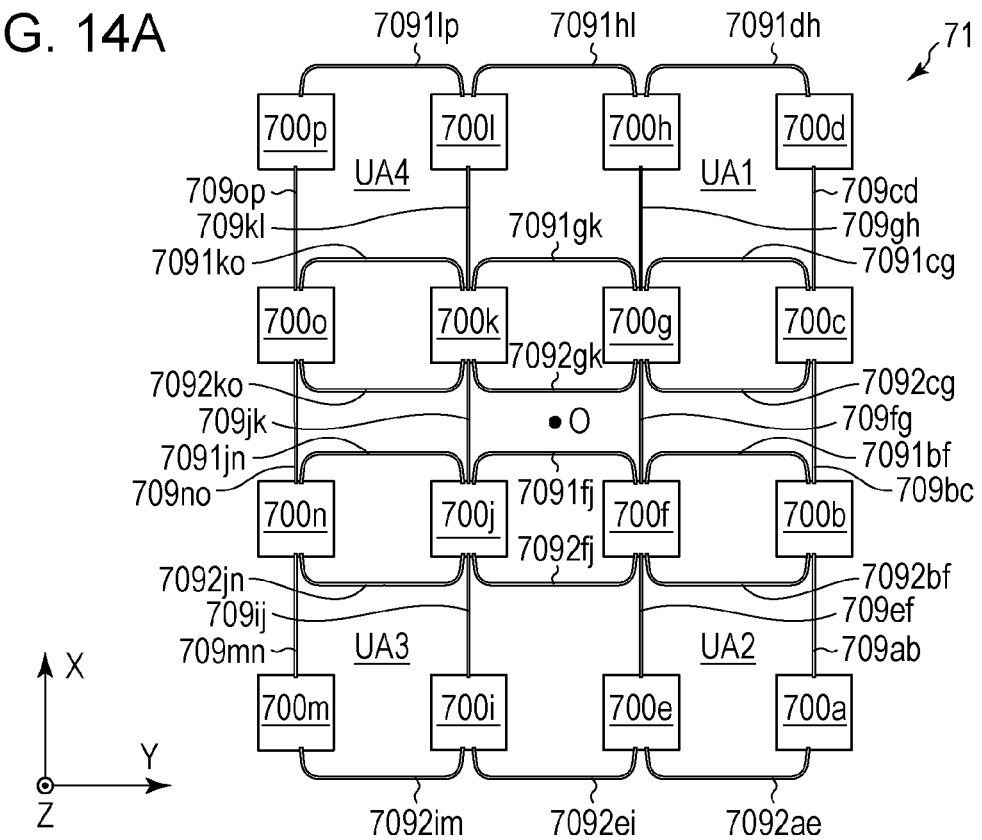
FIG. 14A is a top schematic diagram that shows an element according to an eighth embodiment.

FIG. 14A is a top schematic diagram that shows an element 71. Six coupling lines extending in the Y direction are reduced from the element 70. Specifically, a coupling line 7092dh, a coupling line 7092hl, a coupling line 70921p, a coupling line 7091ae, a coupling line 7091ei, and a coupling line 7091im of the element 70 are not disposed in the element 71. When it is assumed that a unit array is a 2 by 2 array, a unit array UA1 includes an antenna 700d, an antenna 700c, an antenna 700g, and an antenna 700h. The antenna 700d, the antenna 700c, the antenna 700g, and the antenna 700h are coupled annularly by a coupling line 7091dh, a coupling line 709cd, a coupling line 7092cg, and a coupling line 709gh. In addition, the antenna 700c and the antenna 700g are coupled annularly by a coupling line 7091cg. A unit array UA2 includes an antenna 700a, an antenna 700b, an antenna 700e, and an antenna 700f. The antenna 700a, the antenna 700b, the antenna 700e, and the antenna 700f are coupled annularly by a coupling line 7091bf, a coupling line 709ab, a coupling line 7092ae, and a coupling line 709ef. In addition, the antenna 700f and the antenna 700b are coupled annularly by a coupling line 7092bf. The arrangement of the antennas and coupling lines of the unit array UA1 and the arrangement of the antennas and coupling lines of the unit array UA2 may be regarded as mirror symmetry arrangement. The same applies to the other unit arrays, so the antenna array has high symmetry.

Figure 14B:
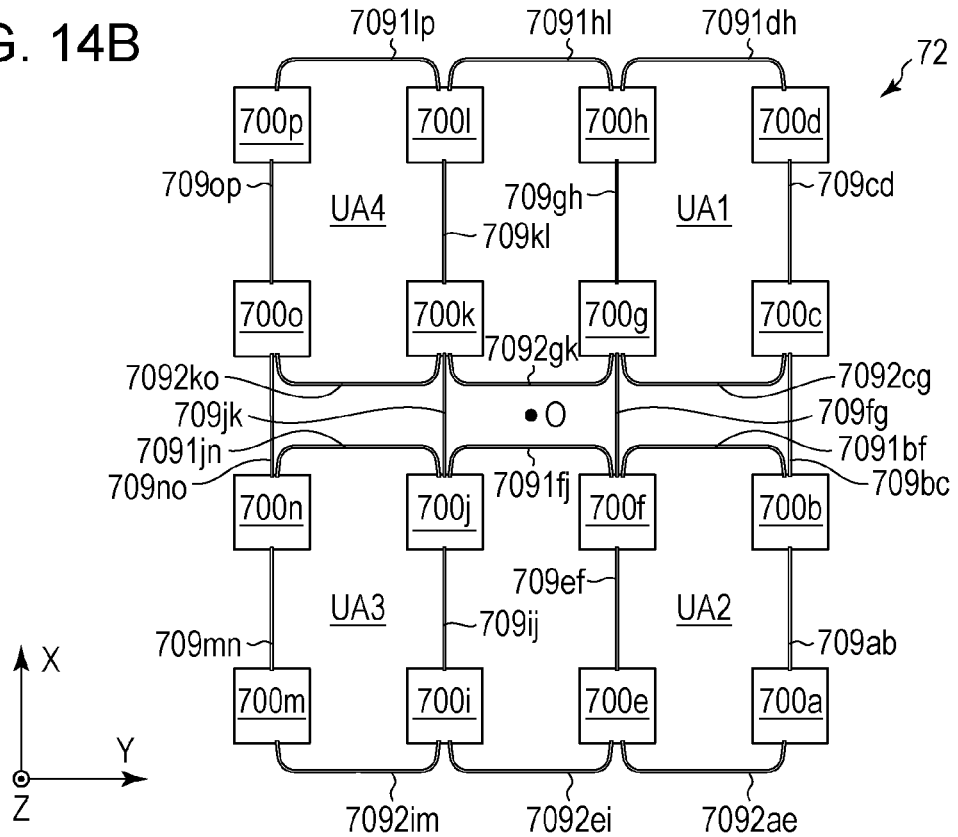
FIG. 14B is a top schematic diagram that shows an element according to the eighth embodiment.

FIG. 14B is a top schematic diagram that shows an element 72. Six coupling lines extending in the Y direction are further reduced from the element 71. Specifically, the coupling line 7092bf, a coupling line 7092fj, a coupling line 7092jn, the coupling line 7091cg, a coupling line 7091gk, and a coupling line 7091ko of the element 71 are not disposed in the element 72. When it is assumed that a unit array is a 2 by 2 array, a unit array UA1 includes the antenna 700d, the antenna 700c, the antenna 700g, and the antenna 700h. The antenna 700d, the antenna 700c, the antenna 700g, and the antenna 700h are coupled annularly by the coupling lines. The antenna 700h, the antenna 700g, the antenna 700k, and the antenna 700l are coupled annularly by the coupling lines. The antenna 700l, the antenna 700k, the antenna 700o, and the antenna 700p are coupled annularly by the coupling lines. The same applies to the other unit arrays, so the antenna array has high symmetry.

Figure 15A:
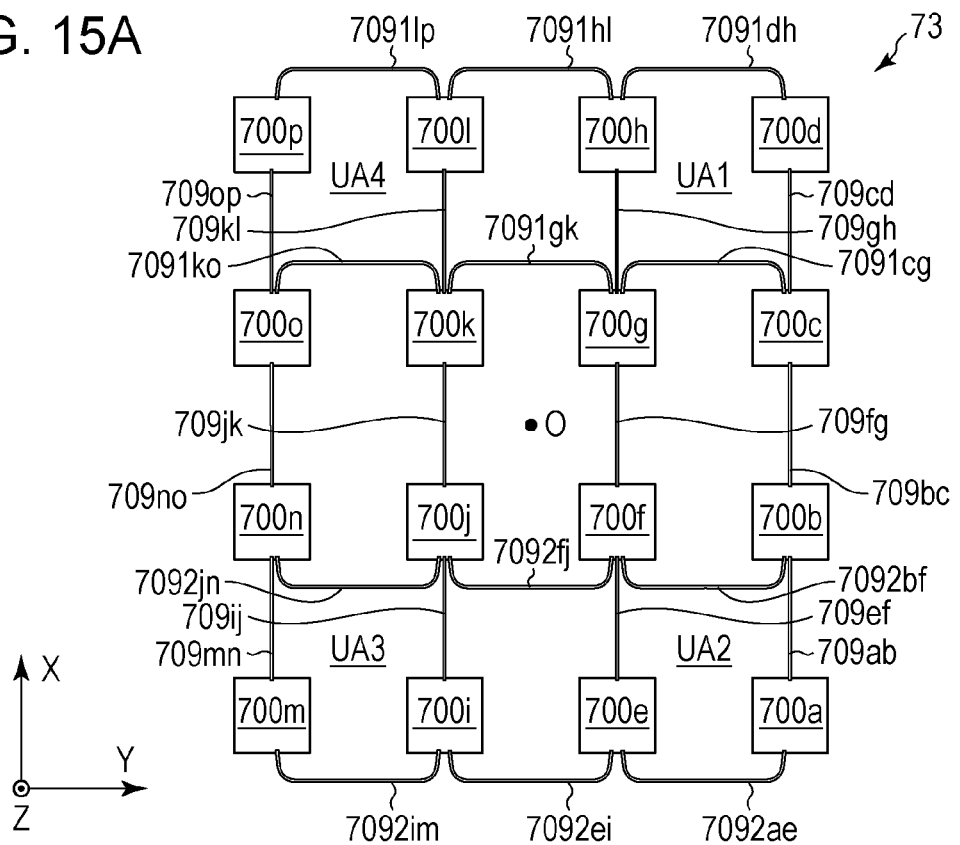
FIG. 15A is a top schematic diagram that shows an element according to the eighth embodiment.

FIG. 15A is a top schematic diagram that shows an element 73. Six coupling lines extending in the Y direction are further reduced from the element 71. Specifically, the coupling line 7092cg, a coupling line 7092gk, a coupling line 7092ko, the coupling line 7091bf, a coupling line 7091fj, and a coupling line 7091jn of the element 71 are not disposed in the element 73. When it is assumed that a unit array is a 2 by 2 array, a unit array UA1 includes the antenna 700d, the antenna 700c, the antenna 700g, and the antenna 700h. The antenna 700d and the antenna 700c are coupled by the coupling line 709cd, and the antenna 700g and the antenna 700h are coupled by a coupling line 709fh. The antenna 700c and the antenna 700g are coupled by the coupling line 7091cg, and the antenna 700h and the antenna 700d are coupled by the coupling line 7091dh. A unit array UA2 includes the antenna 700a, the antenna 700b, the antenna 700e, and the antenna 700f. The antenna 700a and the antenna 700b are coupled by the coupling line 709ab, and the antenna 700e and the antenna 700f are coupled by the coupling line 709ef. The antenna 700a and the antenna 700e are coupled by the coupling line 7092ae, and the antenna 700b and the antenna 700f are coupled by the coupling line 7092bf. The arrangement of the antennas and coupling lines of the unit array UA1 and the arrangement of the antennas and coupling lines of the unit array UA2 may be regarded as mirror symmetry arrangement. The same applies to the other unit arrays, so the antenna array has high symmetry.

Figure 15B:
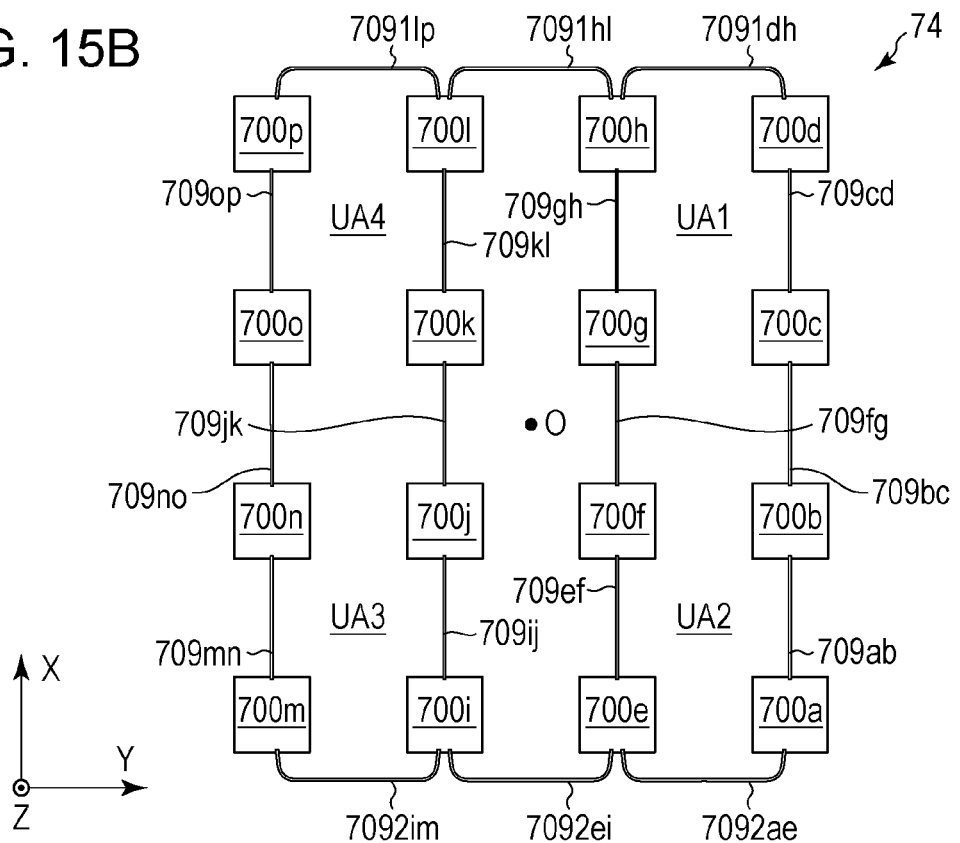
FIG. 15B is a top schematic diagram that shows an element according to the eighth embodiment.

FIG. 15B is a top schematic diagram that shows an element 74. Six coupling lines extending in the Y direction are further reduced from the element 73. Specifically, the coupling line 7092bf, a coupling line 7092fj, a coupling line 7092jn, the coupling line 7091cg, a coupling line 7091gk, and a coupling line 7091ko of the element 73 are not disposed in the element 74. With the element 74 as well, unit arrays may be defined as in the case of the other examples. The arrangement of the antennas and coupling lines of the unit array UA1 and the arrangement of the antennas and coupling lines of the unit array UA2 may be regarded as mirror symmetry arrangement. The same applies to the other unit arrays, so the antenna array has high symmetry.

For example, FIG. 15A shows an arrangement with which synchronization and losses are balanced by disposing coupling lines in the same number in the X direction and in the Y direction and reducing a difference in the number of coupling lines connected to the antennas at the end and the antennas at the center of the antenna array. In FIGS. 14A to 15B, when the center of gravity of the antenna array is taken, the arrangement of the antenna array and the coupling lines can be symmetric.

FIGS. 16A to 18A are further modifications. These modifications can be implemented by extending the design rule of a unit array to an M by N array (both M and N are even numbers). Among the modifications, there is a configuration in which one antenna is in charge of coupling between unit arrays, for example, FIGS. 16A, 17A, 18A, and the like. With such a configuration, since the number of coupling lines that contribute to coupling is reduced, it is possible to reduce variations in synchronization between at the end and at the center of the array.

Figure 16A:
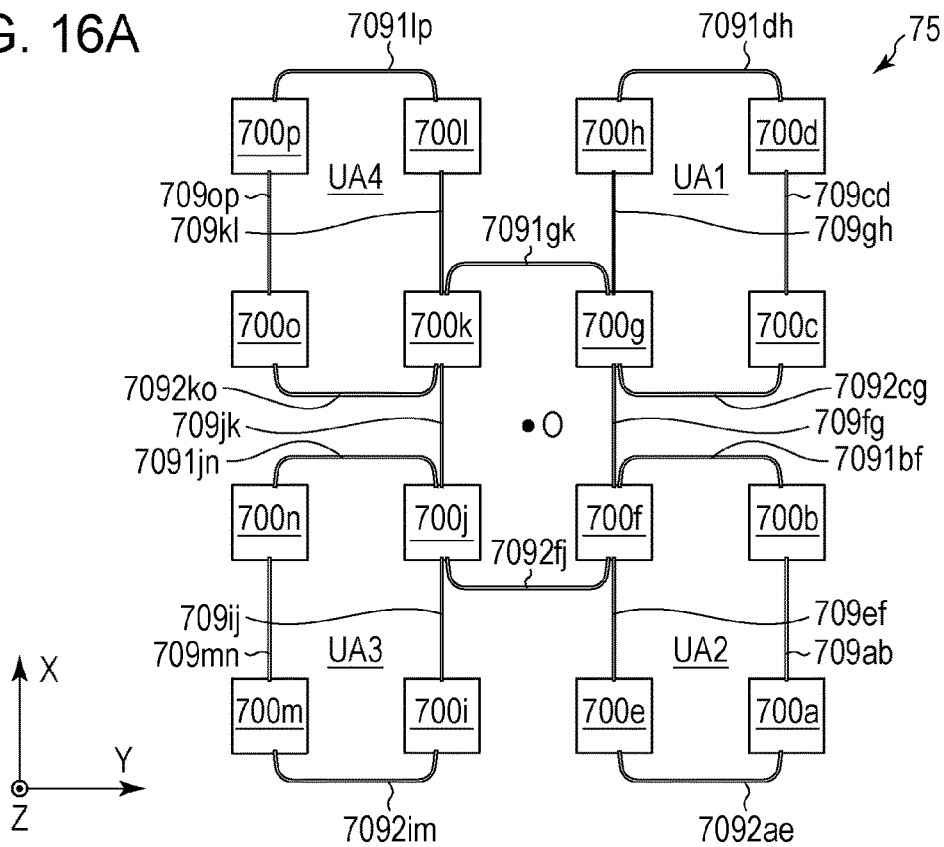
FIG. 16A is a top schematic diagram that shows an element according to the eighth embodiment.

FIG. 16A is a top schematic diagram that shows an element 75. Coupling lines extending in the X direction and in the Y direction are reduced from the element 70. The element 75 includes four unit array UA1 to unit array UA4. The unit array UA1 includes the antenna 700c, the antenna 700d, the antenna 700g, and the antenna 700h. The unit array UA2 includes the antenna 700a, the antenna 700b, the antenna 700e, and the antenna 700f. The unit array UA3 includes an antenna 700i, an antenna 700j, an antenna 700m, and an antenna 700n. The unit array UA4 includes the antenna 700k, the antenna 700l, the antenna 700o, and the antenna 700p. Each of the unit array UA1 to the unit array UA4 includes one coupling line 7091, one coupling line 7092, and two coupling lines 709. For example, the unit array UA1 will be described. The antenna 700c and the antenna 700d are coupled by the coupling line 709cd, and the antenna 700d and the antenna 700h are coupled by the coupling line 7091dh. The antenna 700h and the antenna 700g are coupled by the coupling line 709gh, and the antenna 700g and the antenna 700c are coupled by the coupling line 7092cg. In other words, four antennas are coupled annularly by four coupling lines. The same applies to the other unit array UA2 to unit array UA4. One antenna of each of the unit arrays is coupled annularly. Specifically, the antenna 700g and the antenna 700f are coupled by the coupling line 709fg, and the antenna 700f and the antenna 700j are coupled by the coupling line 7092fj. The antenna 700j and the antenna 700k are coupled by the coupling line 709jk, and the antenna 700k and the antenna 700g are coupled by the coupling line 7091gk.

Figure 16B:
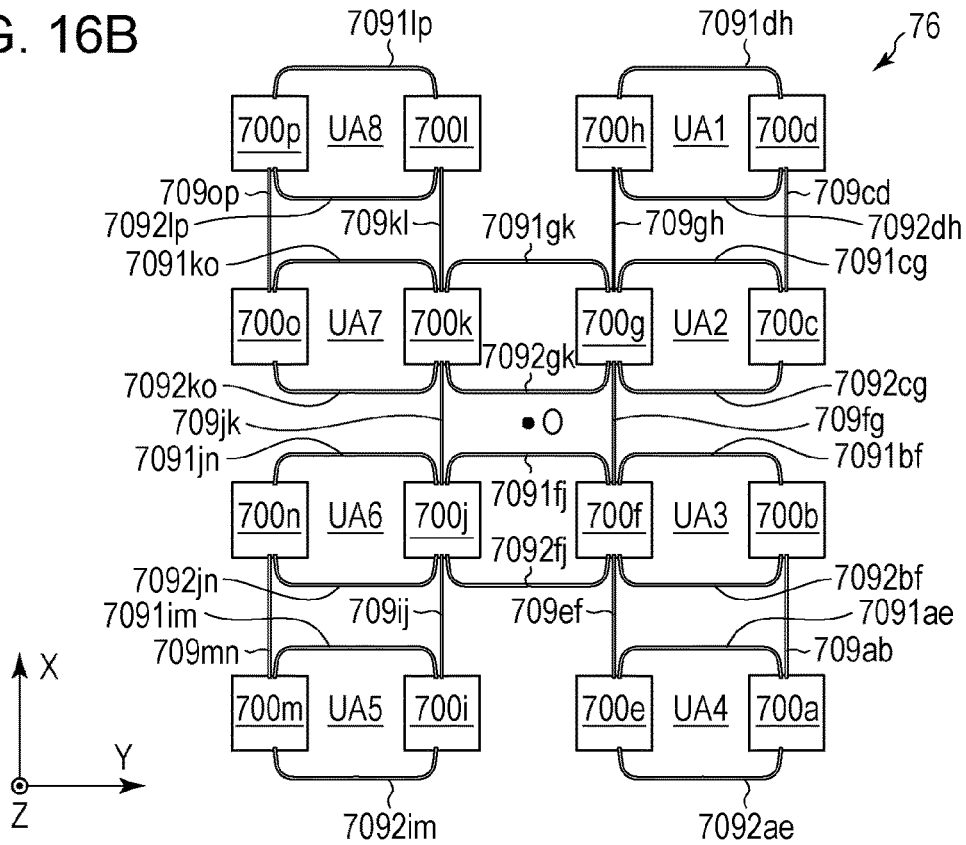
FIG. 16B is a top schematic diagram that shows an element according to the eighth embodiment.

FIG. 16B is a top schematic diagram that shows an element 76. Coupling lines extending in the X direction and in the Y direction are reduced from the element 70. Specifically, a coupling line 7091hl, the coupling line 7092hl, the coupling line 7091ei, and the coupling line 7092ei of the element 70 are not disposed in the element 76. In the element 76, a unit array is 1 by 2 (one row and two columns), and two antennas are coupled annularly by coupling lines. A unit array UA1 includes the antenna 700d and the antenna 700h. The antenna 700d and the antenna 700h are coupled annularly by the coupling line 7091dh and the coupling line 7092dh. A unit array UA2 includes the antenna 700c and the antenna 700g. The antenna 700c and the antenna 700g are coupled annularly by the coupling line 7091cg and the coupling line 7092cg. The antenna 700d and the antenna 700c are coupled by the coupling line 709cd, and the antenna 700g and the antenna 700h are coupled by the coupling line 709gh. The same applies to the connection relationship of another 1 by 2 unit array and the connection relationship of another 2 by 2 unit array. As in the case of FIG. 16A, one antenna of each of the unit arrays is coupled annularly. Specifically, the antenna 700g and the antenna 700f are coupled by the coupling line 709fg, and the antenna 700f and the antenna 700j are coupled by the coupling line 7092*fj*. The antenna 700*j* and the antenna 700*k* are coupled by the coupling line 709*jk*, and the antenna 700*k* and the antenna 700*g* are coupled by the coupling line 7091*gk*. In addition, the antenna 700*g* and the antenna 700*k* are coupled by the coupling line 7092*gk*, and the antenna 700*f* and the antenna 700*j* are coupled by the coupling line 7091*fj*. With such a configuration, the unit arrays are coupled while the symmetry of the 1 by 2 unit array is maintained.

Figure 17A:
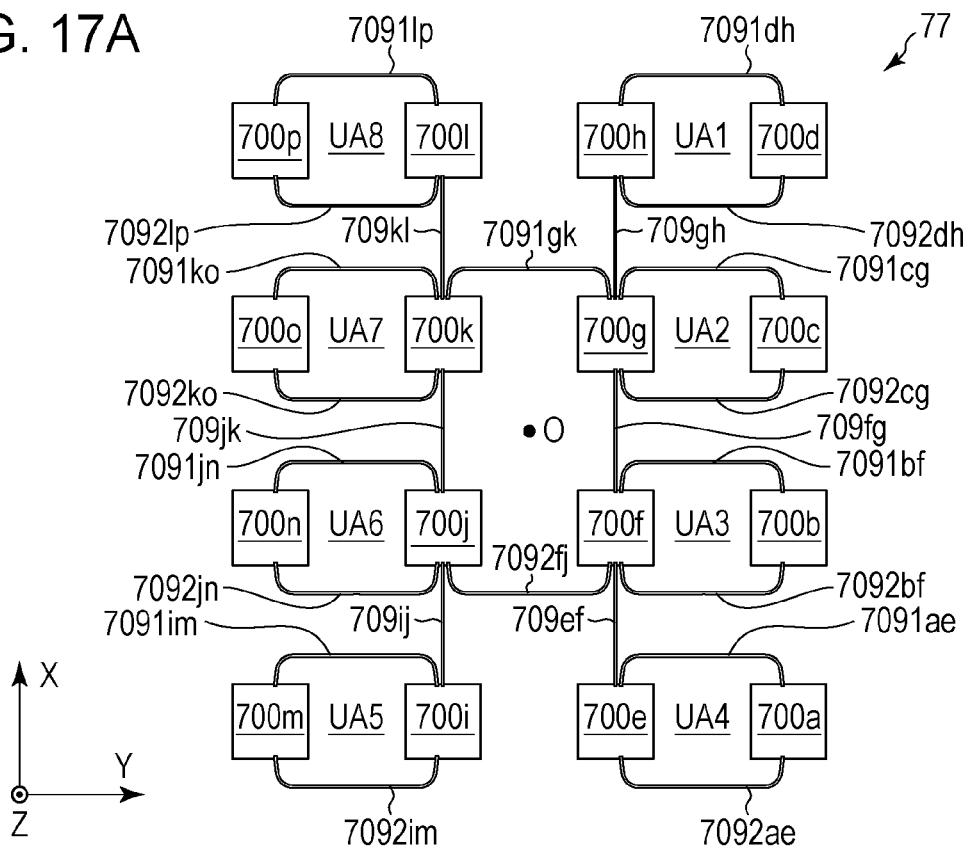
FIG. 17A is a top schematic diagram that shows an element according to the eighth embodiment.

FIG. 17A is a top schematic diagram that shows an element 77. Coupling lines extending in the X direction and in the Y direction are reduced from the element 70. In the element 77, a unit array is 1 by 2, and two antennas are coupled annularly by coupling lines. A unit array UA1 includes the antenna 700*d* and the antenna 700*h*. The antenna 700*d* and the antenna 700*h* are coupled annularly by the coupling line 7091*dh* and the coupling line 7092*dh*. A unit array UA2 includes the antenna 700*c* and the antenna 700*g*. The antenna 700*c* and the antenna 700*g* are coupled annularly by the coupling line 7091*cg* and the coupling line 7092*cg*. The antenna 700*g* and the antenna 700*h* are coupled by the coupling line 709*gh*; however, the antenna 700*d* and the antenna 700*c* are not coupled by the coupling line 709*cd*. The same applies to the connection relationship of another 1 by 2 unit array and the connection relationship of another 2 by 2 unit array. One antenna of each of the unit arrays is coupled annularly to each other. Specifically, the antenna 700*g* and the antenna 700*f* are coupled by the coupling line 709*fg*, and the antenna 700*f* and the antenna 700*j* are coupled by the coupling line 7092*fj*. The antenna 700*j* and the antenna 700*k* are coupled by the coupling line 709*jk*, and the antenna 700*k* and the antenna 700*g* are coupled by the coupling line 7091*gk*. In addition, the antenna 700*g* and the antenna 700*k* are coupled by the coupling line 7092*gk*, and the antenna 700*f* and the antenna 700*j* are coupled by the coupling line 7091*fj*. The arrangement of the antennas and coupling lines of the antenna array may be point-symmetric with reference to the center of gravity of the antenna array.

Figure 17B:
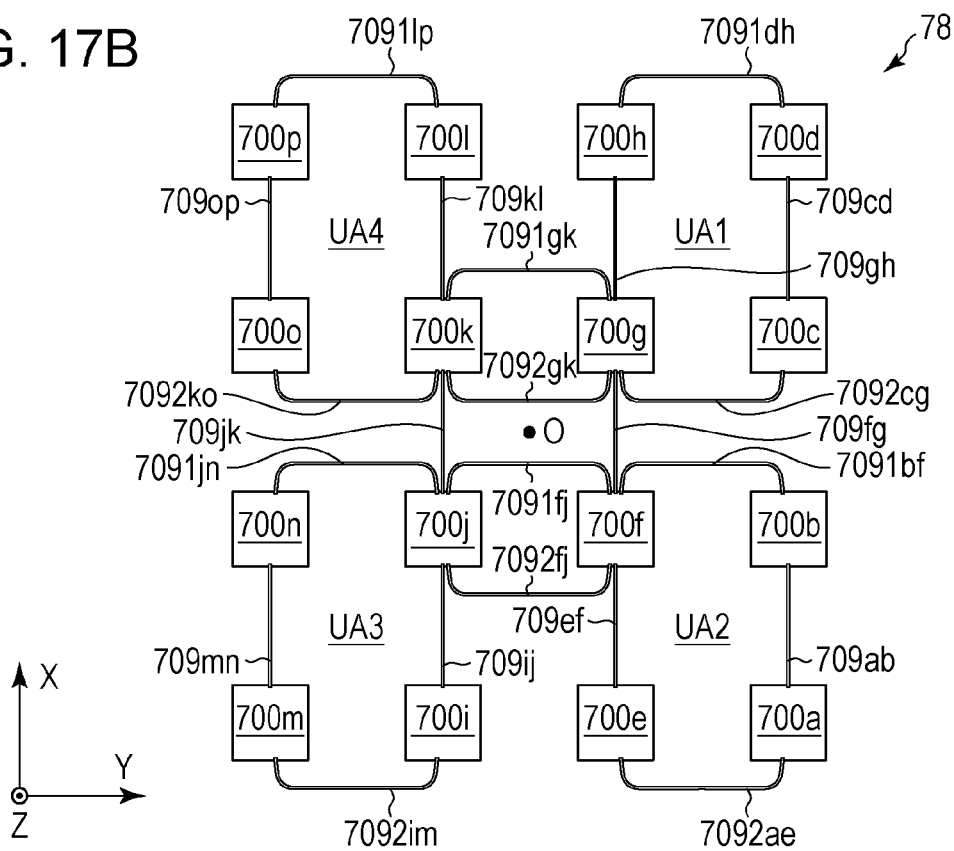
FIG. 17B is a top schematic diagram that shows an element according to the eighth embodiment.

FIG. 17B is a top schematic diagram that shows an element 78. In the element 78, as in the case of the element 75 of FIG. 16A, a unit array is 2 by 2, and four antennas are coupled annularly by coupling lines. The antenna 700*g*, the antenna 700*f*, the antenna 700*j*, and the antenna 700*k* are coupled by the coupling line 7091*gk*, the coupling line 709*fg*, the coupling line 709*jk*, and the coupling line 7092*fj* shown in the element 75. In addition, the antenna 700*g*, the antenna 700*f*, the antenna 700*j*, and the antenna 700*k* are coupled by the coupling line 7092*gk* and the coupling line 7091*fj*.

Figure 18A:
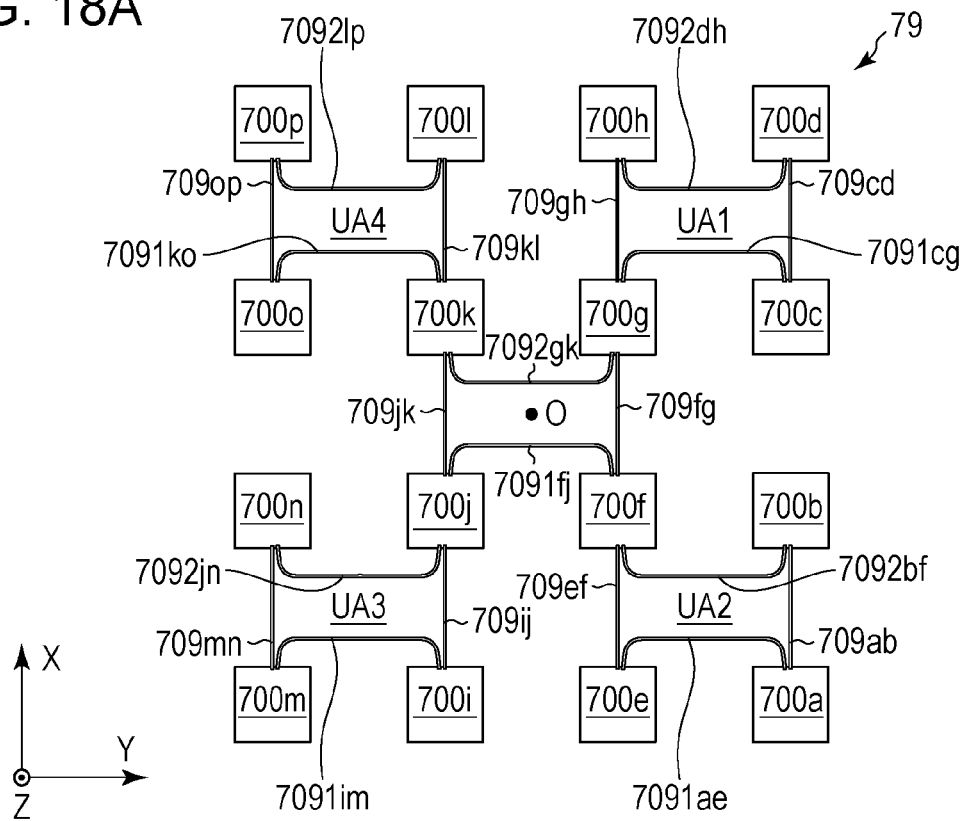
FIG. 18A is a top schematic diagram that shows an element according to the eighth embodiment.

FIG. 18A is a top schematic diagram that shows an element 79. In the element 79, as in the case of the element 75 of FIG. 16A, a unit array is 2 by 2, and four antennas are coupled annularly by coupling lines. In addition, as in the case of the element 75, the antenna 700*g*, the antenna 700*f*, the antenna 700*j*, and the antenna 700*k* of each unit array are coupled by coupling lines. A difference from the element 75 is that, in each of the unit array UA1 to the unit array UA4, the coupling lines 7091 and the coupling lines 7092 are interchanged. Specifically, in the unit array UA1, the antenna 700*d* and the antenna 700*h* are coupled by the coupling line 7092*dh*, and the antenna 700*c* and the antenna 700*g* are coupled by the coupling line 7091*cg*. The antenna 700*g* and the antenna 700*k* are coupled by the coupling line 7092*gk*, and the antenna 700*j* and the antenna 700*f* are coupled by the coupling line 7091*fj*. With such a mode as well, it is possible to provide an antenna array having high symmetry.

Here, in FIGS. 17A and 17B, it is possible to reduce variations in coupling at the end and at the center of the antenna array by changing the number of coupling lines coupled to a selected one antenna located at the end or at the center.

Figure 18B:
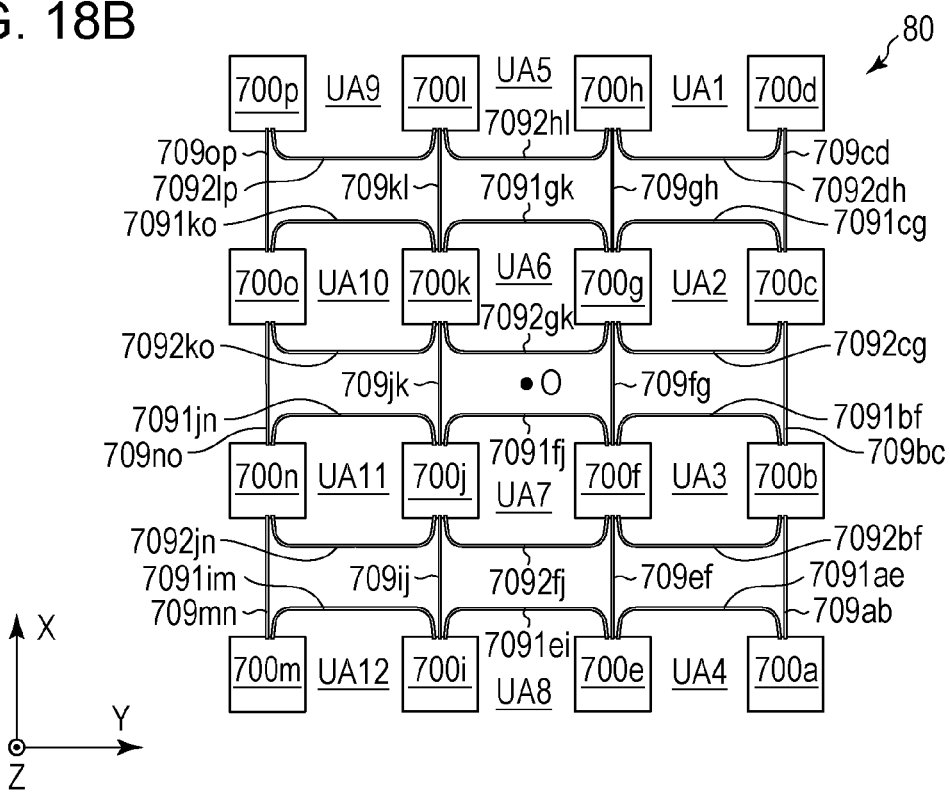
FIG. 18B is a top schematic diagram that shows an element according to the eighth embodiment.
Figure 19A:
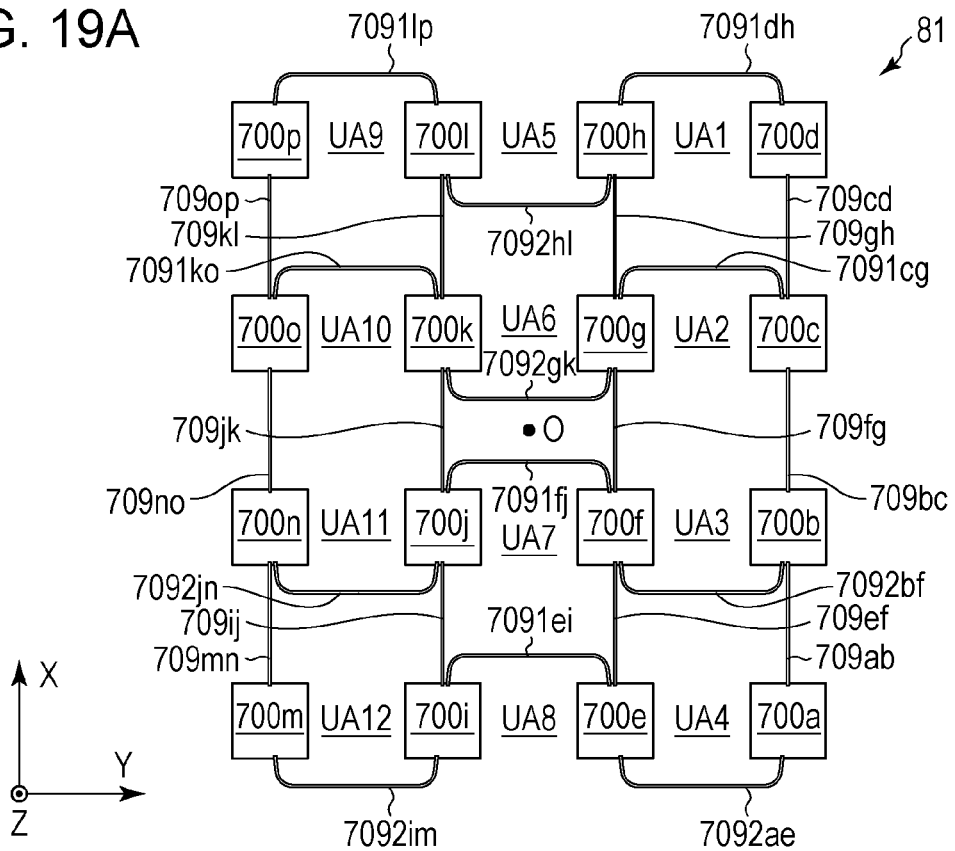
FIG. 19A is a top schematic diagram that shows an element according to the eighth embodiment.
Figure 19B:
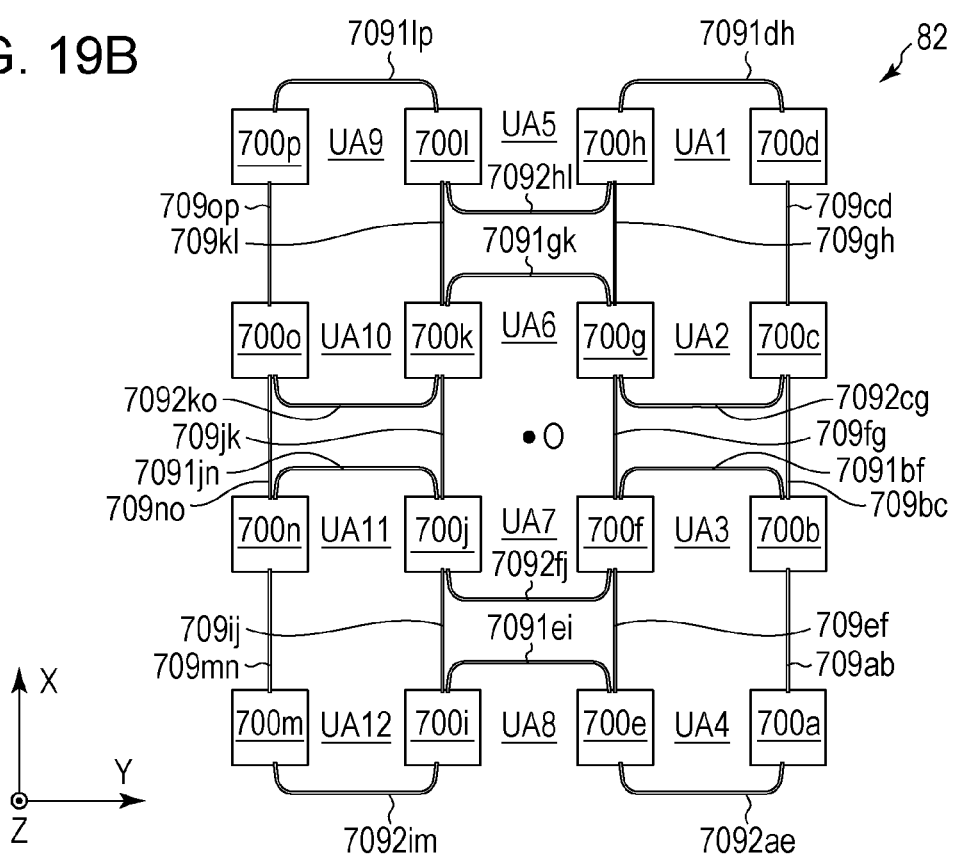
FIG. 19B is a top schematic diagram that shows an element according to the eighth embodiment.
Figure 20A:
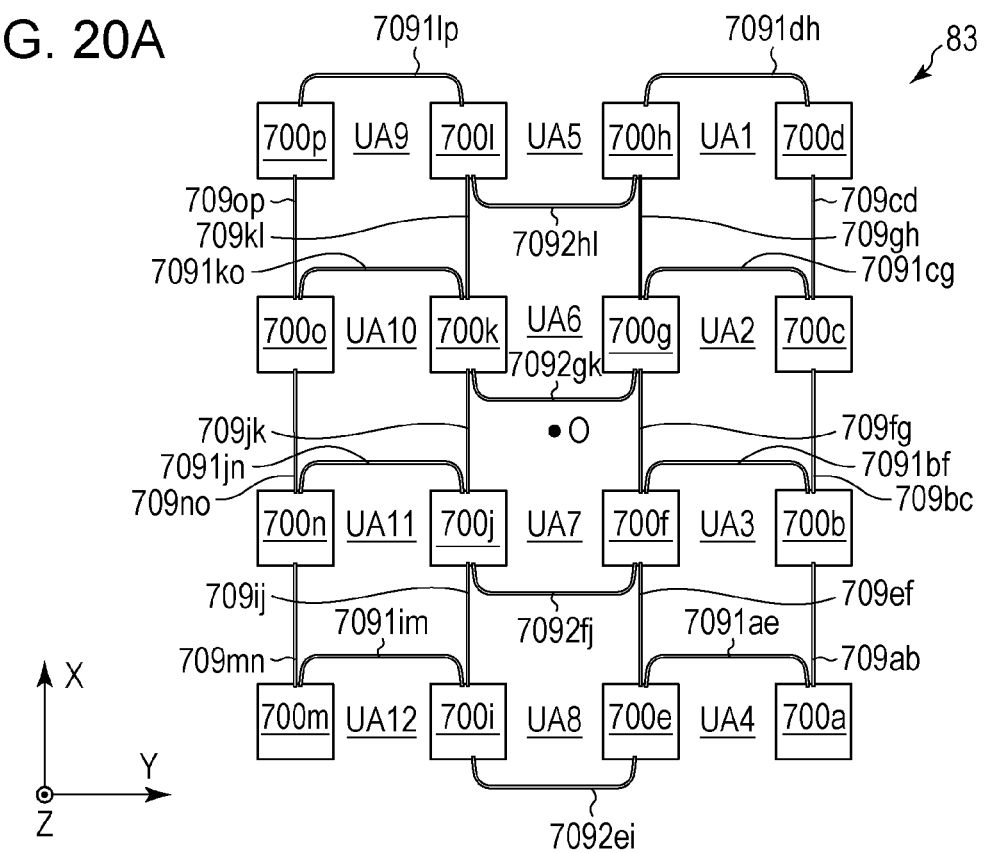
FIG. 20A is a top schematic diagram that shows an element according to the eighth embodiment.
Figure 20B:
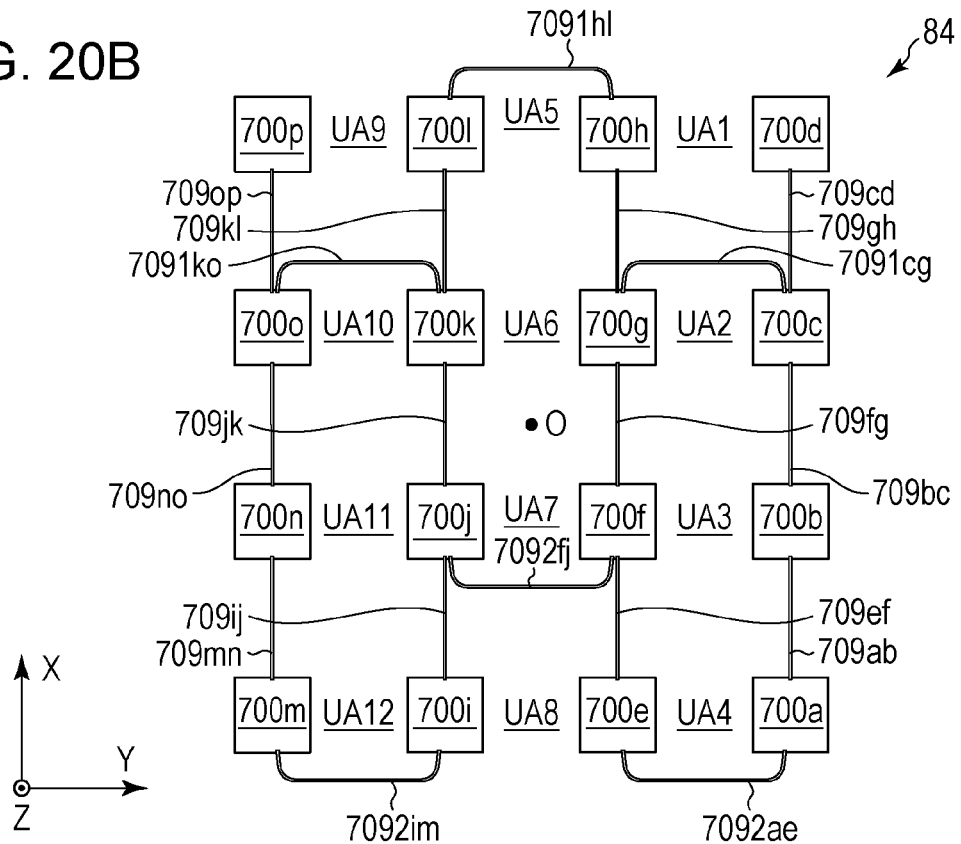
FIG. 20B is a top schematic diagram that shows an element according to the eighth embodiment.

FIGS. 18B to 20B are further modifications. The inventors found through study that the following three conditions were important. One condition is that the number of coupling lines connected in the X direction and the number of coupling lines connected in the Y direction are made close to each other. One condition is that a difference between the number of coupling lines connected to the antenna at the end of the antenna array and the number of coupling lines connected to the antenna at the center of the antenna array is reduced. One condition is that a difference between the numbers of coupling lines connected respectively to two radiation ends in the antenna is reduced. With these configurations, coupling in the vertical direction and coupling in the horizontal direction are balanced, and variations in synchronization are reduced between at the end and at the center of the antenna array. For example, FIGS. 18B, 19A, and 19B are configurations for which symmetry in the X direction and in the Y direction is given a higher priority to provide well-formed directivity, and FIGS. 20A and 20B are configurations for which a loss reduction resulting from a reduction in the number of coupling lines is given a higher priority.

FIG. 18B is a top schematic diagram that shows an element 80. In the element 80, a unit array is 1 by 2. An antenna array includes a unit array UA1 to a unit array UA12. In the element 80, antennas included in a unit array include antennas of adjacent unit arrays and are disposed such that a plurality of unit arrays overlap each other. The unit array UA1 includes the antenna 700*d* and the antenna 700*h*. The unit array UA2 includes the antenna 700*c* and the antenna 700*g*. The unit array UA3 includes the antenna 700*b* and the antenna 700*f*. The unit array UA4 includes the antenna 700*a* and the antenna 700*e*. The unit array UA5 includes the antenna 700*h* and the antenna 700*l*. The unit array UA6 includes the antenna 700*g* and the antenna 700*k*. The unit array UA7 includes the antenna 700*f* and the antenna 700*j*. The unit array UA8 includes the antenna 700*e* and the antenna 700*i*. The unit array UA9 includes the antenna 700*l* and the antenna 700*p*. The unit array UA10 includes the antenna 700*k* and the antenna 700*o*. The unit array UA11 includes the antenna 700*j* and the antenna 700*n*. The unit array UA12 includes the antenna 700*i* and the antenna 700*m*. The unit array UA2, the unit array UA3, the unit array UA6, the unit array UA7, the unit array UA10, and the unit array UA11 are coupled by two coupling lines 709, a coupling line 7091, and a coupling line 7092 coupled to the upper and lower sides of each antenna. This configuration is similar to that of FIG. 13B. However, for the unit array UA1, the unit array UA5, and the unit array UA9, one coupling line 709 coupled to the lower end of the antenna and the coupling line 7092 coupled to the adjacent antenna are coupled. For the unit array UA4, the unit array UA8, and the unit array UA12, one coupling line 709 coupled to the upper end of the antenna and the coupling line 7091 coupled to the adjacent antenna are coupled.

FIG. 19A is a top schematic diagram that shows an element 81. In the element 81, a unit array is 1 by 2 as in the case of the element 80 shown in FIG. 18B. An antenna array includes a unit array UA1 to a unit array UA12 as in the case of the element 80. In the element 81, the antennas are coupled in the X direction by the coupling lines 709. Coupling of the antennas in the Y direction is performed by any one of the coupling line 7091 and the coupling line 7092. In other words, any one of the coupling line 7091 and the coupling line 7092 is disposed between the antennas adjacent in the Y direction. With such a configuration as well, it is possible to provide an antenna array with high symmetry.

FIG. 19B is a top schematic diagram that shows an element 82. In the element 82, as in the case of the element 81 of FIG. 19A, a unit array is 1 by 2, and coupling of the antennas in the Y direction is performed by any one of the coupling line 7091 and the coupling line 7092.

FIG. 20A is a top schematic diagram that shows an element 83. In the element 83, as in the case of the element 81 of FIG. 19A, a unit array is 1 by 2, and coupling of the antennas in the Y direction is performed by any one of the coupling line 7091 and the coupling line 7092.

FIG. 20B is a top schematic diagram that shows an element 84. In the element 84, as in the case of the element 81 of FIG. 19A, a unit array is 1 by 2, and coupling of the antennas in the Y direction is performed by any one of the coupling line 7091 and the coupling line 7092. However, some of coupling lines coupling the antennas in the Y direction are omitted. For example, in each of the unit array UA2, the unit array UA4, the unit array UA5, the unit array UA7, the unit array UA10, and the unit array UA12, two antennas disposed in the Y direction are coupled by the coupling line 7091 or the coupling line 7092. However, in each of the unit array UA1, the unit array UA3, the unit array UA6, the unit array UA8, the unit array UA9, and the unit array UA11, two antennas disposed in the Y direction are not coupled.

Figure 21:
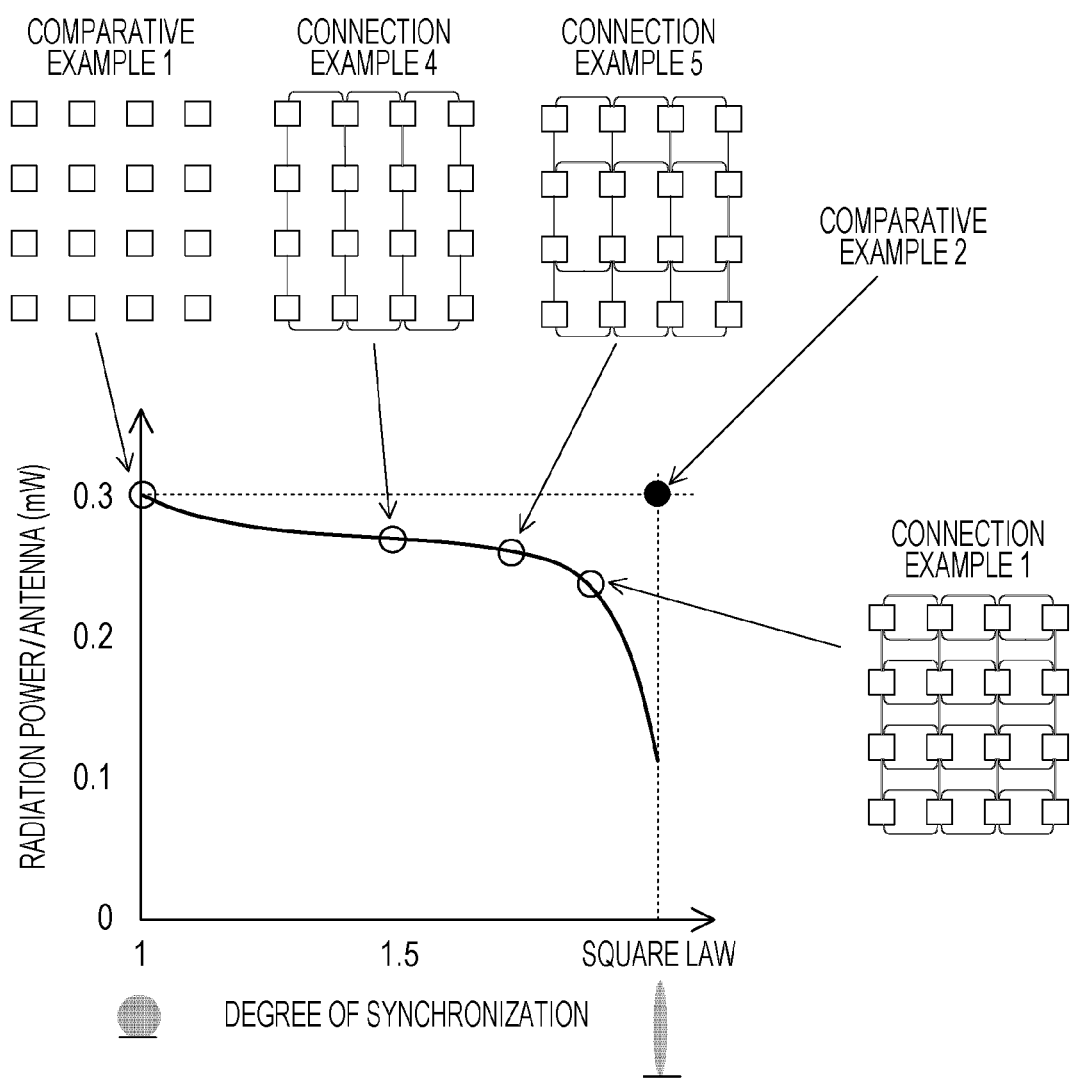
FIG. 21 is a schematic diagram for illustrating the elements according to the eighth embodiment.

FIG. 21 is a schematic diagram that shows a correlation between the degree of synchronization among the antennas and radiation power per antenna in the above-described 4 by 4 antenna array. The "degree of synchronization" at the abscissa axis represents what power of the number of antennas the front gain of the antenna array increases proportionally. The "radiation power/antenna" at the ordinate axis represents the magnitude of oscillation power to be radiated from one antenna in all the directions. For example, in the case of an ideal antenna array having no-loss coupling lines, mutual injection-locking is obtained without losses, so both maximum radiation power per one antenna and enhancement of front gain resulting from directivity sharpening (square law) are achieved. For example, the radiation power is 0.3 mW. This is shown as comparative example 2.

Actually, losses resulting from power transmission of a microstrip line occur, and the losses are particularly remarkable in a THz band. For this reason, transmission losses increase with an increase in the number of coupling lines as in the case of connection example 4, connection example 5, and connection example 1. Radiation power per antenna tends to decrease by the amount of the losses. On the other hand, coupling between antennas is enhanced by increasing the number of coupling lines, so directivity sharpens as a result of mutual injection-locking of an antenna array. For this reason, by increasing the number of coupling lines, a front gain can be caused to approach a tendency to be enhanced in proportion to the square law of the number of antennas. The case where no coupling line is provided is shown as comparative example 1. In this case, there is no loss of electric power to be transmitted between antennas by a coupling line, so radiation power per antenna is maximum. However, coupling between antennas is weak, and mutual injection-locking does not occur, so directivity sharpening does not occur. Therefore, an increase in front gain is proportional to a multiple of the number of antennas, so the "degree of synchronization" is a first power law. The antenna array described above is capable of achieving both desired radiation power and directivity by adjusting and designing the number of coupling lines in the X direction and in the Y direction. An increase in front gain is possible. Here, connection example 1 is the configuration of FIG. 13A, connection example 4 is the configuration of FIG. 15B, and connection example 5 is the configuration of FIG. 15A.

Other Embodiments

The embodiments of the present invention are described above; however, the present invention is not limited to these embodiments. Various modifications and changes are possible within the scope of the present invention.

For example, in the above-described embodiments, the description has been made on the assumption that the carrier is an electron; however, the configuration is not limited thereto. A hole may be used as the carrier. The material of the substrate and the dielectric may be selected according to usage. Semiconductor layers, such as silicon, gallium arsenide, indium arsenide, and gallium phosphide, glass, ceramics, and resins, such as polytetrafluoroethylene and polyethylene terephthalate, may be used.

Furthermore, in the above-described embodiments, a square patch antenna is used as a terahertz wave resonator; however, the shape of the resonator is not limited thereto. For example, a resonator having a structure using a patch conductor with a polygonal shape, such as a rectangular shape and a triangular shape, a circular shape, an elliptical shape, or the like may be used.

The number of differential negative resistive elements integrated in an element is not limited to one, and a resonator may have a plurality of differential negative resistive elements. The number of lines is not limited to one, and a plurality of lines may be provided. Oscillation and detection of a terahertz wave are possible by using the elements described in the above embodiments.

In each of the above-described embodiments, the double barrier RTD made of InGaAs/AlAs grown on an InP substrate has been described as the RTD. However, the configuration is not limited to these structures and materials. The element according to the present invention is provided even with combinations of other structures and materials. For example, an RTD having a triple barrier quantum well structure or an RTD having a quadruple or more multiple barrier quantum wells may be used.

The following combinations each may be used as the material of an RTD.

GaAs/AlGaAs and GaAs/AlAs, InGaAs/GaAs/AlAs, formed on a GaAs substrate

InGaAs/InAlAs, InGaAs/AlAs, InGaAs/AlGaAsSb, formed on an InP substrate

InAs/AlAsSb and InAs/AlSb, formed on an InAs substrate

SiGe/SiGe formed on an Si substrate

The above-described structures and materials should be selected as needed according to a desired frequency or the like.

The configurations of the above-described present embodiments eliminate the upper limit of the number of antennas arranged in an antenna array and provide a significant effect of improvement in directivity and front intensity resulting from an increase in the number of antennas. Therefore, with the configurations of the above-described embodiments, it is possible to provide a suitable element capable of achieving generation and detection of a terahertz wave with further good efficiency.

Embodiments of the present invention are not limited to the above-described embodiments. Various changes or modifications are applicable without departing from the spirit and scope of the present invention. Therefore, the following claims are attached to show the scope of the present invention.

According to the present invention, a favorable antenna array structure is provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An element comprising an antenna array in which a plurality of antennas is disposed, each of the antennas including
    a first conductor layer,
    a semiconductor layer that is electrically connected to the first conductor layer and that generates or detects a terahertz wave,
    a second conductor layer that is electrically connected to the semiconductor layer and that is opposite to the first conductor layer via the semiconductor layer, and
    a dielectric layer located between the first conductor layer and the second conductor layer, wherein
    the antenna array includes a first antenna, a second antenna, a third antenna, a fourth antenna, and a fifth antenna,
    the second antenna, the first antenna, and the third antenna are arranged in this order in a first direction,
    the fourth antenna, the first antenna, and the fifth antenna are arranged in this order in a second direction that intersects with the first direction,
    the second conductor layer of the second antenna is connected to the second conductor layer of the first antenna via a first coupling line extending in the first direction,
    the second conductor layer of the first antenna is connected to the second conductor layer of the third antenna via a second coupling line extending in the first direction,
    the second conductor layer of the fourth antenna is connected to the second conductor layer of the first antenna via a third coupling line extending in the second direction, and
    the second conductor layer of the first antenna is connected to the second conductor layer of the fifth antenna via a fourth coupling line extending in the second direction.

2. The element according to claim 1, wherein the first coupling line and the third coupling line are connected at a location shifted from a location of a center of a line segment connecting the first antenna with the second antenna.

3. The element according to claim 1, wherein
    the first antenna and the second antenna are injection-locked at a frequency of the terahertz wave by the first coupling line, and
    the first antenna and the fourth antenna are injection-locked at the frequency of the terahertz wave by the third coupling line.

4. The element according to claim 1, wherein the first coupling line and the third coupling line are made of a single conductor body.

5. The element according to claim 1, wherein the first coupling line and the third coupling line are connected at a location other than a node of a resonant electric field that stands in the coupling lines at a frequency of the terahertz wave.

6. The element according to claim 1, wherein the first coupling line and the third coupling line are connected at a location that satisfies a phase matching condition with adjacent some of the antennas at a frequency of the terahertz wave.

7. The element according to claim 1, wherein
    the third coupling line and a fifth coupling line extending in the second direction are disposed between the first antenna and the fourth antenna,
    the first coupling line and the third coupling line are connected at a location other than a node of a resonant electric field that stands at a frequency of the terahertz wave, the first coupling line and the fifth coupling line are connected at a location other than a node of a resonant electric field that stands at the frequency of the terahertz wave, and
    a node of the resonant electric field that stands at the frequency of the terahertz wave is located between the location at which the first coupling line and the third coupling line are connected and the location at which the first coupling line and the fifth coupling line are connected.

8. The element according to claim 1, wherein the first direction is a resonant direction of a resonant electric field that stands at a frequency of the terahertz wave.

9. The element according to claim 1, wherein the second direction is a direction orthogonal to the first direction.

10. The element according to claim 1, wherein the second direction is a magnetic field direction induced by a resonant electric field that stands at a frequency of the terahertz wave.

11. The element according to claim 1, wherein each of the antennas radiates a circularly polarized wave.

12. The element according to claim 1, further comprising a bias line for connecting the second conductor layer with a bias circuit for supplying a bias signal to the semiconductor layer.

13. The element according to claim 12, wherein the bias line is disposed in a layer between the first conductor layer and the second conductor layer.

14. The element according to claim 12, wherein
    the antenna array is disposed on a substrate,
    the first coupling line and the third coupling line are made up of a third conductor layer,
    the bias line is made up of a fourth conductor layer, and
    the third conductor layer and the fourth conductor layer, respectively, are disposed in different layers from a surface of the substrate.

15. The element according to claim 14, wherein the substrate, the first conductor layer, the fourth conductor layer, and the third conductor layer are laminated in this order.

16. The element according to claim 14, wherein the substrate, the first conductor layer, the third conductor layer, and the fourth conductor layer are laminated in this order.

17. The element according to claim 12, wherein the bias line has a low impedance as compared to an impedance of the semiconductor layer in a frequency band lower than a frequency of the terahertz wave.

18. The element according to claim 1, wherein, in the antenna array, the antennas are arranged in an m by n matrix (m and n are integers, m≥2, and n≥2).

19. The element according to claim 18, wherein the antennas of the antenna array are arranged at a pitch less than or equal to a wavelength of the terahertz wave.

20. The element according to claim 1, wherein the antennas are patch antennas.

21. The element according to claim 1, wherein the semiconductor layer includes a negative resistive element.

22. The element according to claim 21, wherein the negative resistive element is a resonant tunneling diode.

23. The element according to claim 1, wherein, where an electrical length of each of the semiconductor layer of the first antenna and the semiconductor layer of the second antenna is L1, L1=2π×k (k: integer).

24. The element according to claim 1, wherein each of the antennas includes a second semiconductor layer that operates in opposite phase to the semiconductor layer.

25. A terahertz camera system comprising:
a transmitting portion that has the element according to claim 1 and that radiates a terahertz wave; and
a receiving portion that detects the terahertz wave.

26. An element comprising:
an antenna array in which a plurality of antennas is provided, each of the antennas including a first conductor layer, a semiconductor layer that is electrically connected to the first conductor layer and that generates or detects a terahertz wave, a second conductor layer that is electrically connected to the semiconductor layer and that is opposite to the first conductor layer via the semiconductor layer, and a dielectric layer located between the first conductor layer and the second conductor layer, wherein
the antenna array includes coupling lines each connecting adjacent two of the antennas to transmit the terahertz wave, and
at least one of the antennas of the antenna array connects with at least three or more of the coupling lines.

27. The element according to claim 26, wherein the three or more of the coupling lines connect with the antenna at one connecting portion.

28. The element according to claim 26, wherein the three or more of the coupling lines respectively connect with the antenna at different three or more connecting points.

29. The element according to claim 26, wherein the three or more of the coupling lines respectively connect with the antenna at separate connecting points.

30. The element according to claim 26, wherein
a first antenna and at least two antennas are connected by the coupling lines, and
the first antenna is connected to each of the at least two antennas by a single independent coupling line.

31. The element according to claim 26, wherein two or more of the coupling lines are connected to each radiation end of at least one of the antennas of the antenna array.

32. The element according to claim 26, wherein the at least three or more of the coupling lines are one line inside an outer edge of the antenna and are two or more lines into which the one line branches outside the outer edge in plan view.

33. The element according to claim 26, wherein the at least three or more of the coupling lines are disposed so as to be spaced apart from one another outside an outer edge of the antenna in plan view.

34. The element according to claim 26, wherein an end of each coupling line is electrically terminated at a frequency of terahertz wave.

35. The element according to claim 26, wherein the antenna at an end of the antenna array has no coupling line on an outer edge side of the antenna array.

36. The element according to claim 26, wherein the coupling lines are connected to the antenna symmetrically with respect to a center of gravity of the antenna.

* * * * *